(12) United States Patent
Moon

(10) Patent No.: US 12,501,749 B2
(45) Date of Patent: Dec. 16, 2025

(54) LIGHT EMITTING ELEMENT AND DISPLAY DEVICE COMPRISING SAME

(71) Applicant: Samsung Display Co., LTD., Yongin-si (KR)

(72) Inventor: Su Mi Moon, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 517 days.

(21) Appl. No.: 17/636,480

(22) PCT Filed: Jun. 3, 2020

(86) PCT No.: PCT/KR2020/007233
§ 371 (c)(1),
(2) Date: Feb. 18, 2022

(87) PCT Pub. No.: WO2021/033887
PCT Pub. Date: Feb. 25, 2021

(65) Prior Publication Data
US 2022/0302350 A1     Sep. 22, 2022

(30) Foreign Application Priority Data

Aug. 20, 2019   (KR) ................. 10-2019-0101612

(51) Int. Cl.
*H10H 20/831*      (2025.01)
*H10H 20/857*      (2025.01)
(52) U.S. Cl.
CPC ...... *H10H 20/8312* (2025.01); *H10H 20/857* (2025.01)

(58) Field of Classification Search
CPC ............................ H01L 33/382; H01L 33/62
See application file for complete search history.

(56) References Cited

U.S. PATENT DOCUMENTS 7,741,197 B1   6/2010  Duan et al.
9,305,766 B2   4/2016  Samuelson et al.
(Continued)

FOREIGN PATENT DOCUMENTS

CN     105347297    2/2016
KR     10-1713818   3/2017
(Continued)

OTHER PUBLICATIONS

Extended European Search Report for European Application No. 20854236.5, dated Aug. 30, 2023.
(Continued)

*Primary Examiner* — Jay C Kim
*Assistant Examiner* — Woo K Lee
(74) *Attorney, Agent, or Firm* — Womble Bond Dickinson (US) LLP

(57) ABSTRACT

A light emitting element includes a first semiconductor layer doped with a first polarity; a second semiconductor layer doped with a second polarity different from the first polarity; an active layer arranged between the first semiconductor layer and the second semiconductor layer, and including a first surface facing the first semiconductor layer and a second surface facing the second semiconductor layer; and a doped layer disposed on the first surface or the second surface of the active layer and having ions of the first polarity or the second polarity.

8 Claims, 32 Drawing Sheets

(56) References Cited

U.S. PATENT DOCUMENTS

| | | |
|---|---|---|
| 9,954,060 B2 | 4/2018 | Samuelson et al. |
| 2011/0284380 A1 | 11/2011 | Martin et al. |
| 2012/0153254 A1 | 6/2012 | Mastro |
| 2016/0027961 A1* | 1/2016 | Mi .................. H10H 20/818 |
| | | 257/13 |
| 2016/0181477 A1 | 6/2016 | Lee et al. |
| 2016/0211245 A1 | 7/2016 | Do |
| 2017/0117438 A1 | 4/2017 | Shur et al. |
| 2018/0175106 A1 | 6/2018 | Kim et al. |
| 2018/0182741 A1* | 6/2018 | Sung .................. H10H 20/819 |

FOREIGN PATENT DOCUMENTS

| | | |
|---|---|---|
| KR | 10-2017-0057818 | 5/2017 |
| KR | 10-1742518 | 6/2017 |
| KR | 10-2018-0007025 | 1/2018 |
| KR | 10-2018-0007376 | 1/2018 |
| KR | 10-2018-0016906 | 2/2018 |
| KR | 10-2018-0071465 | 6/2018 |
| KR | 10-2018-0077114 | 7/2018 |

OTHER PUBLICATIONS

Bel Hadj Tahar Radhouane et al: "Tin doped indium oxide thin films: Electrical properties," Journal of Applied Physics, vol. 83, No. 5, dated Mar. 1, 1998.

International Search Report, with English translation, corresponding to International Application No. PCT/KR2020/007233 dated Sep. 17, 2020.

Written Opinion, with English translation, corresponding to International Application No. PCT/KR2020/007233, dated Sep. 17, 2020.

* cited by examiner

LIGHT EMITTING ELEMENT AND DISPLAY DEVICE COMPRISING SAME

CROSS-REFERENCE TO RELATED APPLICATION(S)

This application is a national entry of International Application No. PCT/KR2020/007233, filed on Jun. 3, 2020, which claims under 35 U.S.C. §§ 119(a) and 365(b) priority to and benefits of Korean Patent Application No. 10-2019-0101612, filed on Aug. 20, 2019, in the Korean Intellectual Property Office (KIPO), the entire contents of which are incorporated herein by reference.

BACKGROUND

1. Technical Field

The disclosure relates to a light emitting element and a display device including the same.

2. Description of Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

SUMMARY

Aspects of the disclosure provide a light emitting element having an improved electrical polarity by further including a doped layer.

Aspects of the disclosure also provide a display device with an improved degree of alignment of light emitting elements by including the light emitting element.

It should be noted that aspects of the disclosure are not limited thereto and other aspects, which are not mentioned herein, will be apparent to those of ordinary skill in the art from the following description.

According to an embodiment of the disclosure, a light emitting element comprises a first semiconductor layer doped with a first polarity, a second semiconductor layer doped with a second polarity different from the first polarity, an active layer disposed between the first semiconductor layer and the second semiconductor layer and including a first surface facing the first semiconductor layer and a second surface facing the second semiconductor layer, and a doped layer disposed on the first surface or the second surface of the active layer and having ions with the first polarity or the second polarity.

The doped layer may include a first doped layer having the first polarity and disposed on the first semiconductor layer.

A concentration of ions having the first polarity in the first doped layer may be higher than a concentration of ions having the first polarity in the first semiconductor layer.

The first doped layer may contact the first surface of the active layer.

The first doped layer may be spaced apart from the first surface of the active layer.

The doped layer may include a second doped layer having the second polarity and disposed on the second semiconductor layer.

The second doped layer may be directly disposed on an upper surface of the second semiconductor layer.

The second doped layer may contact the second surface of the active layer.

The light emitting element may further comprise an electrode layer disposed on the second semiconductor layer, wherein the doped layer may include a third doped layer disposed on the electrode layer.

The third doped layer may be disposed on an upper surface of the electrode layer.

The electrode layer may include indium (In), and a content of indium in the third doped layer may be higher than a content of indium in the electrode layer.

The light emitting element may further comprise a sub-semiconductor layer disposed on the electrode layer and having the second polarity.

The light emitting element may further comprise an insulating film surrounding outer surfaces of the first semiconductor layer, the second semiconductor layer, and the active layer, wherein the insulating film may overlap at least part of the electrode layer in a plan view.

The insulating film may include a first surface surrounding the electrode layer in an outer surface and a second surface extended to the first surface and contacting the electrode layer, and the second surface may have a shape in which at least a partial region thereof is curved.

According to an embodiment of the disclosure, a display device comprising a first electrode disposed on a substrate and a second electrode spaced apart from the first electrode, and at least one light emitting element disposed between the first electrode and the second electrode and electrically connected to the first electrode and the second electrode, wherein the light emitting element includes: a first semiconductor layer doped with a first polarity, a second semiconductor layer doped with a second polarity different from the first polarity, an active layer disposed between the first semiconductor layer and the second semiconductor layer, and a doped layer disposed on a first surface or a second surface of the active layer and having ions with the first polarity or the second polarity.

The light emitting element may further include an electrode layer disposed on the second semiconductor layer, and the light emitting element may include a first light emitting element in which the doped layer is disposed on the electrode layer.

In the first light emitting element, the doped layer may be disposed on an upper surface of the electrode layer.

The display device may further comprise a first contact electrode contacting an end of the light emitting element and the first electrode and a second contact electrode contacting another end of the light emitting element and the second electrode, wherein in the first light emitting element, the doped layer may contact the first contact electrode.

The light emitting element may further include an insulating film surrounding the first semiconductor layer, the second semiconductor layer, and the active layer.

The light emitting element may further include a second light emitting element, a thickness of at least part of the insulating film is different from that of other part of the insulating film.

A first diameter of a first end portion of the second light emitting element and a second diameter of a second end portion of the second light emitting element may be smaller than a third diameter of a portion of the second light emitting element between the first end portion and the second end portion.

The display device may further comprise a first insulating layer disposed under the light emitting element between the first electrode and the second electrode, and a second insulating layer disposed on the light emitting element and exposing a first end portion and a second end portion of the light emitting element.

The light emitting element may further include a third light emitting element in which the doped layer is removed.

The details of other embodiments are included in the detailed description and the accompanying drawings.

The light emitting element according to an embodiment may include a doped layer including ions having any polarity. The doped layer may be formed on a semiconductor layer or an electrode layer of the light emitting element, and may include ions at a higher concentration than a layer on which the doped layer is formed.

Accordingly, in the light emitting element, a dipole moment increases, and a dielectrophoretic force transferred by an electric field increases, such that a degree of alignment may be improved. The display device may include light emitting elements aligned with a high degree of alignment, such that emission failures of the light emitting elements may be minimized and emission reliability of each pixel may be improved.

The effects according to the embodiments are not limited by the contents exemplified above, and more various effects are included in this disclosure.

BRIEF DESCRIPTION OF DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

Figure 1:
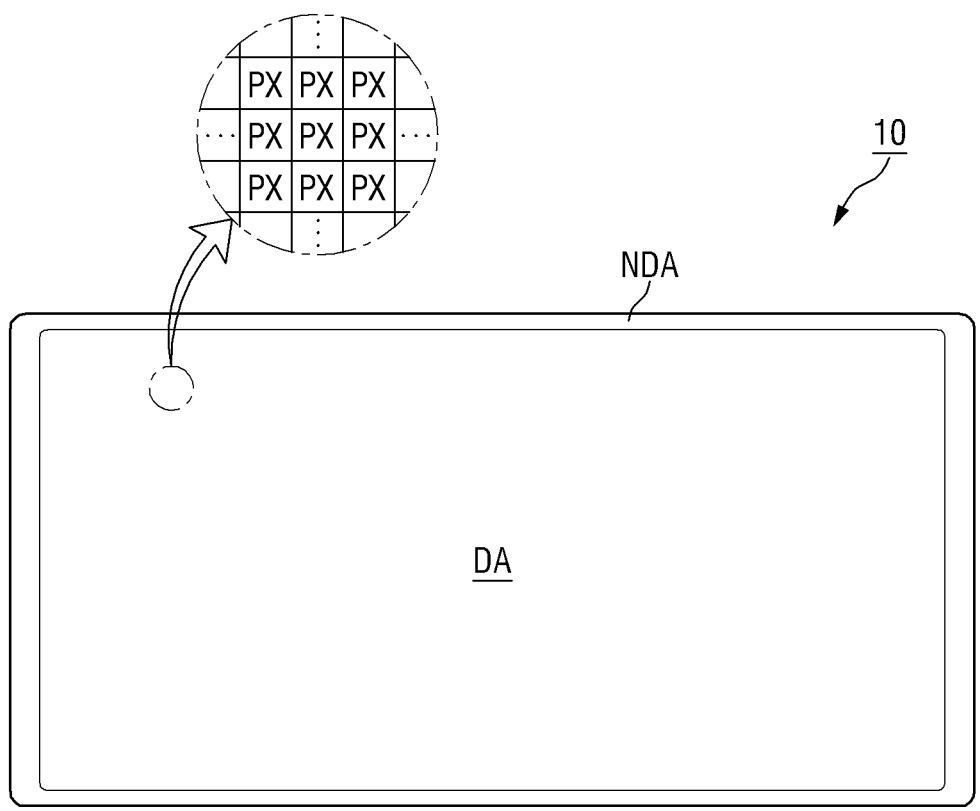
FIG. 1 is a schematic plan view of a display device according to an embodiment.

FIG. 1 is a schematic plan view of a display device according to an embodiment.

Referring to FIG. 1, a display device 10 displays a moving image or a still image. The display device 10 may refer to all electronic devices that provide display screens. For example, televisions, laptop computers, monitors, billboards, the Internet of Things (IoT), mobile phones, smartphones, tablet personal computers (PCs), electronic watches, smartwatches, watch phones, head-mounted displays, mobile communication terminals, electronic organizers, electronic books, portable multimedia players (PMPs), navigation devices, game machines, digital cameras, camcorders, and the like, which provide display screens, may be included in the display device 10.

The display device 10 includes a display panel providing a display screen. Examples of the display panel include a light emitting diode (LED) display panel, an organic light emitting display panel, a quantum dot light emitting display panel, a plasma display panel, a field emission display panel, and the like. Hereinafter, the LED display panel is illustrated as being used as an example of the display panel, but the disclosure is not limited thereto, and the same technical idea may be applied to other display panels if applicable.

A shape of the display device 10 may be variously changed. For example, the display device 10 may have a shape such as a rectangular shape with a width greater than a length, a rectangular shape with a length greater than a width, a square shape, a rectangular shape with rounded corners (vertices), other polygonal shapes, or a circular shape. A shape of a display area DA of the display device 10 may also be similar to an overall shape of the display device 10. FIG. 1 illustrates the display device 10 and the display area DA having a rectangular shape with a width greater than a length.

The display device 10 may include the display area DA and a non-display area NDA. The display area DA is an area in which an image may be displayed, and the non-display area NDA is an area in which image is not displayed. The display area DA may also be referred to as an active area, and the non-display area NDA may also be referred to as a non-active area.

The display area DA may occupy substantially the center of the display device 10. The display area DA may include pixels PX. The pixels PX may be arranged in a matrix direction. A shape of each pixel PX may be a rectangular shape or a square shape in a plan view, but the disclosure is not limited thereto, and may also have a rhombic shape of which each side is inclined with respect to a direction. Each of the pixels PX may include one or more light emitting elements 300 emitting light of a specific wavelength band to display a specific color.

Figure 2:
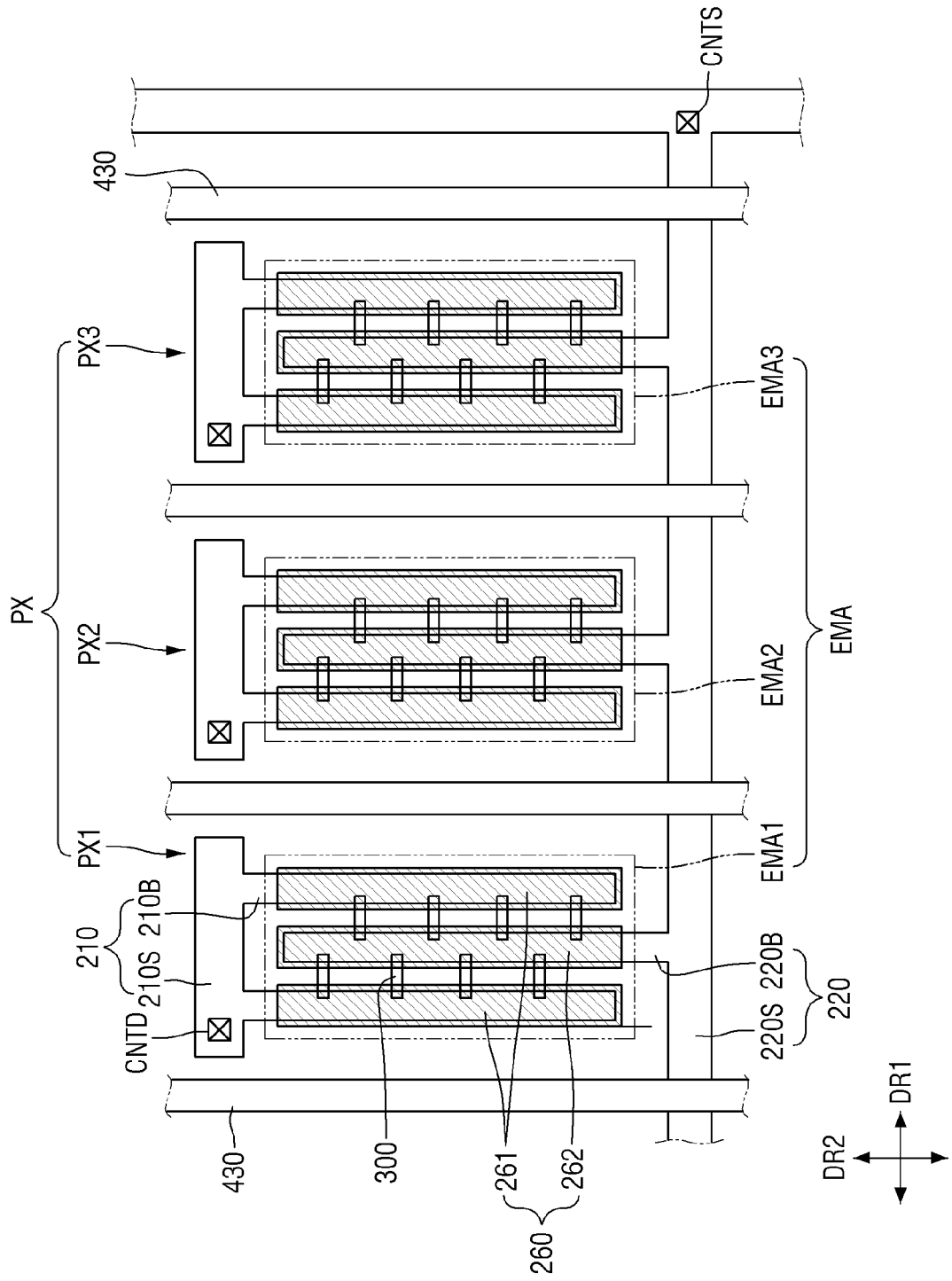
FIG. 2 is a schematic plan view of one pixel of the display device according to an embodiment.
Figure 3:
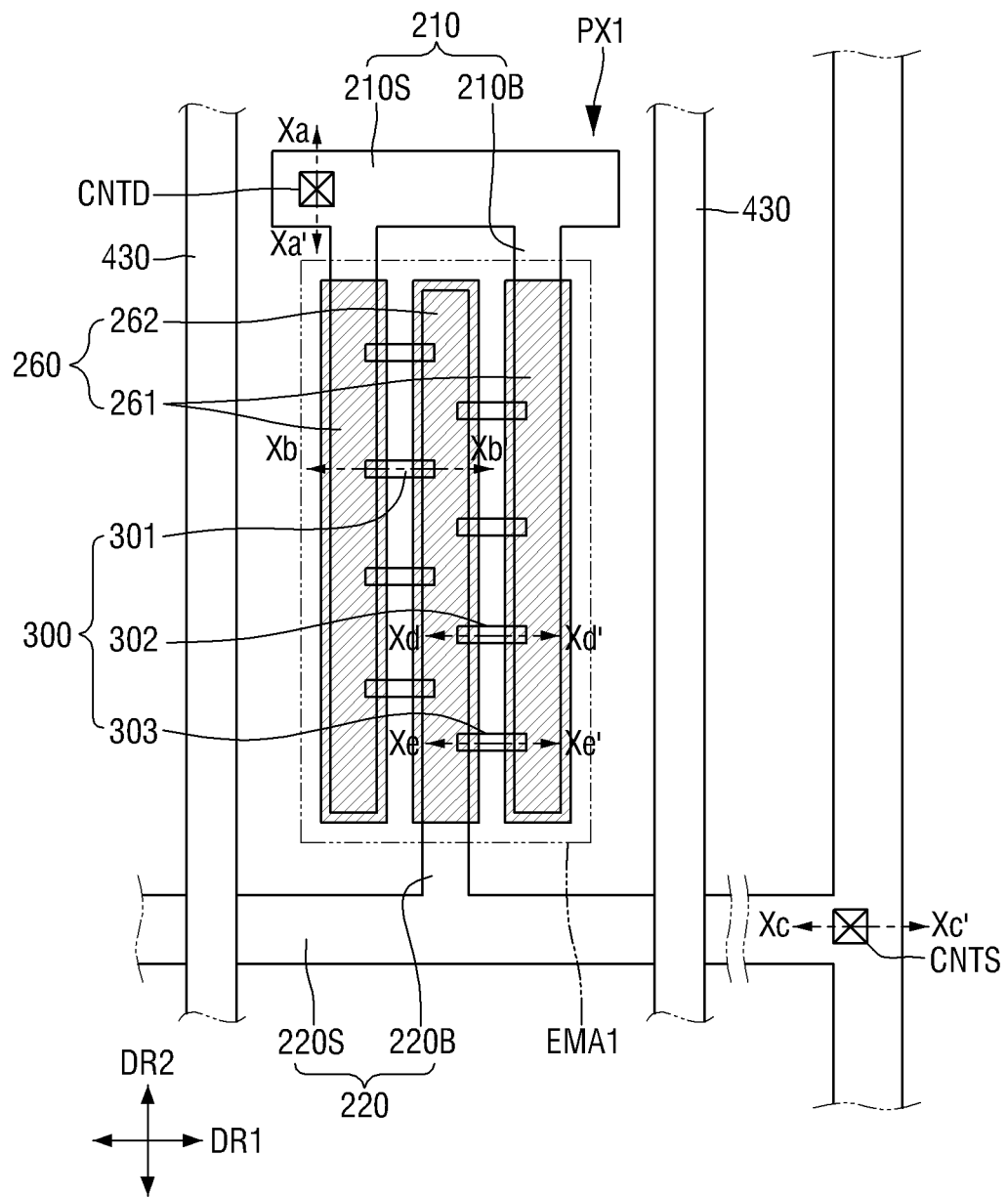
FIG. 3 is a schematic plan view illustrating one sub-pixel of FIG. 2.

FIG. 2 is a schematic plan view of a pixel of the display device according to an embodiment. FIG. 3 is a schematic plan view illustrating a sub-pixel of FIG. 2.

Referring to FIGS. 2 and 3, each of the pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red. However, the disclosure is not limited thereto, and the respective sub-pixels PXn may also emit light of a same color (where n is a natural number). FIG. 2 illustrates that the pixel PX includes three sub-pixels PXn, but the disclosure is not limited thereto, and the pixel PX may include a larger number of sub-pixels PXn.

Each of the sub-pixels PXn of the display device 10 may include an area defined in an emission area EMA. The first sub-pixel PX1 may include a first emission area EMA1, the second sub-pixel PX2 may include a second emission area EMA2, and the third sub-pixel PX3 may include a third emission area EMA3. The emission area EMA may be defined as an area in which the light emitting elements 300 included in the display device 10 are disposed to emit light of a specific wavelength band. The light emitting element 300 includes an active layer 360, which may emit light of a specific wavelength band without directionality. For example, the light emitted from the active layer 360 of the light emitting element 300 may be emitted in a lateral direction of the light emitting element 300 including directions toward both ends of the light emitting element 300. The emission area EMA of each sub-pixel PXn may include an area in which the light emitting elements 300 are disposed, and include an area which is adjacent to the light emitting element 300 and in which the light emitted from the light emitting elements 300 is emitted. However, the disclosure is not limited thereto, and the emission area EMA may also include an area in which the light emitted from the light emitting elements 300 is reflected or refracted by other members and then emitted. Light emitting elements 300 may be disposed in each sub-pixel PXn, and the emission area EMA including an area in which the light emitting elements 300 are disposed and an area adjacent to the light emitting elements 300 may be formed.

Although not illustrated in FIGS. 2 and 3, each of the sub-pixels PXn of the display device 10 may include a non-emission area defined as an area other than the emission area EMA. The non-emission area may be an area in which the light emitting elements 300 are not disposed and the light emitted from the light emitting elements 300 does not arrive, and thus, the light is not emitted.

Figure 4:
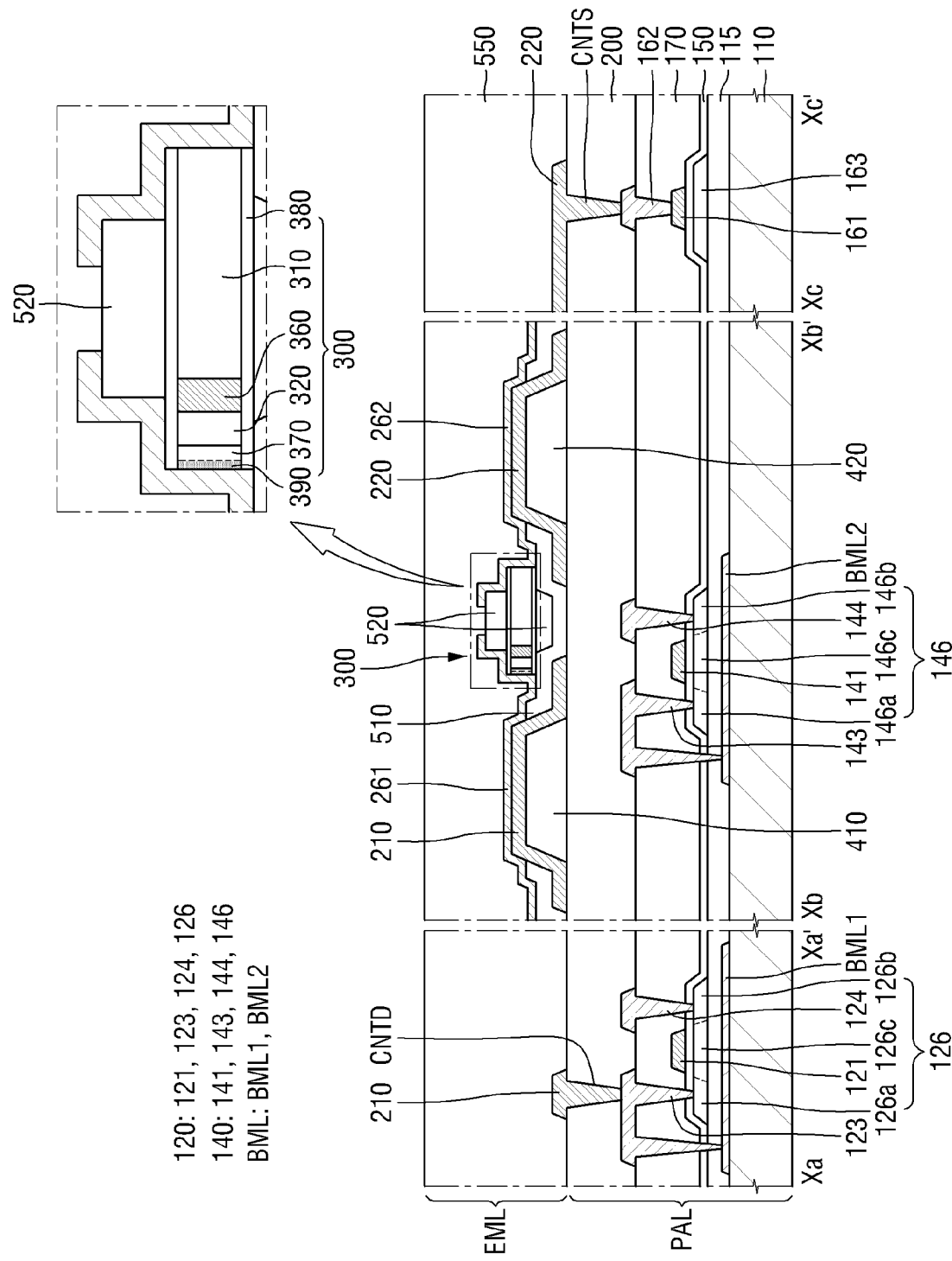
FIG. 4 is a schematic cross-sectional view taken along line Xa-Xa', line Xb-Xb', and line Xc-Xc' of FIG. 3.

Each sub-pixel PXn of the display device 10 may include electrodes 210 and 220, light emitting elements 300, contact electrodes 260, and banks 410, 420, and 430 (see FIG. 4), and at least one insulating layers 510, 520, and 550 (see FIG. 4).

The electrodes 210 and 220 may be electrically connected to the light emitting elements 300 and may receive a voltage (e.g., a predetermined or selected voltage) so that the light emitting elements 300 emits light of a specific wavelength band. At least a portion (or part) of each of the electrodes 210 and 220 may be utilized to form an electric field in the sub-pixel PXn to align the light emitting elements 300.

The electrodes 210 and 220 may include a first electrode 210 and a second electrode 220. In an embodiment, the first electrode 210 may be a pixel electrode separated for each sub-pixel PXn, and the second electrode 220 may be a common electrode commonly connected in each sub-pixel PXn. One of the first electrode 210 and the second electrode 220 may be an anode electrode of the light emitting element 300, and the other of the first electrode 210 and the second electrode 220 may be a cathode electrode of the light emitting element 300. However, the first electrode 210 and the second electrode 220 are not limited thereto, and vice versa.

The first electrode 210 and the second electrode 220 may include, respectively, electrode stem parts 210S and 220S disposed to extend in a first direction DR and at least one electrode branch parts 210B and 220B extending and branching from the electrode stem parts 210S and 220S in a second direction DR2, which is a direction intersecting the first direction DR1.

The first electrode 210 may include a first electrode stem part 210S disposed to extend in the first direction DR1 and at least one first electrode branch parts S210B branching from the first electrode stem part 210S and extending in the second direction DR2.

The first electrode stem part 210S of a pixel may have both ends spaced apart from each other and terminated between the respective sub-pixels PXn, but may be placed on substantially the same straight line as a first electrode stem part 210S of a sub-pixel neighboring in the same row (e.g., adjacent in the first direction DR1). The first electrode stem parts 210S disposed in each sub-pixel PXn may have both ends spaced apart from each other to apply different electrical signals to the respective first electrode branch parts 210B, and the first electrode branch parts 210B may be separately driven.

The first electrode branch part 210B may branch from at least a portion (or part) of the first electrode stem part 210S and may be disposed to extend in the second direction DR2, but may be terminated in a state in which it is spaced apart from the second electrode stem part 220S disposed to face the first electrode stem part 210S.

The second electrode 220 may include a second electrode stem part 220S extending in the first direction DR1 and spaced apart from and facing the first electrode stem part 210S in the second direction DR2 and a second electrode branch part 220B branching from the second electrode stem part 220S and extending in the second direction DR2. The second electrode stem part 220S may have another end connected (or extended) to a second electrode stem part 220S of another sub-pixel PXn adjacent thereto in the first direction DR1. For example, the second electrode stem part 220S may be disposed to extend in the first direction DR1 to cross each sub-pixel PXn, unlike the first electrode stem part 210S. The second electrode stem part 220S intersecting each sub-pixel PXn may be connected (or extended) to a portion extending from an outer portion of the display area DA in which the respective pixels PX or sub-pixels PXn are disposed or the non-display area NDA in a direction.

The second electrode branch part 220B may be spaced apart from and face the first electrode branch part 210B and may be terminated in a state in which it is spaced apart from the first electrode stem part 210S. The second electrode branch part 220B may be connected (or extended) to the second electrode stem part 220S, and an end of the second electrode branch part 220B in an extending direction may be disposed in the sub-pixel PXn in a state in which it is spaced apart from the first electrode stem part 210S.

The first electrode 210 and the second electrode 220 may be electrically connected to a circuit element layer PAL (see, e.g., FIG. 4) of the display device 10 through contact holes, for example, a first electrode contact hole CNTD and a second electrode contact hole CNTS, respectively. FIGS. 2 and 3 illustrate that the first electrode contact hole CNTD is formed for each of the first electrode stem parts 210S of each sub-pixel PXn and only a second electrode contact hole CNTS is formed in a second electrode stem part 220S intersecting each sub-pixel PXn. However, the disclosure is not limited thereto, and in some embodiments, the second electrode contact hole CNTS may also be formed for each sub-pixel PXn.

FIGS. 2 and 3 illustrate that two first electrode branch parts 210B are disposed in each sub-pixel PXn and a second electrode branch part 220B is disposed between the two first electrode branch parts 210B, but the disclosure is not limited thereto. The first electrode 210 and the second electrode 220 may not necessarily have a shape in which they extend in a direction, and may be disposed in various structures. For example, the first electrode 210 and the second electrode 220 may have a partially curved or bent shape, and one of the first electrode 210 and the second electrode 220 may be disposed to surround the other of the first electrode 210 and the second electrode 220. The first electrode 210 and the second electrode 220 may be particularly limited in layout structures and shapes thereof as long as at least partial regions thereof are spaced apart from and face each other and accordingly, a space in which the light emitting elements 300 are to be disposed is formed between the first electrode 210 and the second electrode 220.

In some embodiments, the electrode stem parts 210S and 220S may be omitted from the first electrode 210 and the second electrode 220, respectively. The first electrode 210 and the second electrode 220 may have only a shape in which they extend in a direction, and may be disposed to be spaced apart from each other in each sub-pixel PXn. For a description thereof, reference is made to another embodiment.

The banks 410, 420, and 430 may include external banks 430 disposed at boundaries between the respective sub-pixels PXn and internal banks 410 and 420 disposed adjacent to a central portion of each sub-pixel PXn and disposed under the electrodes 210 and 220, respectively. FIGS. 2 and 3 do not illustrate the internal banks 410 and 420, but a first internal bank 410 and a second internal bank 420 may be disposed under the first electrode branch part 210B and the second electrode branch part 220B, respectively.

The external banks 430 may be disposed at the boundaries between the respective sub-pixels PXn. Respective ends of first electrode stem parts 210S may be spaced apart from each other and terminated, on the basis of the external banks 430. The external banks 430 may extend in the second direction DR2 and be disposed at the boundaries between the sub-pixels PXn arranged in the first direction DR1. However, the disclosure is not limited thereto, and the external banks 430 may also extend in the first direction DR1 and may also be disposed at boundaries between sub-pixels PXn arranged in the second direction DR2. The external banks 430 and the internal banks 410 and 420 may include a same material and be formed simultaneously by a process.

The light emitting elements 300 may be disposed between the first electrode 210 and the second electrode 220. One end of the light emitting element 300 may be electrically connected to the first electrode 210, and another end of the light emitting element 300 may be electrically connected to the second electrode 220. The light emitting element 300 may be electrically connected to the first electrode 210 and the second electrode 220 through contact electrodes 260 to be described below.

The light emitting elements 300 may be disposed to be spaced apart from each other, and be aligned substantially parallel to each other. An interval between the light emitting elements 300 spaced apart from each other is not particularly limited. In some embodiments, light emitting elements 300 may be disposed adjacent to each other and be grouped, and other light emitting elements 300 may be grouped in a state in which they are spaced apart from each other by an interval (e.g., a predetermined or selected interval) and may have a non-uniform density, but may be oriented and aligned in a direction. In an embodiment, the light emitting element 300 may have a shape in which it extends in a direction, and a direction in which the respective electrodes, for example, the first electrode branch part 210B and the second electrode branch part 220B extend, and a direction in which the light emitting element 300 extends may be substantially perpendicular to each other. However, the disclosure is not limited thereto, and the light emitting element 300 is not perpendicular to the direction in which the first electrode branch part 210B and the second electrode branch part 220B extend, and may be disposed to be oblique with respect to the direction in which the first electrode branch part 210B and the second electrode branch part 220B extend.

The light emitting element 300 according to an embodiment may include an active layer 360 including different materials to emit light of different wavelength bands to the outside. The display device 10 according to an embodiment may include the light emitting elements 300 emitting light of different wavelength bands. The light emitting element 300 of the first sub-pixel PX1 may include an active layer 360 emitting first light of which a central wavelength band is a first wavelength, the light emitting element 300 of the second sub-pixel PX2 may include an active layer 360 emitting second light of which a central wavelength band is a second wavelength, and the light emitting element 300 of the third sub-pixel PX3 may include an active layer 360 emitting third light of which a central wavelength band is a third wavelength.

Accordingly, the first light may be emitted from the first sub-pixel PX1, the second light may be emitted from the second sub-pixel PX2, and the third light may be emitted from the third sub-pixel PX3. In some embodiments, the first light may be blue light having a central wavelength band in a range of about 450 nm to about 495 nm, the second light may be green light having a central wavelength band in a range of about 495 nm to about 570 nm, and the third light may be red light having a central wavelength band in a range of about 620 nm to about 752 nm.

However, the disclosure is not limited thereto. In some embodiments, each of the first sub-pixel PX1, the second sub-pixel PX2, and the third sub-pixel PX3 may also include a same type of light emitting elements 300 to emit light of substantially a same color.

The light emitting element 300 according to an embodiment may include a doped layer 390 (see FIG. 6) having a specific polarity. The light emitting element 300 may include semiconductor layers having different polarities and may receive electrical signals from the first electrode 210 and the second electrode 220 of the display device 10 to emit light of a specific wavelength band. Such a light emitting element 300 may be disposed between the first electrode 210 and the second electrode 220 while an orientation direction and a position thereof are changed by receiving an electrical force by an electric field generated by the electrical signals transferred to each of the first and second electrodes 210 and 220. The light emitting element 300 according to an embodiment may further include the doped layer 390 having the specific polarity to receive a stronger electrical force from the electric field generated by the electrical signals transferred to each of the electrodes 210 and 220. In the light emitting element 300 including the doped layer 390, a dipole moment between the semiconductor layers having the different polarities increases, such that the electrical force that the light emitting element 300 receives by the electric field may increase. Accordingly, the light emitting elements 300 may be disposed with a high degree of alignment between the respective electrodes 210 and 220. A description thereof will be provided below.

Although not illustrated in FIGS. 2 and 3, the display device 10 may include a first insulating layer 510 covering (or overlapping in a plan view) at least portions (or part) of the first electrode 210 and the second electrode 220.

The first insulating layer 510 may be disposed in each sub-pixel PXn of the display device 10. The first insulating layer 510 may be disposed to substantially entirely cover each sub-pixel PXn and may also be disposed to extend to other neighboring sub-pixels PXn. The first insulating layer 510 may be disposed to cover at least portions of the first electrode 210 and the second electrode 220. Although not illustrated in FIGS. 2 and 3, the first insulating layer 510 may be disposed to expose portions of the first electrode 210 and the second electrode 220, specifically, portions of the first electrode branch part 210B and the second electrode branch part 220B.

The contact electrodes 260 may have at least portions extending in a direction. Each of the contact electrodes 260 may contact (or may be in contact with) the light emitting elements 300 and the electrodes 210 and 220, and the light emitting elements 300 may receive the electrical signals from the first electrode 210 and the second electrode 220 through the contact electrodes 260.

The contact electrode 260 may include first contact electrodes 261 and a second contact electrode 262. The first contact electrodes 261 and the second contact electrode 262 may be disposed on the first electrode branch parts 210B and the second electrode branch part 220B, respectively.

The first contact electrode 261 may be disposed on the first electrode 210 or the first electrode branch part 210B, extend in the second direction DR2, and contact an end of the light emitting element 300. The second contact electrode 262 may be spaced apart from the first contact electrode 261 in the first direction DR1, be disposed on the second electrode 220 or the second electrode branch part 220B, extend in the second direction DR2, and may contact another end of the light emitting element 300. The first contact electrode 261 and the second contact electrode 262 may contact the first electrode 210 and the second electrode 220 exposed through openings of the first insulating layer 510, respectively. The light emitting element 300 may be electrically connected to the first electrode 210 and the second electrode 220 through the first contact electrode 261 and the second contact electrode 262.

In some embodiments, widths of the first contact electrode 261 and the second contact electrode 262 measured in a direction may be greater than widths of the first electrode 210 and the second electrode 220 or the first electrode branch part 210B and the second electrode branch part 220B measured in the a direction, respectively. The first contact electrode 261 and the second contact electrode 262 may be disposed to cover (or overlap in a plan view) side portions of the first electrode 210 and the second electrode 220 or the first electrode branch part 210B and the second electrode branch part 220B. However, the disclosure is not limited thereto, and in some embodiments, the first contact electrode 261 and the second contact electrode 262 may also be disposed to cover only one side portions (or first side portions) of the first electrode branch part 210B and the second electrode branch part 220B.

FIGS. 2 and 3 illustrate that two first contact electrodes 261 and a second contact electrode 262 are disposed in a sub-pixel PXn, but the disclosure is not limited thereto. The numbers of first contact electrodes 261 and second contact electrodes 262 may be changed depending on the numbers of first electrodes 210 and second electrodes 220 or first electrode branch parts 210B and second electrode branch parts 220B disposed in each sub-pixel PXn.

The display device 10 may include a circuit element layer PAL positioned under the respective electrodes 210 and 220, a second insulating layer 520 (see FIG. 4) disposed to cover at least portions of the respective electrodes 210 and 220 and the light emitting element 300, and a passivation layer 550 (see FIG. 4), in addition to the first insulating layer 510. Hereinafter, a structure of the display device 10 will be described in detail with reference to FIG. 4.

FIG. 4 is a schematic cross-sectional view taken along line Xa-Xa', line Xb-Xb', and line Xc-Xc' of FIG. 3.

FIG. 4 illustrates only a cross section of the first sub-pixel PX1, which may be similarly applied to other pixels PX or sub-pixels PXn. FIG. 4 illustrates a cross section intersecting an end and another end of the light emitting element 300 disposed in the first sub-pixel PX1.

Referring to FIG. 4 in conjunction with FIGS. 2 and 3, the display device 10 may include a circuit element layer PAL and an emission layer EML. The circuit element layer PAL may include a substrate 110, a buffer layer 115, a light blocking layer BML, first and second transistors 120 and 140, and the like, and the emission layer EML may include electrodes 210 and 220, a light emitting element 300, insulating layers 510, 520, and 550, and the like, disposed above the first and second transistors 120 and 140.

The substrate 110 may be an insulating substrate. The substrate 110 may be made of an insulating material such as glass, quartz, or a polymer resin. The substrate 110 may be a rigid substrate, but may also be a flexible substrate that may be bent, folded, or rolled.

The light blocking layer BML may be disposed on the substrate 110. The light blocking layer BML may include a first light blocking layer BML1 and a second light blocking layer BML2. The first light blocking layer BML1 may be electrically connected to a first drain electrode 123 of a first transistor 120 to be described below. The second light blocking layer BML2 may be electrically connected to a second drain electrode 143 of the second transistor 140.

The first light blocking layer BML1 and the second light blocking layer BML2 are disposed to overlap (e.g., in a plan view) a first active layer (or first active material layer) 126 of the first transistor 120 and a second active layer (or second active material layer) 146 of the second transistor 140, respectively. The first and second light blocking layers BML1 and BML2 may include a material blocking light to prevent the light from being incident on the first and second active layers 126 and 146. As an example, the first and second light blocking layers BML1 and BML2 may be made of an opaque metal material blocking transmission of the light. However, the disclosure is not limited thereto, and in some embodiments, the light blocking layer BML may be omitted.

The buffer layer 115 is disposed on the light blocking layer BML and the substrate 110. The buffer layer 115 may entirely cover the light blocking layer BML and the substrate 110. The buffer layer 115 may prevent diffusion of impurity ions, prevent permeation of moisture or outside air, and perform a surface planarization function. The buffer layer 115 may insulate the light blocking layer BML and the first and second active layers 126 and 146 from each other.

A semiconductor layer is disposed on the buffer layer 115. The semiconductor layer may include the first active layer 126 of the first transistor 120, the second active layer 146 of the second transistor 140, and an auxiliary layer 163. The semiconductor layer may include polycrystalline silicon, single crystal silicon, an oxide semiconductor, or the like.

The first active layer 126 may include a first doped region 126a, a second doped region 126b, and a first channel region 126c. The first channel region 126c may be disposed between the first doped region 126a and the second doped region 126b. The second active layer 146 may include a third doped region 146a, a fourth doped region 146b, and a second channel region 146c. The second channel region 146c may be disposed between the third doped region 146a and the fourth doped region 146b. The first active layer 126 and the second active layer 146 may include polycrystalline silicon. The polycrystalline silicon may be formed by crystallizing amorphous silicon. Examples of the crystallization method include a rapid thermal annealing (RTA) method, a solid phase crystallization (SPC) method, an excimer laser annealing (ELA) method, a metal induced crystallization (MILC) method, a sequential lateral solidification (SLS) method, and the like, but are not limited thereto. As another example, the first active layer 126 and the second active layer 146 may include single crystal silicon, low-temperature polycrystalline silicon, amorphous silicon, or the like. The first doped region 126a, the second doped region 126b, the third doped region 146a, and the fourth doped region 146b may be regions formed by doping portions of the first active layer 126 and the second active layer 146 with impurities. However, the disclosure is not limited thereto.

The first active layer 126 and the second active layer 146 are not necessarily limited to those described above. In an embodiment, the first active layer 126 and the second active layer 146 may include an oxide semiconductor. In this case, the first doped region 126a and the third doped region 146a may be a first conductive region, and the second doped region 126b and the fourth doped region 146b may be a second conductive region. In case that the first active layer 126 and the second active layer 146 include the oxide semiconductor, the oxide semiconductor may be an oxide semiconductor containing indium (In). In some embodiments, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc tin oxide (IGZTO), or the like. However, the disclosure is not limited thereto.

A first gate insulating film 150 is disposed on the semiconductor layer. The first gate insulating film 150 may be disposed to entirely cover the semiconductor layer and the buffer layer 115. The first gate insulating film 150 may function as a gate insulating film of the first and second transistors 120 and 140.

A first conductive layer is disposed on the first gate insulating film 150. The first conductive layer may include a first gate electrode 121 disposed on the first active layer 126 of the first transistor 120, a second gate electrode 141 disposed on the second active layer 146 of the second transistor 140, and a power line 161 disposed on the auxiliary layer 163, on the first gate insulating film 150. The first gate electrode 121 may overlap the first channel region 126c of the first active layer 126, and the second gate electrode 141 may overlap the second channel region 146c of the second active layer 146.

An interlayer insulating film 170 is disposed on the first conductive layer. The interlayer insulating film 170 may function as an insulating film between the first conductive layer and other layers disposed on the interlayer insulating film 170. The interlayer insulating film 170 may include an organic insulating material and perform a surface planarization function.

A second conductive layer is disposed on the interlayer insulating film 170. The second conductive layer includes a first drain electrode 123 and a first source electrode 124 of the first transistor 120, a second drain electrode 143 and a second source electrode 144 of the second transistor 140, and a power electrode 162 disposed on the power line 161.

The first drain electrode 123 and the first source electrode 124 may contact the first doped region 126*a* and the second doped region 126*b* of the first active layer 126, respectively, through contact holes penetrating through the interlayer insulating film 170 and the first gate insulating film 150. The second drain electrode 143 and the second source electrode 144 may contact the third doped region 146*a* and the fourth doped region 146*b* of the second active layer 146, respectively, through contact holes penetrating through the interlayer insulating film 170 and the first gate insulating film 150. The first drain electrode 123 and the second drain electrode 143 may be electrically connected to the first light blocking layer BML1 and the second light blocking layer BML2, respectively, through other contact holes.

A via layer 200 is disposed on the second conductive layer. The via layer 200 may include an organic insulating material and perform a surface planarization function.

The banks 410, 420, and 430, the electrodes 210 and 220, and the light emitting element 300 may be disposed on the via layer 200.

The banks 410, 420, and 430 may include internal banks 410 and 420 spaced apart from each other in each sub-pixel PXn and an external bank 430 disposed at a boundary between neighboring sub-pixels PXn.

As described above, the external bank 430 may extend in the first direction DR1 or the second direction DR2 and may be disposed at the boundary between the sub-pixels PXn. For example, the external bank 430 may divide the boundary between the respective sub-pixels PXn.

The external bank 430 may serve to prevent an ink in which the light emitting elements 300 are dispersed from intersecting the boundary between the sub-pixels PXn in case that the ink is jetted using an inkjet printing device, when the display device 10 is manufactured. The external bank 430 may separate inks in which different light emitting elements 300 are dispersed for each of the different sub-pixels PXn from each other so that these inks are not mixed with each other. However, the disclosure is not limited thereto.

The internal banks 410 and 420 may include a first internal bank 410 and a second internal bank 420 disposed adjacent to a central portion of each sub-pixel PXn.

The first inner bank 410 and the second inner bank 420 are disposed to be spaced apart from and face each other. The first electrode 210 may be disposed on the first internal bank 410, and the second electrode 220 may be disposed on the second internal bank 420. Referring to FIGS. 3 and 4, it may be understood that the first electrode branch part 210B is disposed on the first internal bank 410 and the second electrode branch part 220B is disposed on the second internal bank 420.

The first internal bank 410 and the second internal bank 420 may be disposed to extend in the second direction DR2 in each sub-pixel PXn. Although not illustrated in FIG. 4, the first internal bank 410 and the second internal bank 420 may extend in the second direction DR2 to extend toward the sub-pixel PXn neighboring in the second direction DR2. However, the disclosure is not limited thereto, and the first internal bank 410 and the second internal bank 420 may be disposed for each sub-pixel PXn to form a pattern in the entirety of the display device 10. The banks 410, 420, and 430 may include polyimide (PI), but the disclosure is not limited thereto.

The first inner bank 410 and the second inner bank 420 may have a structure in which at least portions thereof protrude with respect to the via layer 200. The first inner bank 410 and the second inner bank 420 may protrude upward with respect to a plane on which the light emitting element 300 is disposed, and at least portions of the protruding portions may have an inclination. Protruding shapes of the first inner bank 410 and the second inner bank 420 are not particularly limited. Since the inner banks 410 and 420 protrude with respect to the via layer 200 and have inclined side surfaces, the light emitted from the light emitting element 300 may be reflected on the inclined side surfaces of the inner banks 410 and 420. As described below, in case that the electrodes 210 and 220 disposed on the inner banks 410 and 420 include a material having high reflectivity, the light emitted from the light emitting element 300 may be reflected by the electrodes 210 and 220 positioned on the inclined side surfaces of the internal banks 410 and 420 to travel in an upward direction of the via layer 200.

In other words, the external bank 430 may serve (or function) to divide the neighboring sub-pixels PXn and at the same time, prevent the ink from overflowing into the neighboring sub-pixels PXn in an inkjet process, whereas the internal banks 410 and 420 may serve as a reflection partition wall reflecting the light emitted from the light emitting element 300 in the upward direction of the via layer 200 by having a protruding structure within each sub pixel PXn. However, the disclosure is not limited thereto.

The electrodes 210 and 220 may be disposed on the via layer 200 and the internal banks 410 and 420. As described above, the electrodes 210 and 220 include the electrode stem parts 210S and 220S and the electrode branch parts 210B and 220B, respectively. Line Xa-Xa' of FIG. 3 is a line intersecting the first electrode stem part 210S, line Xb-Xb' of FIG. 3 is a line intersecting the first electrode branch part 210B and the second electrode branch part 220B of first area 101, and line Xc-Xc' of FIG. 3 is a line intersecting the second electrode stem part 220S. For example, it may be understood that the first electrode 210 disposed in area Xa-Xa' of FIG. 4 is the first electrode stem part 210S, the first electrode 210 and the second electrode 210 disposed in area Xb-Xb' of FIG. 4 are the first electrode branch part 210B and the second electrode branch part 220B, respectively, and the second electrode 220 disposed in area Xc-Xc' of FIG. 4 is the second electrode stem part 220S. Each of the electrode stem parts 210S and 220S and each of the electrode branch parts 210B and 220B may form (or constitute) the first electrode 210 and the second electrode 220.

Portions of the first electrode 210 and the second electrode 220 may be disposed on the via layer 200, and other portions of the first electrode 210 and the second electrode 220 may be disposed on the first internal bank 410 and the second internal bank 420. For example, widths of the first electrode 210 and the second electrode 220 may be greater than widths of the internal banks 410 and 420. Portions of lower surfaces of the first electrode 210 and the second electrode 220 may contact the via layer 200, and other portions of the lower surfaces of the first electrode 210 and the second electrode 220 may contact the internal banks 410 and 420, respectively.

Although not illustrated in FIG. 4, the first electrode stem part 210S and the second electrode stem part 220S of the first electrode 210 and the second electrode 220 extending in the first direction DR1 may partially overlap the first internal bank 410 and the second internal bank 420. However, the disclosure is not limited thereto, and the first electrode stem part 210S and the second electrode stem part 220S may not overlap the first internal bank 410 and the second internal bank 420.

The first electrode contact hole CNDT penetrating through the via layer 200 to expose a portion of the first drain electrode 123 of the first transistor 120 may be formed in the first electrode stem part 210S of the first electrode 210. The first electrode 210 may contact the first drain electrode 123 through the first electrode contact hole CNTD. The first electrode 210 may be electrically connected to the first drain electrode 123 of the first transistor 120 to receive an electrical signal (e.g., a predetermined or selected electrical signal).

The second electrode contact hole CNTS penetrating through the via layer 200 to expose a portion of the power electrode 162 may be formed in the second electrode stem part 220S of the second electrode 220. The second electrode 220 may contact the power electrode 162 through the second electrode contact hole CNTS. The second electrode 220 may be electrically connected to the power electrode 162 to receive an electrical signal from the power electrode 162.

Portions of the first electrode 210 and the second electrode 220, for example, the first electrode branch part 210B and the second electrode branch part 220B may be disposed on the first internal bank 410 and the second internal bank 420, respectively. The first electrode branch part 210B may be disposed to cover the first internal bank 410, and the second electrode branch part 220B may be disposed to cover the second internal bank 420. The first electrode branch part 210B and the second electrode branch part 220B may be disposed to be spaced apart from each other, and the light emitting elements 300 may be disposed between the first electrode branch part 210B and the second electrode branch part 220B.

Each of the electrodes 210 and 220 may include a transparent conductive material. As an example, each of the electrodes 210 and 220 may include a material such as indium tin oxide (ITO), indium zinc oxide (IZO), or indium tin zinc oxide (ITZO), but the disclosure is not limited thereto. In some embodiments, each of the electrodes 210 and 220 may include a conductive material having high reflectivity. For example, each of the electrodes 210 and 220 may include a metal such as silver (Ag), copper (Cu), or aluminum (Al) as the material having the high reflectivity. In this case, light incident on each of the electrodes 210 and 220 may be reflected to be emitted in an upward direction of each sub-pixel PXn.

The electrodes 210 and 220 may have a structure in which one or more layers made of the transparent conductive material and one or more layers made of the metal having the high reflectivity are stacked or may be formed as a layer including the transparent conductive material and the metal having the high reflectivity. In an embodiment, each of the electrodes 210 and 220 may have a stacked structure of ITO/silver (Ag)/ITO/IZO or be made of an alloy including aluminum (Al), nickel (Ni), lanthanum (La), and the like. However, the disclosure is not limited thereto.

The first insulating layer 510 is disposed on the via layer 200, the first electrode 210, and the second electrode 220. The first insulating layer 510 is disposed to partially cover the first electrode 210 and the second electrode 220. The first insulating layer 510 may be disposed to cover (or overlap in a plan view) most of upper surfaces of the first electrode 210 and the second electrode 220, but may have openings (not illustrated) formed to expose portions of the first electrode 210 and the second electrode 220. The openings of the first insulating layer 510 may be positioned to expose relatively flat upper surfaces of the first electrode 210 and the second electrode 220.

In an embodiment, the first insulating layer 510 may have a step formed so that a portion of an upper surface thereof is recessed between the first electrode 210 and the second electrode 220. In some embodiments, the first insulating layer 510 may include an inorganic insulating material, and a portion of the upper surface of the first insulating layer 510 disposed to cover the first electrode 210 and the second electrode 220 may be recessed due to a step of a member disposed under the first insulating layer 510. The light emitting element 300 disposed on the first insulating layer 510 between the first electrode 210 and the second electrode 220 may form an empty space between the light emitting element 300 and the recessed upper surface of the first insulating layer 510. The light emitting element 300 may be disposed to be partially spaced apart from the upper surface of the first insulating layer 510, and the space may be filled with a material constituting a second insulating layer 520 to be described below.

However, the disclosure is not limited thereto. The first insulating layer 510 may form a flat upper surface on which the light emitting element 300 is disposed. The upper surface may extend in a direction toward the first electrode 210 and the second electrode 220 and be terminated at inclined side surfaces of the first electrode 210 and the second electrode 220. For example, the first insulating layer 510 may be disposed in regions where the electrodes 210 and 220 overlap the inclined side surfaces of the first internal bank 410 and the second internal bank 420, respectively. A contact electrode 260 to be described below may contact the exposed portions of the first electrode 210 and the second electrode 220, and smoothly contact ends of the light emitting element 300 on the flat upper surface of the first insulating layer 510.

The first insulating layer 510 may insulate the first electrode 210 and the second electrode 220 from each other while protecting the first electrode 210 and the second electrode 220. The first insulating layer 510 may prevent the light emitting element 300 disposed on the first insulating layer 510 from being damaged by other members by directly contacting the other members. However, a shape and a structure of the first insulating layer 510 are not limited thereto.

The light emitting element 300 may be disposed on the first insulating layer 510 between the respective electrodes 210 and 220. As an example, at least one light emitting element 300 may be disposed on the first insulating layer 510 disposed between the respective electrode branch parts 210B and 220B. However, the disclosure is not limited thereto, and although not illustrated in FIG. 4, at least some of the light emitting elements 300 disposed in each sub-pixel PXn may also be disposed in a region other than a region between the electrode branch parts 210B and 220B. The light emitting element 300 may be disposed so that a portion thereof overlaps the electrodes 210 and 220. The light emitting element 300 may be disposed on each of ends of the first electrode branch part 210B and the second electrode branch part 220B facing each other.

The light emitting element 300 may include layers disposed in a direction horizontal to the via layer 200. The light emitting element 300 of the display device 10 according to an embodiment may extend in a direction and may have a structure in which semiconductor layers are sequentially disposed in a direction. As described below, in the light emitting element 300, a first semiconductor layer 310, an active layer 360, a second semiconductor layer 320, and an electrode layer 370 may be sequentially disposed in a direction, and an insulating film 380 may surround outer surfaces of the first semiconductor layer 310, the active layer 360, the second semiconductor layer 320, and the electrode layer 370. The light emitting element 300 disposed in the display device 10 may be disposed so that a direction in which the light emitting element 300 extends is parallel to the via layer 200, and the semiconductor layers included in the light emitting element 300 may be sequentially disposed in a direction parallel to an upper surface of the via layer 200. However, the disclosure is not limited thereto. In some embodiments, in case that the light emitting element 300 has another structure, the layers may be disposed in a direction perpendicular to the via layer 200. As described above, the light emitting element 300 further includes a doped layer 390. This will be described below with reference to other drawings.

One end of the light emitting element 300 may contact the first contact electrode 261, and another end of the light emitting element 300 may contact the second contact electrode 262. According to an embodiment, end surfaces of the light emitting element 300 extending in a direction are exposed without the insulating film 380, and thus, the light emitting element 300 may contact a first contact electrode 261 and a second contact electrode 262 to be described below in the exposed portions thereof. However, the disclosure is not limited thereto. In some embodiments, at least portions of the insulating film 380 of the light emitting element 300 are removed, such that both end side surfaces of the light emitting element 300 may be partially exposed. In a step of forming the second insulating layer 520 covering an outer surface of the light emitting element 300 during processes of manufacturing the display device 10, the insulating film 380 may be partially removed. The exposed end surfaces of the light emitting element 300 may contact the first contact electrode 261 and the second contact electrode 262. However, the disclosure is not limited thereto.

The second insulating layer 520 may be partially disposed on the light emitting element 300 disposed between the first electrode 210 and the second electrode 220. The second insulating layer 520 may be disposed to partially surround the outer surface of the light emitting element 300 to serve to protect the light emitting element 300 and fix the light emitting element 300 during the processes of manufacturing the display device 10. According to an embodiment, the second insulating layer 520 may be disposed on the light emitting element 300, but expose an end and another end of the light emitting element 300. The light emitting element 300 may contact the contact electrode 260 at the end and the other end thereof that are exposed and may receive electrical signals from the respective electrodes 210 and 220. Such a shape of the second insulating layer 520 may be formed by performing a patterning process using a material forming the second insulating layer 520 by a general mask process. A mask for forming the second insulating layer 520 may have a width smaller than a length of the light emitting element 300, and both ends of the light emitting element 300 may be exposed by patterning the material forming the second insulating layer 520. However, the disclosure is not limited thereto.

In an embodiment, a portion of the material of the second insulating layer 520 may be disposed between a lower surface of the light emitting element 300 and the first insulating layer 510. The second insulating layer 520 may be formed to fill the space between the first insulating layer 510 and the light emitting element 300 formed during the processes of manufacturing the display device 10. Accordingly, the second insulating layer 520 may be formed to surround the outer surface of the light emitting element 300. However, the disclosure is not limited thereto.

The second insulating layer 520 may be disposed to extend in the second direction DR2 between the first electrode branch part 210B and the second electrode branch part 220B in a plan view. As an example, the second insulating layer 520 may have an island shape or a linear shape on the via layer 200, in a plan view.

The first contact electrode 261 and the second contact electrode 262 are disposed on the electrodes 210 and 220, respectively, and are disposed on the second insulating layer 520. The second insulating layer 520 may be disposed between the first contact electrode 261 and the second contact electrode 262 and may insulate the first contact electrode 261 and the second contact electrode 262 from each other so that the first contact electrode 261 and the second contact electrode 262 do not directly contact each other.

As described above, the first contact electrode 261 and the second contact electrode 262 may contact at least one end of the light emitting element 300 and may be electrically connected to the first electrode 210 or the second electrode 220 to receive the electrical signals.

The first contact electrode 261 may contact the exposed portion of the first electrode 210 on the first inner bank 410, and the second contact electrode 262 may contact the exposed portion of the second electrode 220 on the second inner bank 420. The first contact electrode 261 and the second contact electrode 262 may transfer the electrical signals transferred from the respective electrodes 210 and 220 to the light emitting element 300.

The contact electrode 260 may include a conductive material. For example, the connection electrode 260 may include ITO, IZO, ITZO, aluminum (Al), or the like. However, the disclosure is not limited thereto.

The passivation layer 550 may be disposed on the contact electrode 260 and the second insulating layer 520. The passivation layer 550 may serve to protect members disposed on the via layer 200 from an external environment.

Each of the first insulating layer 510, the second insulating layer 520, and the passivation layer 550 described above may include an inorganic insulating material or an organic insulating material. In an embodiment, the first insulating layer 510, the second insulating layer 520, and the passivation layer 550 may include an inorganic insulating material such as silicon oxide ($SiO_x$), silicon nitride ($SiN_x$), silicon oxynitride ($SiO_xN_y$), aluminum oxide ($Al_2O_3$), or aluminum nitride (AlN). The first insulating layer 510, the second insulating layer 520, and the passivation layer 550 may include an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethylmethacrylate, polycarbonate, a polymethylmethacrylate-polycarbonate synthetic resin, and the like, as the organic insulating material. However, the disclosure is not limited thereto.

The display device 10 may include a larger number of insulating layers. According to an embodiment, the display device 10 may further include a third insulating layer 530 disposed to protect the first contact electrode 261.

Figure 5:
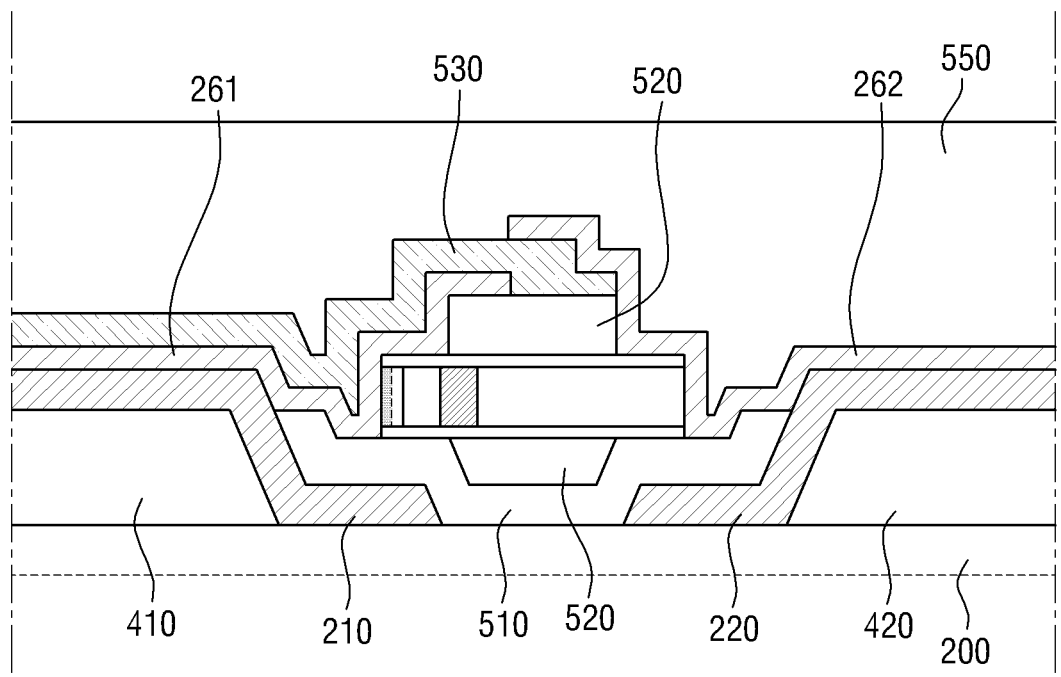
FIG. 5 is a schematic cross-sectional view illustrating a portion of a display device according to another embodiment.

FIG. 5 is a schematic cross-sectional view illustrating a portion of a display device according to another embodiment.

Referring to FIG. 5, a display device 10 according to an embodiment may further include a third insulating layer 530 disposed on the first contact electrode 261. The display device 10 according to the embodiment is different from the display device 10 of FIG. 4 in that it further includes the third insulating layer 530 and at least a portion of the second contact electrode 262 is disposed on the third insulating layer 530. Hereinafter, repetitive descriptions thereof will be omitted, and differences from those described above will be mainly described.

The display device 10 of FIG. 5 may include the third insulating layer 530 disposed on the first contact electrode 261 and electrically insulating the first contact electrode 261 and the second contact electrode 262 from each other. The third insulating layer 530 may be disposed to cover the first contact electrode 261, but may be disposed so as not to overlap a portion of the light emitting element 300 so that the light emitting element 300 may be electrically connected to the second connection electrode 262. The third insulating layer 530 may partially contact the first contact electrode 261 and the second insulating layer 520 on an upper surface of the second insulating layer 520. The third insulating layer 530 may be disposed to cover an end of the first contact electrode 261 on the second insulating layer 520. Accordingly, the third insulating layer 530 may protect the first contact electrode 261 and at the same time, electrically insulate the first contact electrode 261 from the second contact electrode 262.

A side surface of the third insulating layer 530 in a direction in which the second contact electrode 262 is disposed may be aligned with a side surface of the second insulating layer 520. However, the disclosure is not limited thereto. In some embodiments, similar to the first insulating layer 510, the third insulating layer 530 may include an inorganic insulating material.

The first contact electrode 261 may be disposed between the first electrode 210 and the third insulating layer 530, and the second contact electrode 262 may be disposed on the third insulating layer 530. The second contact electrode 262 may partially contact the first insulating layer 510, the second insulating layer 520, the third insulating layer 530, the second electrode 220, and the light emitting element 300. An end of the second contact electrode 262 in a direction in which the first electrode 210 is disposed may be disposed on the third insulating layer 530.

The passivation layer 550 may be disposed on the third insulating layer 530 and the second contact electrode 262 to protect the third insulating layer 530 and the second contact electrode 262. Hereinafter, repetitive descriptions thereof will be omitted.

The display device 10 according to an embodiment may include a light emitting element 300 in which a doped layer 390 is formed on at least one surface of the active layer 360. The processes of manufacturing the display device 10 may include a process of aligning the light emitting element 300 between the first electrode 210 and the second electrode 220 by generating an electric field on the first electrode 210 and the second electrode 220. The light emitting element 300 includes the doped layer 390, such that a dipole moment may increase and an electrical force transferred by the electric field may increase. Hereinafter, the light emitting element 300 according to an embodiment will be described in detail with reference to other drawings.

Figure 6:
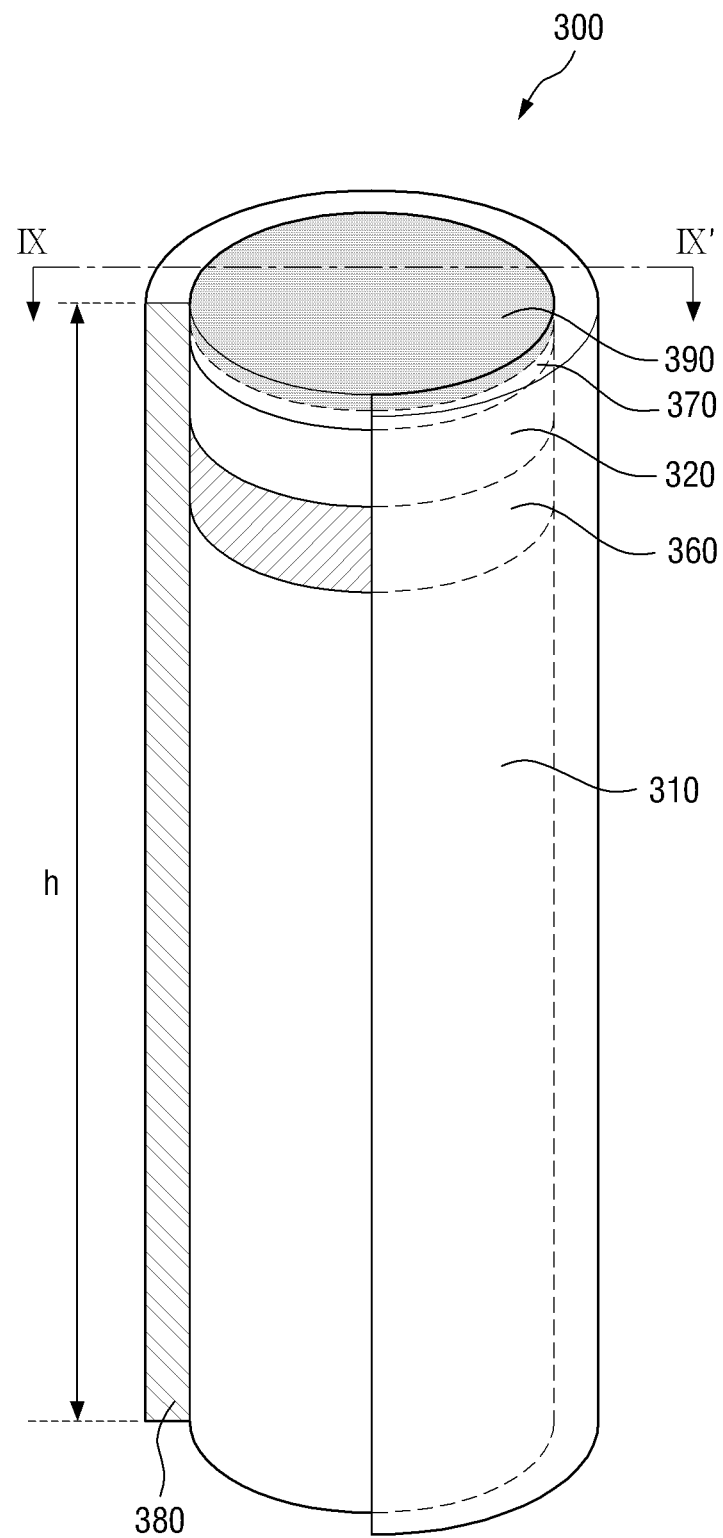
FIG. 6 is a schematic perspective view of a light emitting element according to an embodiment.
Figure 7:
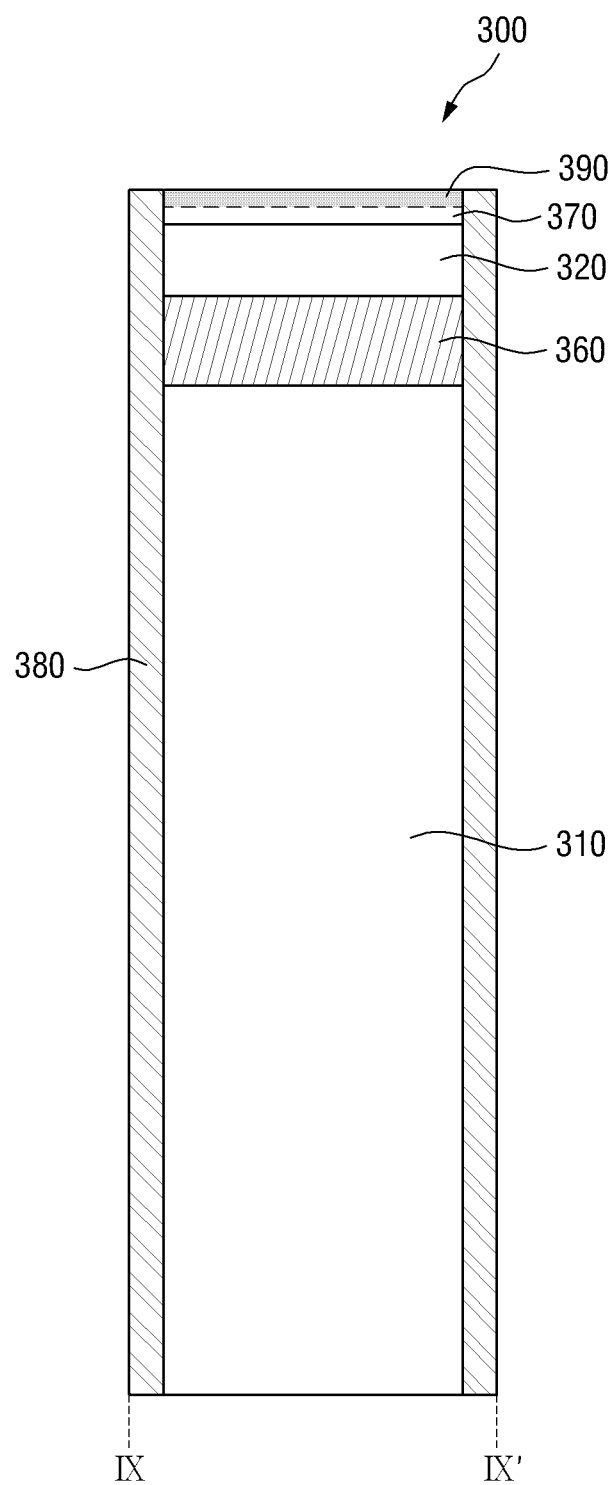
FIG. 7 is a schematic cross-sectional view taken along line IX-IX' of FIG. 6.

FIG. 6 is a schematic perspective view of a light emitting element according to an embodiment. FIG. 7 is a schematic cross-sectional view taken along line IX-IX' of FIG. 6.

The light emitting element 300 may be alight emitting diode. Specifically, the light emitting element 300 may be an inorganic light emitting diode having a size of a micrometer or nanometer scale and made of an inorganic material. The inorganic light emitting diode may be aligned between two electrodes in which polarities are formed in case that an electric field is formed in a specific direction between the two electrodes facing each other. The light emitting element 300 may be aligned between the two electrodes by the electric field formed on the two electrodes.

The light emitting element 300 according to an embodiment may have a shape in which it extends in a direction. The light emitting element 300 may have a shape such as a rod shape, a wire shape, or a tube shape. In an embodiment, the light emitting element 300 may have a cylindrical shape or a rod shape. However, the light emitting element 300 is not limited to having the shape described above, and may have various shapes. For example, the light emitting element 300 may have a polygonal prismatic shape such as a cubic shape, a rectangular parallelepiped shape, or a hexagonal prismatic shape or have a shape in which it extends in a direction and has a partially inclined outer surface. Semiconductors included in a light emitting element 300 to be described below may have a structure in which they are sequentially disposed or stacked each other in the a direction.

The light emitting element 300 may include a semiconductor layer doped with a conductivity-type (e.g., p-type or n-type) impurity. The semiconductor layer may receive an electrical signal applied from an external power source and emit the electrical signal as light of a specific wavelength band.

The light emitting element 300 according to an embodiment may emit light of a specific wavelength band. In an embodiment, an active layer 360 may emit blue light having a central wavelength band in a range of about 450 nm to about 495 nm. However, it should be understood that the central wavelength band of the blue light is not limited to the above-described range and includes all wavelength ranges that may be recognized as blue in the technical field. The central wavelength band of the light emitted from the active layer 360 of the light emitting element 300 is not limited thereto, and the light may also be green light having a central wavelength band in a range of about 495 nm to about 570 nm or red light having a central wavelength band in a range of about 620 nm to about 750 nm. Hereinafter, the light emitting element 300 emitting the blue light will be described by way of example.

Referring to FIGS. 6 and 7, the light emitting element 300 may include a first semiconductor layer 310, a second semiconductor layer 320, an active layer 360, an insulating film 380, and a doped layer 390. The light emitting element 300 according to an embodiment may further include an electrode layer 370 disposed on a surface of the first semiconductor layer 310 or the second semiconductor layer 320.

The first semiconductor layer 310 may be an n-type semiconductor. As an example, in case that the light emitting element 300 emits light of a blue wavelength band, the first semiconductor layer 310 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with an n-type dopant. The first semiconductor layer 310 may be doped with an n-type dopant, which may be Si, Ge, Sn, or the like, as an example. In an embodiment, the first semiconductor layer 310 may be made of n-GaN doped with n-type Si. A length of the first semiconductor layer 310 may be in a range of about 1.5 µm to about 5 µm, but is not limited thereto.

The second semiconductor layer 320 is disposed on an active layer 360 to be described below. The second semiconductor layer 320 may be a p-type semiconductor, and as an example, in case that the light emitting element 300 emits light of a blue or green wavelength band, the second semiconductor layer 320 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with a p-type dopant. The second semiconductor layer 320 may be doped with a p-type dopant, which may be Mg, Zn, Ca, Se, Ba, or the like, as an example. In an embodiment, the second semiconductor layer 320 may be made of p-GaN doped with p-type Mg. A length of the second semiconductor layer 320 may be in a range of about 0.05 µm to about 0.10 µm, but is not limited thereto.

FIGS. 6 and 7 illustrate that each of the first semiconductor layer 310 and the second semiconductor layer 320 is configured as one layer, but the disclosure is not limited thereto. According to some embodiments, each of the first semiconductor layer 310 and the second semiconductor layer 320 may further include a larger number of layers, for example, a clad layer or a tensile strain barrier reducing (TSBR) layer, according to a material of the active layer 360. This will be described below with reference to other drawings.

The active layer 360 is disposed between the first semiconductor layer 310 and the second semiconductor layer 320. The active layer 360 may include a material having a single or multiple quantum well structure. In case that the active layer 360 includes the material having the multiple quantum well structure, the active layer 360 may have a structure in which quantum layers and well layers are alternately stacked. The active layer 360 may emit light by a combination of electron-hole pairs according to an electrical signal applied through the first semiconductor layer 310 and the second semiconductor layer 320. As an example, in case that the active layer 360 emits light of a blue wavelength band, the active layer 360 may include a material such as AlGaN or AlGaInN. In case that the active layer 360 has the multiple quantum well structure, for example, the structure in which the quantum layers and the well layers are alternately stacked, the quantum layers may include a material such as AlGaN or AlGaInN, and the well layers may include a material such as GaN or AlInN. In an embodiment, the active layer 360 may include AlGaInN as a material of the quantum layers and AlInN as a material of the well layers to emit blue light having a central wavelength band of about 450 nm to about 495 nm, as described above.

However, the disclosure is not limited thereto, and the active layer 360 may have a structure in which semiconductor materials having large band gap energy and semiconductor materials having small band gap energy are alternately stacked, and may include other Group III to V semiconductor materials according to a wavelength band of emitted light. The light emitted by the active layer 360 is not limited to the light of the blue wavelength band, and in some embodiments, the active layer 360 may emit light of a red and green wavelength band. A length of the active layer 360 may be in a range of about 0.05 µm to about 0.10 µm, but is not limited thereto.

The light emitted from the active layer 360 may be emitted not only to an outer surface of the light emitting element 300 in a length direction, but also to both side surfaces of the light emitting element 300. Directivity of the light emitted from the active layer 360 is not limited to a direction.

The electrode layer 370 may be an ohmic contact electrode. However, the disclosure is not limited thereto, and the electrode layer 370 may also be a Schottky contact electrode. The light emitting element 300 may include at least one electrode layer 370. FIG. 6 illustrates that the light emitting element 300 includes an electrode layer 370, but the disclosure is not limited thereto. In some embodiments, the light emitting element 300 may include a larger number of electrode layers 370, or the electrode layer 370 may be omitted. A description of a light emitting element 300 to be provided below may be similarly applied even though the number of electrode layers 370 is changed or the light emitting element 300 further includes another structure.

The electrode layer 370 may decrease resistance between the light emitting element 300 and the electrode or the contact electrode in case that the light emitting element 300 is electrically connected to the electrode or the contact electrode in the display device 10 according to an embodiment. The electrode layer 370 may include a conductive metal. The electrode layer 370 may include at least one of aluminum (Al), titanium (Ti), indium (In), gold (Au), silver (Ag), indium tin oxide (ITO), indium zinc oxide (IZO), and indium tin zinc oxide (ITZO). The electrode layer 370 may include a semiconductor material doped with an n-type or p-type dopant. The electrode layer 370 may include a same material or include different materials, but the disclosure is not limited thereto.

The insulating film 380 is disposed to surround outer surfaces of the semiconductor layers and the electrode layers described above. In an embodiment, the insulating film 380 may be disposed to surround at least an outer surface of the active layer 360 and may extend in a direction in which the light emitting element 330 extends. The insulating film 380 may serve to protect the members described above. As an example, the insulating film 380 may be formed to surround side portions of the members described above, but may be formed to expose both ends of the light emitting element 300 in the length direction.

FIGS. 6 and 7 illustrate that the insulating film 380 is formed to extend in the length direction of the light emitting element 300 to cover side surfaces of the first semiconductor layer 310, the active layer 360, the second semiconductor layer 320, and the electrode layer 370, but the disclosure is not limited thereto. The insulating film 380 may cover only outer surfaces of some of the semiconductor layers as well as the active layer 360 or cover only a portion of an outer surface of the electrode layer 370, such that the outer surface of each electrode layer 370 may be partially exposed. The insulating film 380 may also be formed so that an upper surface thereof is rounded in cross section in a region adjacent to at least one end of the light emitting element 300.

A thickness of the insulating film 380 may be in a range of about 10 nm to about 1.0 µm, but is not limited thereto. The thickness of the insulating film 380 may be about 40 nm.

The insulating film 380 may include materials having insulating properties, such as silicon oxide ($SiO_x$), silicon nitride ($SiN_x$), silicon oxynitride ($SiO_xN_y$), aluminum nitride (AlN), and aluminum oxide ($Al_2O_3$). Accordingly, an electrical short circuit that may occur in case that the active layer 360 directly contacts an electrode through which an electrical signal is transferred to the light emitting element 300 may be prevented. The insulating film 380 protects an outer surface of the light emitting element 300 as well as the active layer 360, and may thus prevent a decrease in luminous efficiency.

In some embodiments, an outer surface of the insulating film 380 may be surface-treated. In case that the display device 10 is manufactured, an ink may be jetted onto electrodes in a state in which the light emitting elements 300 are dispersed in the ink, such that the light emitting elements 300 may be aligned. To maintain the light emitting elements 300 in a state in which the light emitting elements 300 are dispersed without being agglomerated with other adjacent light emitting elements 300 in the ink, a hydrophobic or hydrophilic treatment may be performed on a surface of the insulating film 380.

The light emitting element 300 includes the doped layer 390. The doped layer 390 may be formed on the first semiconductor layer 310, the second semiconductor layer 320, or the electrode layer 370. According to an embodiment, the doped layer 390 may be formed on or above a first surface of the active layer 360 on which the first semiconductor layer 310 is disposed, or be formed on or above a second surface of the active layer 360 on which the second semiconductor layer 320 is disposed. FIGS. 6 and 7 illustrate that the doped layer 390 is disposed on an upper surface of the electrode layer 370 which is above the second surface of the active layer 360. However, the disclosure is not limited thereto, and a position of the doped layer 390 in the light emitting element 300 may be variously modified on the basis of the active layer 360. Hereinafter, it will be described that the doped layer 390 is formed on the upper surface of the electrode layer 370, and various positions of the doped layer 390 will be described below with reference to other embodiments.

The doped layer 390 may have ions with a first polarity or a second polarity. The doped layer 390 and a layer on which the doped layer 390 is formed may include substantially a same material, but the doped layer 390 may further include the ions with the first polarity or the second polarity. In the light emitting element 300 illustrated in FIGS. 6 and 7, the doped layer 390 and the electrode layer 370 may include a same material, but the doped layer 390 may have ions with the second polarity and be formed on the upper surface of the electrode layer 370. The doped layer 390 according to an embodiment may not be formed by further depositing or disposing a separate material on the formed semiconductor layer or electrode layer, and may be formed by further doping a material forming the semiconductor layer or the electrode layer with ions. In the light emitting element 300 of FIGS. 6 and 7, the doped layer 390 may be formed by doping a portion of the electrode layer 370 with the ions having the second polarity. For example, the doped layer 390 and the electrode layer 370 may include substantially a same material. However, the disclosure is not limited thereto, and the doped layer 390 may be a layer separate from the semiconductor layer or the electrode layer and may also include a layer doped with ions having a polarity.

A position of the doped layer 390 formed on the basis of the active layer 360 may be changed depending on the polarity of the ions. In case that the doped layer 390 has the ions with the first polarity, the doped layer 390 may be formed on the first surface of the active layer 360 facing the first semiconductor layer 310, and in case that the doped layer 390 has the ions with the second polarity, the doped layer 390 may be formed on the second surface of the active layer 360 facing the second semiconductor layer 320. However, the disclosure is not limited thereto. In some embodiments, a thickness of the doped layer 390 may be in a range of about 10 nm to about 100 nm. However, the disclosure is not limited thereto.

As described above, the light emitting element 300 includes the first semiconductor layer 310, which is the n-type semiconductor having the first polarity, and the second semiconductor layer 320, which is the p-type semiconductor having the second polarity, on the basis of the active layer 360. A dipole moment may be formed between the first semiconductor layer 310 and the second semiconductor layer 320 having different polarities, and in case that the light emitting element 300 is placed in an electric field, the light emitting element 300 may receive an electrical force by the dipole moment. The light emitting element 300 according to an embodiment further includes the doped layer 390 including the ions with the first polarity or the second polarity, such that the dipole moment formed between the first semiconductor layer 310 and the second semiconductor layer 320 may be increased. Such a doped layer 390 may increase the electrical force that the light emitting element 300 receives by the electric field generated on the first and second electrodes 210 and 220 in case that the light emitting element 300 is disposed between the first electrode 210 and the second electrode 220.

Figure 8:
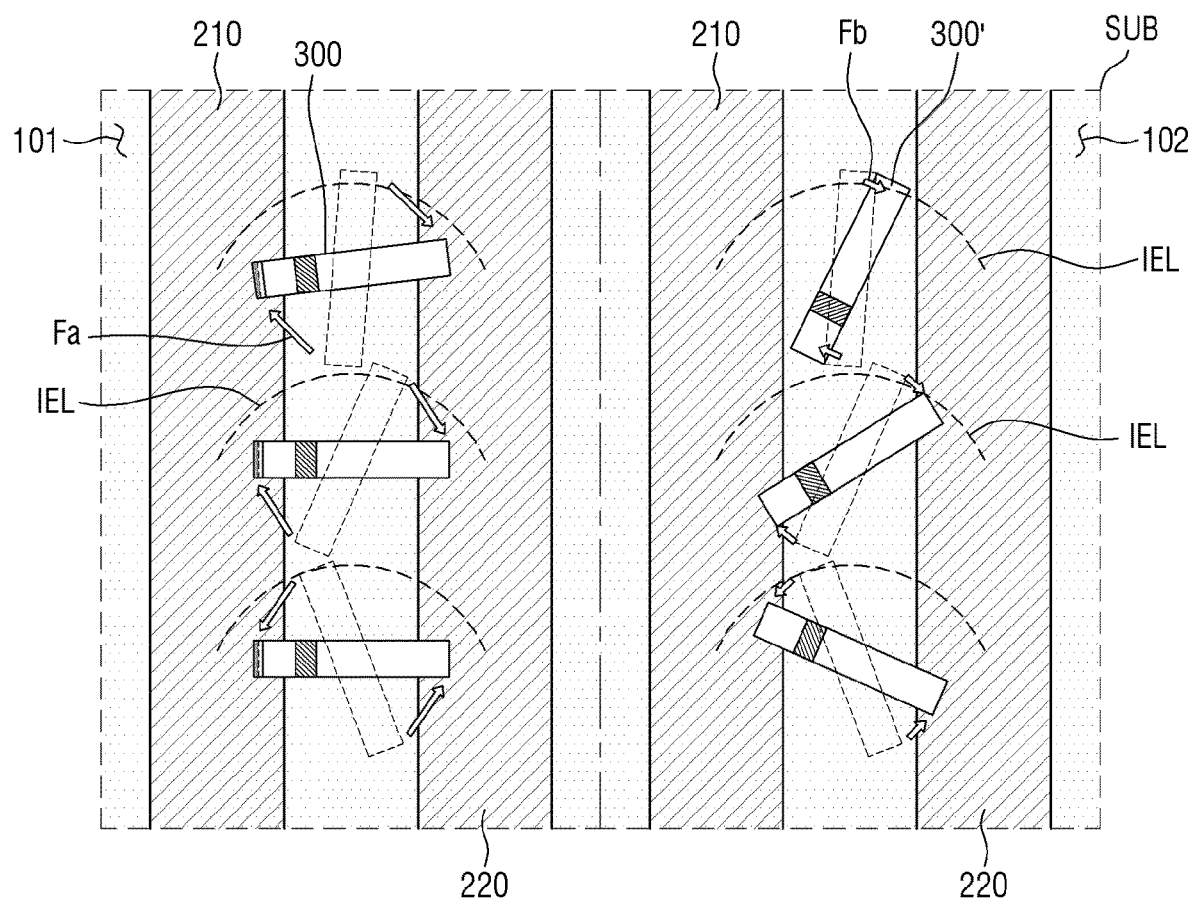
FIG. 8 is a schematic view illustrating a process of aligning the light emitting element according to an embodiment.

FIG. 8 is a schematic view illustrating a process of aligning the light emitting element according to an embodiment.

FIG. 8 schematically illustrates that the light emitting elements 300 are aligned on the first electrode 210 and the second electrode 220 disposed on a target substrate SUB. Referring to FIG. 8, a first area 101 and a second area 102 may be defined on the target substrate SUB, and the first electrode 210 and the second electrode 220 extending in a direction may be disposed in each of the first area 101 and the second area 102. The light emitting elements 300 that include the doped layer 390 according to an embodiment may be disposed on the first electrode 210 and the second electrode 220 of the first area 101, and light emitting elements 300' that do not include the doped layer 390 may be disposed in the second area 102.

Although not illustrated in FIG. 8, an ink may be jetted onto the first electrode 210 and the second electrode 220 in a state in which the light emitting element 300 are dispersed in the ink during the processes of manufacturing the display device 10. In case that the ink in which the light emitting elements 300 are dispersed is jetted, electrical signals may be applied to the first electrode 210 and the second electrode 220 to generate an electric field IEL on the first electrode 210 and the second electrode 220. The electric field IEL may transfer a dielectrophoretic force to the light emitting elements 300 dispersed in the ink, and the light emitting elements 300 are disposed between the first electrode 210 and the second electrode 220 while orientation directions and positions thereof are changed, by receiving the dielectrophoretic force.

The light emitting elements 300 disposed between the respective electrodes 210 and 220 in the first area 101 may include the doped layer 390, and the light emitting elements 300' disposed between the respective electrodes 210 and 220 in the second area 102 may not include the doped layer 390. The light emitting element 300 in the first area 101 may have a greater dipole moment than that of the light emitting element 300' in the second area 102, and a first force Fa that the light emitting element 300 in the first area 101 receives by the electric field IEL may be greater than a second force Fb that the light emitting element 300 in the second area 102 receives by the electric field IEL.

Accordingly, the light emitting elements 300 disposed between the respective electrodes 210 and 220 in the first area 101 may be aligned with a higher degree of alignment than the light emitting elements 300' in the second area 102. The light emitting elements 300 in the first area 101 may be oriented so that an angle (or intersection angle) between a direction in which the light emitting elements 300 extend and a direction in which the respective electrodes 210 and 220 extend is a substantially perpendicular angle, and positions at which the light emitting elements 300 are disposed between the respective electrodes 210 and 220, may be uniform. Positions at which both ends of each of the light emitting elements 300 are placed on each of the electrodes 210 and 220, may be substantially the same as each other.

On the other hand, the light emitting elements 300' disposed between the respective electrodes 210 and 220 in the second area 102 may have a lower degree of alignment than the light emitting elements 300 in the first area 101. The light emitting elements 300' receiving the second force Fb having a relatively small magnitude may be oriented so that an angle between a direction in which the light emitting elements 300' extend and a direction in which the respective electrodes 210 and 220 extend has a large error, and positions at which the light emitting elements 300' are disposed between the respective electrodes 210 and 220, may not be uniform. The light emitting elements 300 according to an embodiment include the doped layer 390, such that the dipole moment may increase and the dielectrophoretic force transferred by the electric field IEL may increase, and thus, a degree of alignment may be improved. The display device 10 includes the light emitting elements 300 aligned with a high degree of alignment, such that emission failures of the light emitting elements 300 may be minimized and emission reliability of the respective pixels PX or sub-pixels PXn may be improved.

The doped layer 390 may be formed by doping a specific semiconductor layer with ions by using a laser or the like during the processes of manufacturing the light emitting element 300. However, the disclosure is not limited thereto. Even though the ions are not necessarily doped by an external process, the doped layer 390 may be formed by increasing an ion concentration in a specific region through adjustment of composition ratios of materials forming semiconductor layers when forming the respective semiconductor layers. A description therefor will be provided below.

The light emitting element 300 may have a length h of about 1 μm to about 10 μm or about 2 μm to about 6 μm, and preferably about 3 μm to about 5 μm. A diameter of the light emitting element 300 may be in a range of about 300 nm to about 700 nm, and an aspect ratio of the light emitting element 300 may be about 1.2 to about 100. However, the disclosure is not limited thereto, and the light emitting elements 300 included in the display device 10 may also have different diameters according to a difference in composition between the active layers 360. The diameter of the light emitting element 300 may be about 500 nm.

Figure 9:
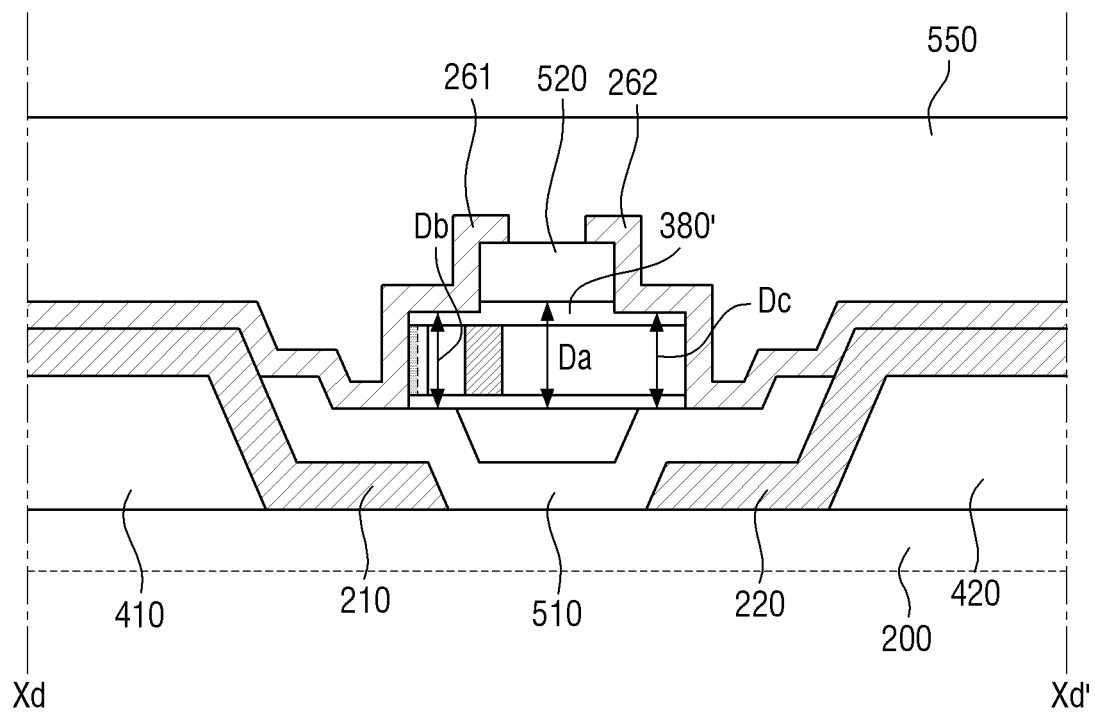
FIG. 9 is a schematic cross-sectional view taken along line Xd-Xd' of FIG. 3.
Figure 10:
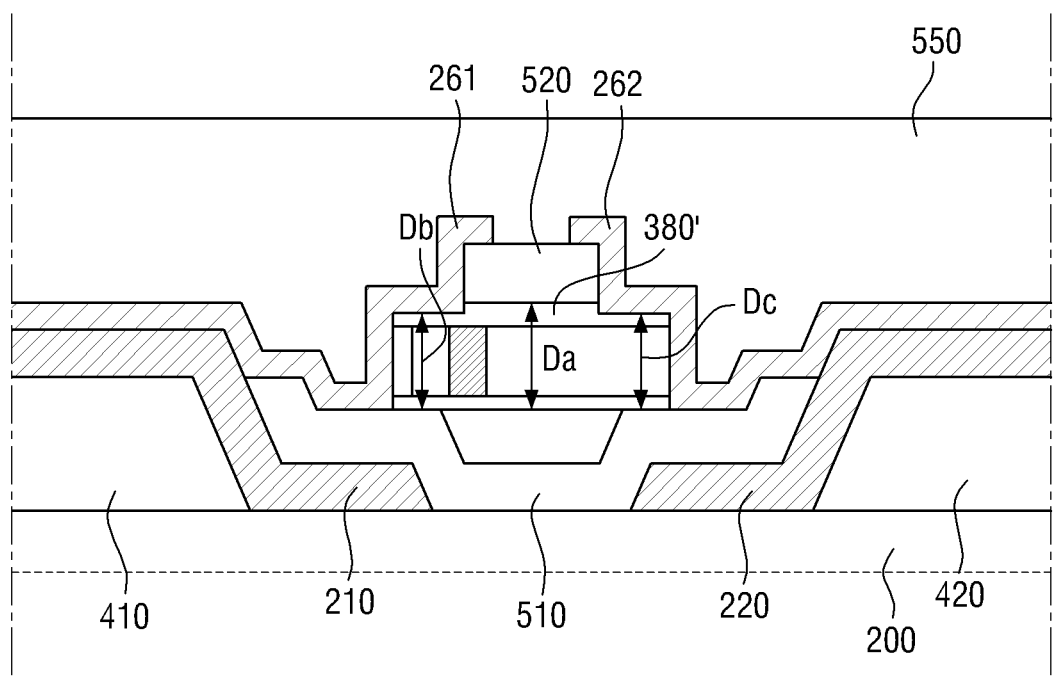
FIG. 10 is a schematic cross-sectional view taken along line Xe-Xe' of FIG. 3.

FIG. 9 is a schematic cross-sectional view taken along line Xd-Xd' of FIG. 3. FIG. 10 is a schematic cross-sectional view taken along line Xe-Xe' of FIG. 3. FIG. 9 is a cross section intersecting both ends of a second light emitting element 302 of the display device 10, and FIG. 10 is a cross section intersecting both ends of a third light emitting element 303.

Referring to FIGS. 9 and 10 in conjunction with FIGS. 4 and 6, the display device 10 according to an embodiment may include the light emitting elements 300, and the light emitting elements 300 may include a first light emitting element 301, a second light emitting element 302, and a third light emitting element 303.

First, as illustrated in FIG. 4, the first light emitting element 301 may include a first semiconductor layer 310, a second semiconductor layer 320, an active layer 360, an electrode layer 370, and a doped layer 390, and may further include an insulating film 380 surrounding the first semiconductor layer 310, the second semiconductor layer 320, the active layer 360, the electrode layer 370, and the doped layer 390. The doped layer 390 may be disposed on an upper surface of the electrode layer 370 at a first end portion of the first light emitting element 301, and an upper surface of the doped layer 390 may contact the first contact electrode 261. The first semiconductor layer 310 may be disposed at a second end portion of the first light emitting element 301, and a lower surface of the first semiconductor layer 310 may contact the second contact electrode 262.

The insulating film 380 of the first light emitting element 301 may have a smooth outer surface thereof extending in a direction, which is a direction in which the semiconductor layers of the light emitting element 300 are disposed. In a process of forming the second insulating layer 520 disposed on the first light emitting element 301, the insulating film 380 of the first light emitting element 301 may not be damaged and may have a uniform thickness according to positions of the semiconductor layers surrounded by the insulating film 380. For example, the first light emitting element 301 may have substantially a same diameter at a central portion thereof overlapping the second insulating layer 520 and at the first end portion and the second end portion thereof at which the second insulating layer 520 is not disposed and which are exposed.

On the other hand, as illustrated in FIG. 9, the display device 10 according to an embodiment may include a second light emitting element 302 in which at least a portion of an insulating film 380' has a thickness different from that of other portions of the insulating film 380'. In the process of forming the second insulating layer 520, the insulating film 380', positioned at a first end portion and a second end portion of the second light emitting element 302 at which the second insulating layer 520 is not disposed and which are exposed, may be partially etched. Accordingly, the insulating film 380' of the second light emitting element 302 may have a greater thickness in a partial region thereof, for example, a portion thereof contacting the second insulating layer 520 than other portions thereof. In an embodiment, a first diameter Db of the second light emitting element 302 at a first end portion thereof and a second diameter Dc of the second light emitting element 302 at a second end portion thereof may be smaller than a third diameter Da of the second light emitting element 302 between the first end portion and the second end portion. The insulating film 380' of the second light emitting element 302 is etched at the first end portion and the second end portion thereof exposed by the second insulating layer 520, and thus, the insulating film 380' positioned under the second light emitting element 320 in a cross-sectional view may not be etched. For example, the insulating film 380' contacting the first insulating layer 510 disposed under the second light emitting element 302 may not be etched.

The display device 10 according to an embodiment may further include a third light emitting element 303 in which the doped layer 390 is removed. As illustrated in FIG. 10, in the third light emitting element 303, the doped layer 390 formed on the upper surface of the electrode layer 370 may be removed. Similar to the second light emitting element 302, in the third light emitting element 303, the doped layer 390 may be simultaneously removed while the insulating film 380' is partially etched in a process of etching the second insulating layer 520. The light emitting elements 300 may be disposed with a high degree of alignment between the first electrode 210 and the second electrode 220 by including the doped layer 390, and the doped layers 390 of some of the light emitting elements 300 are removed in a subsequent process, such that the third light emitting elements 303 may be formed. In this case, an electrode layer 370 of a first end portion of the third light emitting element 303 may contact the first contact electrode 261. However, the disclosure is not limited thereto.

Hereinafter, processes of manufacturing the light emitting element 300 according to an embodiment will be described.

FIGS. 11 to 18 are schematic cross-sectional views illustrating processes of manufacturing the light emitting element according to an embodiment.

Figure 11:
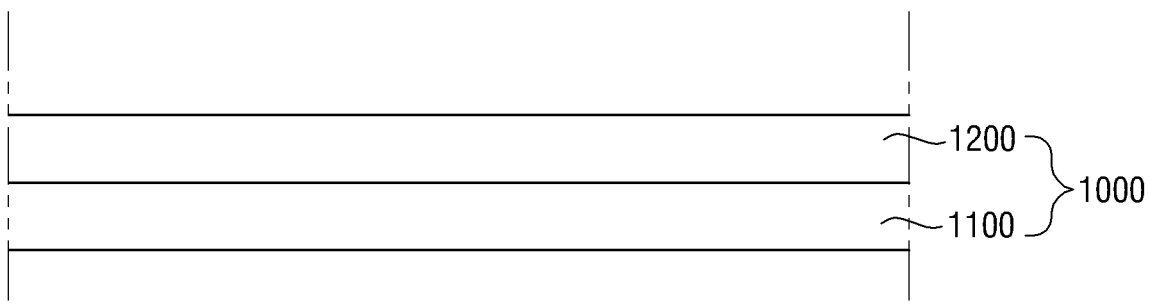
FIGS. 11 to 18 are schematic cross-sectional views illustrating processes of manufacturing the light emitting element according to an embodiment.

First, referring to FIG. 11, a lower substrate 1000 including a base substrate 1100 and a buffer material layer 1200 formed on the base substrate 1100 is prepared. The base substrate 1100 may include a sapphire ($Al_2O_3$) substrate and a transparent substrate such as a glass substrate. However, the disclosure is not limited thereto, and the base substrate 1100 may also be formed as a conductive substrate made of GaN, SiC, ZnO, Si, GaP, GaAs, and the like. Hereinafter, a case where the base substrate 1100 is a sapphire ($Al_2O_3$) substrate will be described by way of example. A thickness of the base substrate 1100 is not particularly limited, but the base substrate 1100 may have a thickness in a range of about 400 μm to about 1500 μm as an example.

Semiconductor layers are formed on the base substrate 1100. The semiconductor layers grown by an epitaxial method may be formed by growing a seed crystal. A method of forming the semiconductor layers may be electron beam deposition, physical vapor deposition (PVD), chemical vapor deposition (CVD), plasma laser deposition (PLD), dual-type thermal evaporation, sputtering, metal organic chemical vapor deposition (MOCVD), or the like, and preferably, metal-organic chemical vapor deposition (MOCVD). However, the disclosure is not limited thereto.

A precursor material for forming the semiconductor layers is not particularly limited as long as a material for forming the precursor material may be generally selected. As an example, the precursor material may be a metal precursor including an alkyl group such as a methyl group or an ethyl group. For example, the precursor material may be a compound such as trimethyl gallium ($Ga(CH_3)_3$), trimethyl aluminum ($Al(CH_3)_3$), or triethyl phosphate ($(C_2H_5)_3PO_4$), but is not limited thereto. Hereinafter, a description for a method, a process condition, or the like for forming the semiconductor layers will be omitted, and a sequence of a method of manufacturing the light emitting element 300 or a stacked structure of the light emitting element 300 will be described in detail.

The buffer material layer 1200 is formed on the base substrate 1100. FIG. 11 illustrates that a buffer material layer 1200 is stacked, but the disclosure is not limited thereto, and buffer material layers may also be formed. The buffer material layer 1200 may be disposed in order to reduce a difference in lattice constant between a first semiconductor 3100 and the base substrate 1100.

For example, the buffer material layer 1200 may include an undoped semiconductor and the buffer layer 1200 and the first semiconductor 3100 may include a substantially same material, but the buffer layer 1200 is not doped with an n-type or p-type dopant. In an embodiment, the buffer material layer 1200 may be made of at least one of undoped InAlGaN, GaN, AlGaN, InGaN, AlN, and InN, but is not limited thereto. The buffer material layer 1200 may be omitted according to the base substrate 1100. Hereinafter, the buffer material layer 1200 including an undoped semiconductor is illustrated as being formed on the base substrate 1100 by way of example.

Figure 12:
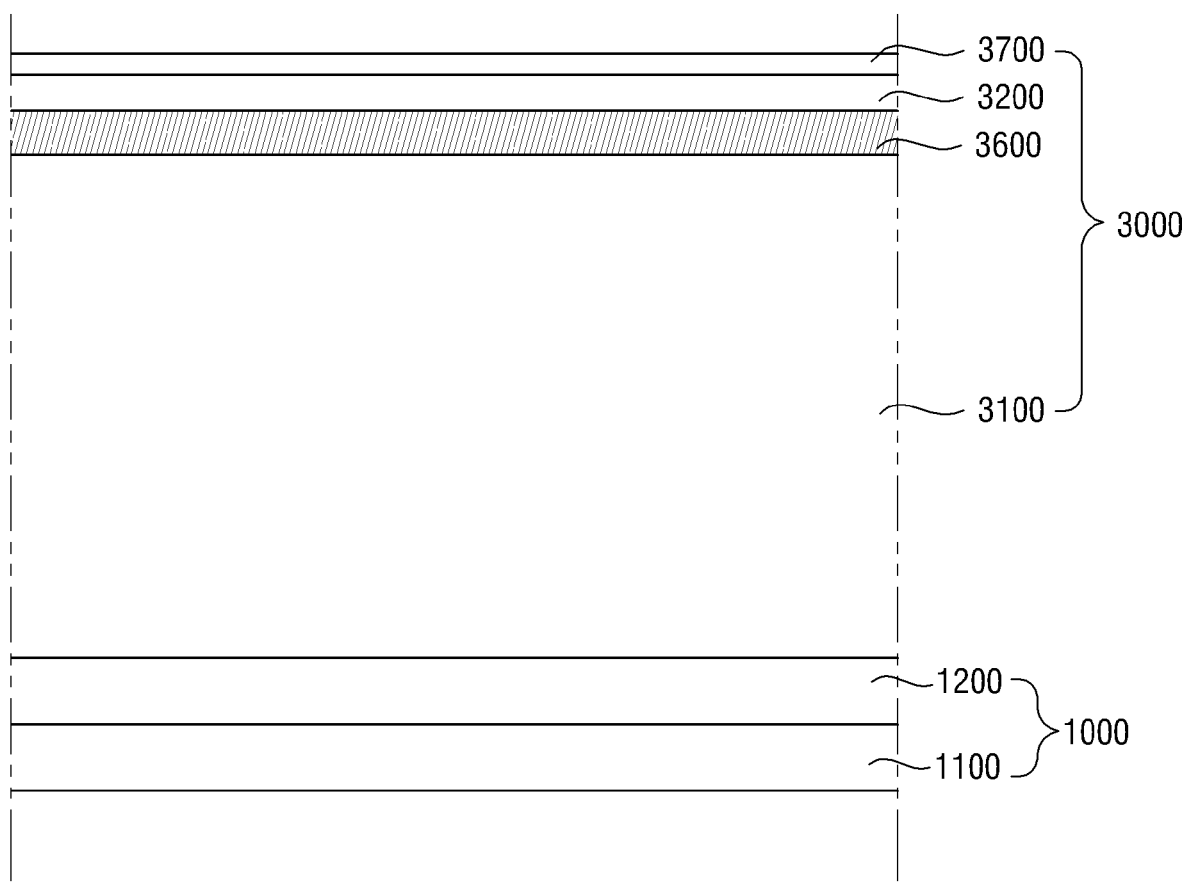

Referring to FIG. 12, a semiconductor structure 3000 is formed on the lower substrate 1000. The semiconductor structure 3000 may include the first semiconductor 3100, an active layer 3600, a second semiconductor 3200, and an electrode material layer 3700. Material layers included in the semiconductor structure 3000 may be formed by performing a general process as described above, and layers included in the semiconductor structure 3000 may correspond to the respective layers included in the light emitting element 300 according to an embodiment. For example, these layers and the first semiconductor layer 310, the active layer 360, the second semiconductor layer 320, and the electrode layer 370 of the light emitting element 300 may include a same material.

Figure 13:
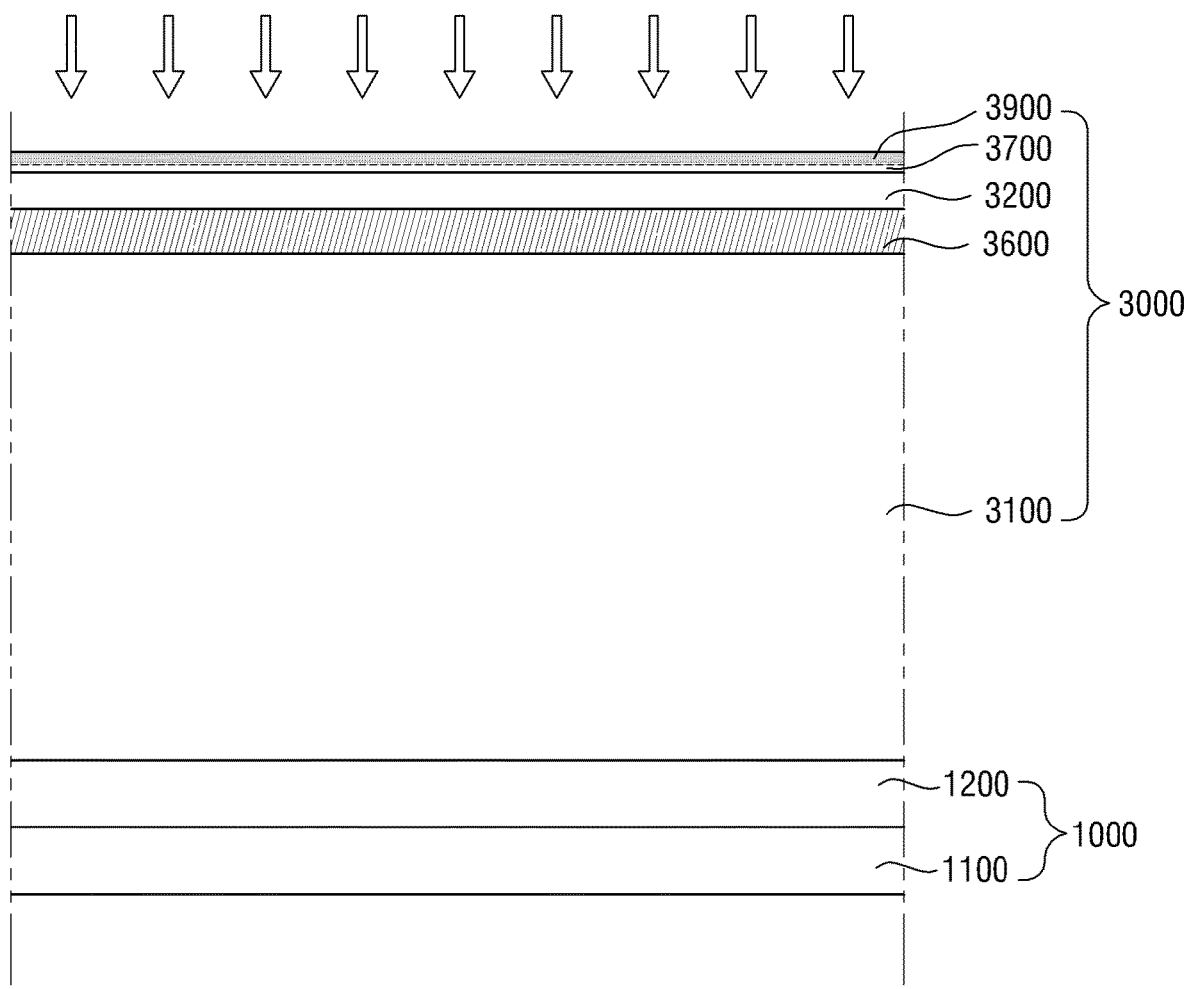

As illustrated in FIG. 13, a doped region 3900 is formed on an upper surface of the electrode material layer 3700 of the semiconductor structure 3000. The doped region 3900 may be formed by irradiating an arbitrary portion of the semiconductor structure 3000 with a laser. FIG. 13 illustrates that the doped region 300 is formed on the upper surface of the electrode material layer 3700, but the disclosure is not limited thereto. As described below with reference to other drawings, in case that the doped layer 390 of the light emitting element 300 is formed on a semiconductor layer other than the electrode layer 370, the doped region 3900 may also be formed in the semiconductor structure 3000. For example, in case that the doped layer 390 of the light emitting element 300 is formed on the first semiconductor layer 310 or the second semiconductor layer 320, the doped region 3900 may be formed by irradiating the first semiconductor 3100 or the second semiconductor 3200 with a laser.

In case that the electrode material layer 3700 is irradiated with a laser, some of materials forming the electrode material layer 3700 react with the laser, such that ions having a polarity may be formed thereon. The electrode material layer 3700 disposed on the second semiconductor 3200, and the second semiconductor 3200 may have a same polarity, and ions having a same polarity may also be formed in the doped region 3900 formed on the electrode material layer 3700, and the second semiconductor 3200. Accordingly, in the finally manufactured light emitting element 300, a polarity of the second semiconductor layer 320 and the electrode layer 370 positioned above the active layer 360 may become large, and a dipole moment of the light emitting element 300 may increase.

A thickness of the doped region 3900 formed on the electrode material layer 3700 of the semiconductor structure 3000 may be greater than a thickness of the doped layer 390 of the light emitting element 300. In a subsequent process, a portion of the doped region 3900 may be etched during a process for forming the insulating film 380. The doped region 3900 may be formed to have a thickness greater than that of the doped layer 390 of the light emitting element 300 to prevent the doped layer 390 from being removed from the finally manufactured light emitting element 300. In some embodiments, a thickness of the doped region 3900 may be in a range of about 50 nm to about 150 nm.

Figure 14:
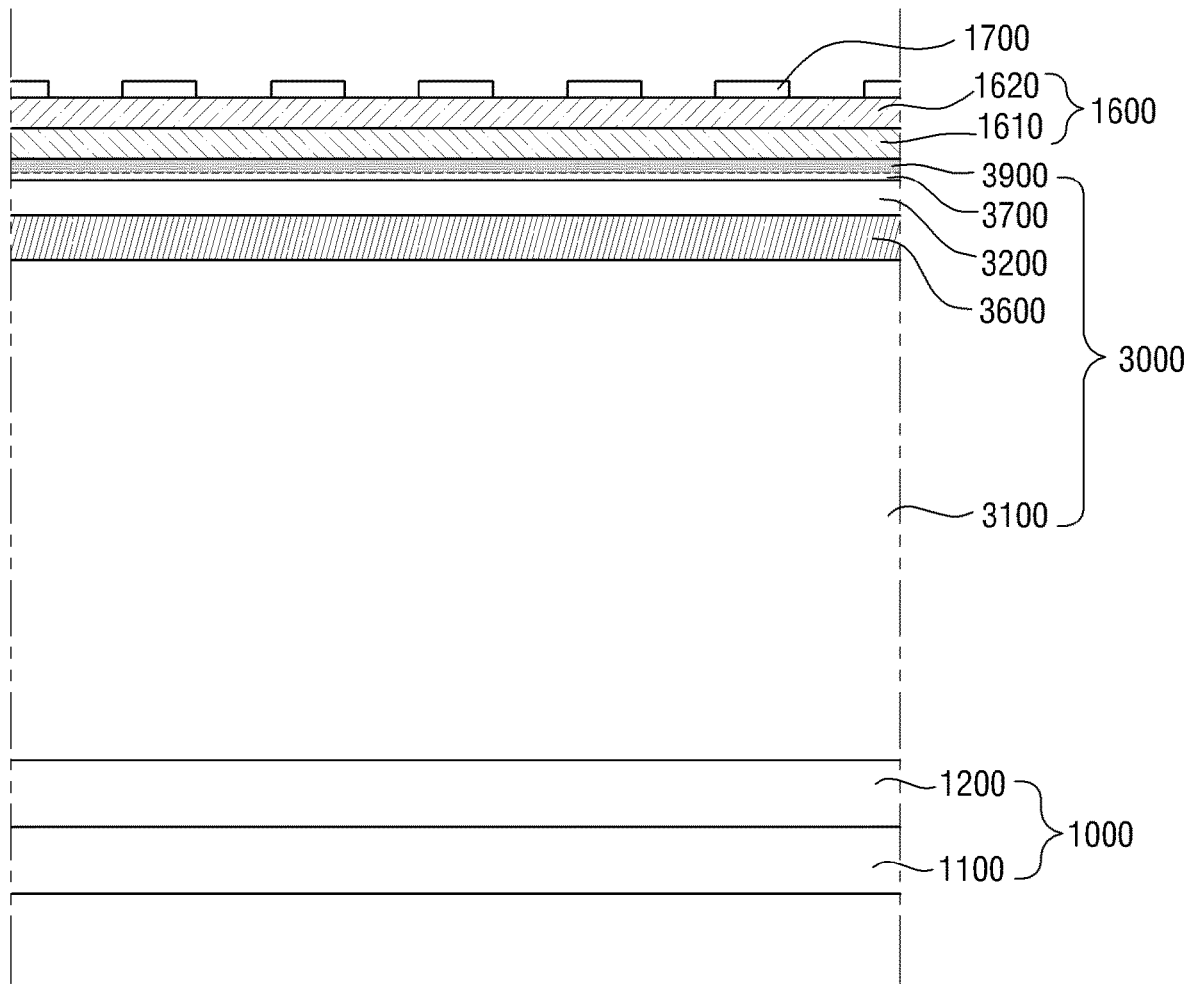
Figure 15:
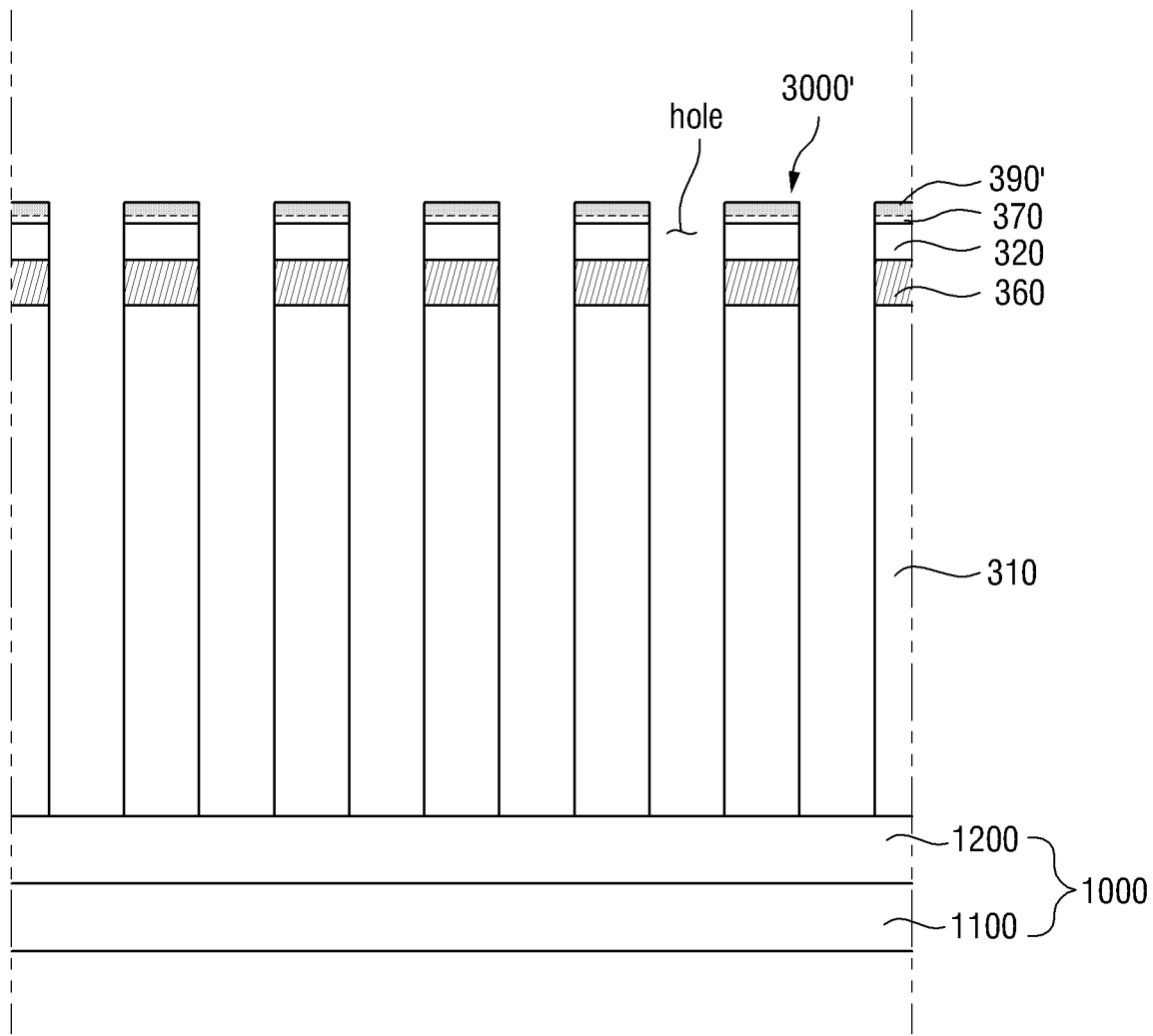

Referring to FIGS. 14 and 15, the semiconductor structure 3000 in which the doped region 3900 is formed is etched to form semiconductor crystals 3000'. A method of forming the semiconductor crystals 3000' includes a step of forming an etching mask layer 1600 and a first pattern layer 1700 on the semiconductor structure 3000 and etching the semiconductor structure 3000 in a direction perpendicular to the lower substrate 1000.

As illustrated in FIG. 14, the etching mask layer 1600 and the first pattern layer 1700 are formed on the semiconductor structure 3000. The etching mask layer 1600 is formed on the doped region 3900, and the first pattern layer 1700 is formed on the etching mask layer 1600. The etching mask layer 1600 may serve as a mask for continuously etching the layers of the semiconductor structure 3000. The etching mask layer 1600 may include a first etching mask layer 1610 including an insulating material and a second etching mask layer 1620 including a metal.

The first etching mask layer 1610 may include oxide or nitride as the insulating material. The insulating material may be, for example, silicon oxide ($SiO_x$), silicon nitride ($SiN_x$), or silicon oxynitride ($SiO_xN_y$). A thickness of the first etching mask layer 1610 may be in a range of about 0.5 µm to about 1.5 µm, but is not limited thereto.

The second etching mask layer 1620 is disposed on the first etching mask layer 1610. As an example, the second etching mask layer 1620 may be a hard mask layer. The second etching mask layer 1620 may include a material capable of serving as a mask for continuous etching of the semiconductor structure 3000, and may include, for example, a metal such as chromium (Cr). A thickness of the second etching mask layer 1620 may be in a range of about 30 nm to about 150 nm, but is not limited thereto.

The first pattern layer 1700 may be disposed on the etching mask layer 1600. The first pattern layer 1700 may include mask patterns spaced apart from each other to serve as a mask for the continuous etching of the semiconductor structure 3000. The first pattern layer 1700 may include a polymer, a polystyrene sphere, a silica sphere, and the like, but is not particularly limited as long as it includes a material capable of forming a pattern.

As an example, in case that the first pattern layer 1700 includes the polymer, a general method capable of forming a pattern by using the polymer may be employed. For example, the first pattern layer 1700 including the polymer may be formed by a method such as photolithography, e-beam lithography, or nanoimprint lithography.

In an embodiment, the first pattern layer 1700 may be formed by nanoimprint lithography. The mask patterns of the first pattern layer 1700 may include a nanoimprint resin. The nanoimprint resin may include a fluorinated monomer, an acrylate monomer, dipentaerythritol hexaacrylate, dipropylene glycol diacrylate, polyethylene glycol phenyletheracrylate, butylated hydroxy toluene (BHT), 1-hydroxy-cyclohexylphenylketone (Irgacure 184), and the like, but are limited thereto.

As illustrated in FIG. 15, the semiconductor crystals 3000' are formed by etching the semiconductor structure 3000 along the first pattern layer 1700. The step of forming the semiconductor crystals 3000' may include a first etching step of etching the etching mask layer 1600 and the electrode material layer 3700 in a direction perpendicular to the lower substrate 1000 in regions where the mask patterns of the first pattern layer 1700 are spaced apart from each other, a second etching step of performing etching a portion from the second semiconductor 3200 to the first semiconductor 3100, and a step of removing the first pattern layer 1700 and the etching mask layer 1600.

A process of etching the semiconductor structure 3000 may be performed by a general method. For example, an etching process may be a dry etching method, a wet etching method, a reactive ion etching (RIE) method, an inductively coupled plasma reactive ion etching (ICP-RIE) method, or the like. In a case of the dry etching, anisotropic etching is possible, and the dry etching may thus be suitable for vertical etching. In case that the above-described etching method is used, an etchant may be $Cl_2$, $O_2$, or the like. However, the disclosure is not limited thereto.

In some embodiments, the etching of the semiconductor structure 3000 may be performed using both the dry etching method and the wet etching method. For example, after etching is performed in a depth direction by the dry etching method, an etched sidewall may be placed on a plane perpendicular to a surface by the wet etching method, which is an isotropic etching method.

The step of removing the etching mask layer 1600 or the first pattern layer 1700 may be performed by a general process that may be, for example, reactive ion etching (RIE), inductively coupled plasma reactive ion etching (ICP-RIE), or the like. However, the disclosure is not limited thereto.

The semiconductor crystal 3000' formed by the above-described process may include the first semiconductor layer 310, the active layer 360, the second semiconductor layer 320, and the electrode layer 370 of the light emitting element 300 according to an embodiment. The doped layer 390 may be formed by partially further etching the doped region 390 in a subsequent process.

Element rods ROD including insulating films 380 partially surrounding outer surfaces of the semiconductor crystals 3000' are formed.

Figure 16:
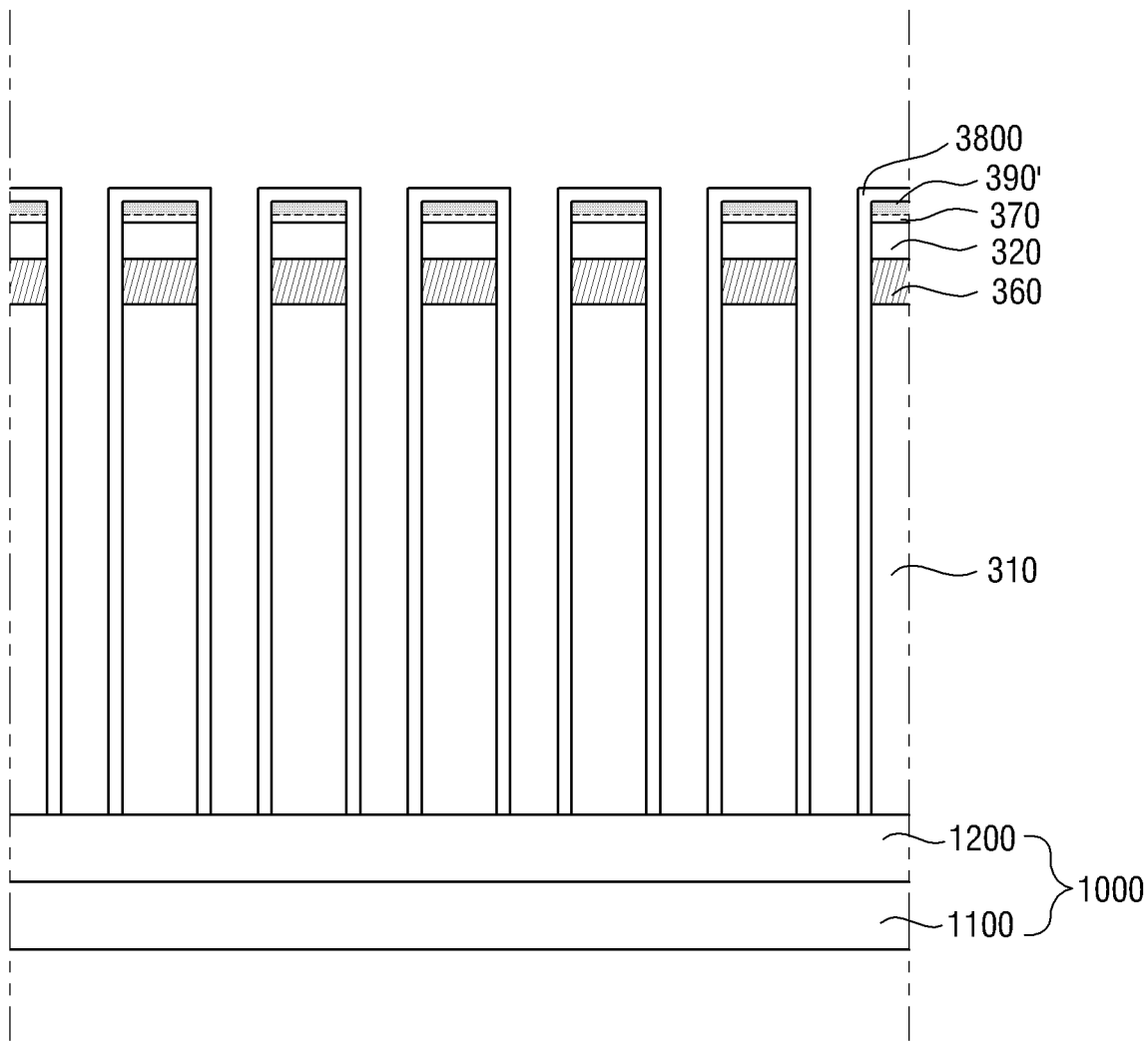
Figure 17:
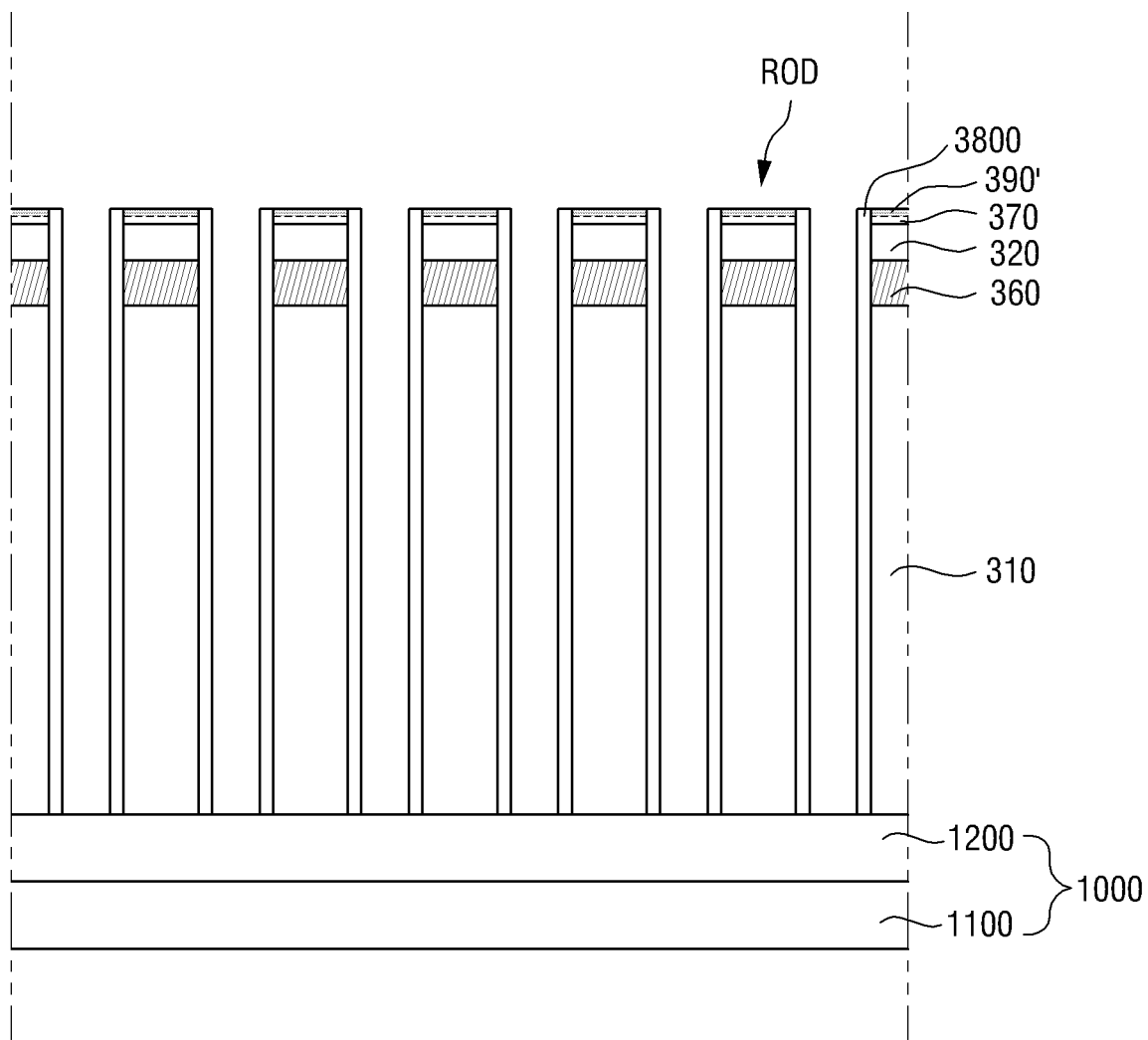

Referring to FIGS. 16 and 17, the insulating films 380 may be formed by forming insulation coatings 3800 surrounding the outer surfaces of the semiconductor crystals 3000' and then partially removing the insulation coatings 3800 so that doped regions 390' are exposed. Since the insulation coating 3800 is formed on the outer surface of the semiconductor crystal 3000' including the electrode layer 370 and the doped region 390', the insulating film 380 of the light emitting element 300 may also be formed on outer surfaces of the electrode layer 370 and the doped layer 390.

The insulation coating 3800 is an insulating material formed on the outer surface of the semiconductor crystal 3000', and may be formed by a method of applying an insulating material on the outer surface of the vertically etched semiconductor crystal 3000' or immersing the outer surface of the vertically etched semiconductor crystal 3000' in an insulating material. However, the disclosure is not limited thereto. As an example, the insulation coating 3800 may be formed by atomic layer deposition (ALD).

The insulation coatings 3800 may also be formed on side surfaces and upper surfaces of the semiconductor crystals 3000' and on the lower substrate 1000 exposed in regions where the semiconductor crystals 3000' are spaced apart from each other. Upper portions of the insulation coatings 3800 may be partially removed to expose upper surfaces of the doped regions 390'. In a process of partially removing the insulation coatings 3800, a process such as dry etching or etch-back, which is anisotropic etching, may be performed. In the drawings, upper surfaces of the insulation coatings 3800 are removed to expose the doped regions 390', and in this process, the doped regions 390' are partially removed, such that the doped layers 390 may be formed. For example, a thickness of the doped layer 390 of the light emitting element 300 finally manufactured may be smaller than a thickness of the doped region 390' formed during the processes of manufacturing the light emitting element 300. However, the disclosure is not limited thereto.

FIG. 17 illustrates that upper surfaces of the doped layers 390 are exposed and upper surfaces of the insulating films 380 are flat, but the disclosure is not limited thereto. In some embodiments, the insulating films 380 may be formed so that outer surfaces thereof are partially curved in portions thereof surrounding the electrode layers 370. In the process of partially removing the insulation coatings 3800, not only the upper surfaces of the insulation coatings 3800 but also side surfaces of the insulation coatings 3800 are partially removed, such that the insulating films 380 surrounding the layers may be formed in a state in which end surfaces thereof are partially etched. The upper surfaces of the insulation coatings 3800 are removed, such that the insulating films 380 may be formed in a state in which outer surfaces of the insulating films 380 adjacent to the electrode layers 370 in the light emitting elements 300 are partially removed.

Figure 18:
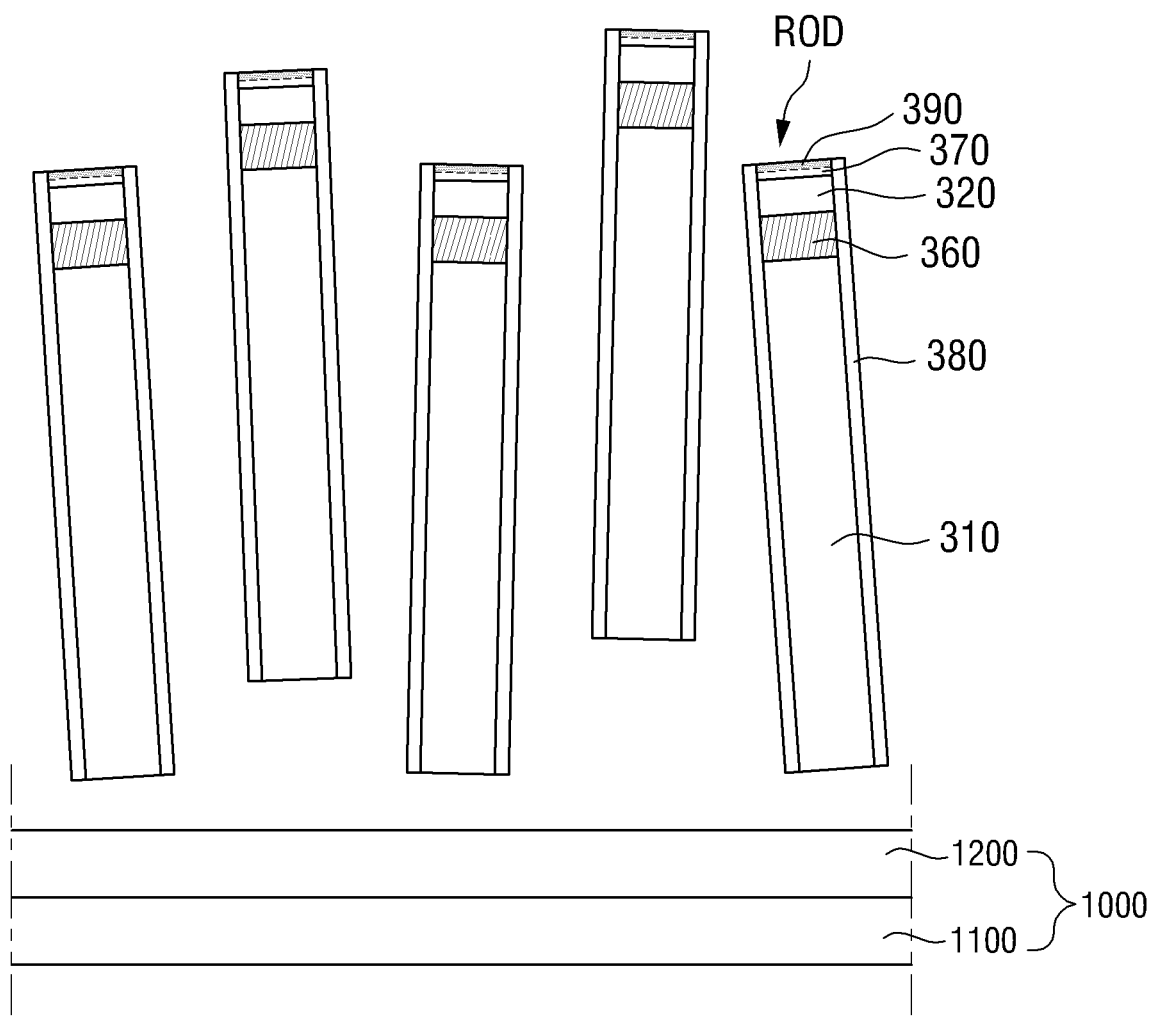

As illustrated in FIG. 18, the light emitting elements 300 are formed by separating the element rods ROD in which the insulating films 380 are formed from the lower substrate 1000.

The light emitting element 300 according to an embodiment may be manufactured by the processes described above. A method of manufacturing the light emitting element 300 may include a step of forming the doped region 3900 in a portion of the semiconductor structure 3000, and the finally manufactured light emitting element 300 may include the doped layer 390. The doped layer 390 may form electric charge-rich portions in portions of the layers forming the light emitting element 300. Accordingly, an electric force transferred by an electric field during the processes of manufacturing the display device 10 may be more strongly transferred to the light emitting element 300, and alignment reactivity of the light emitting element 300 may be improved. The display device 10 includes the light emitting elements 300 aligned with a high degree of alignment, such that emission failures of the light emitting elements 300 may be minimized and emission reliability of the respective pixels PX and sub-pixels PXn may be improved.

Hereinafter, light emitting elements 300 and display devices 10 according to other embodiments will be described.

Figure 19:
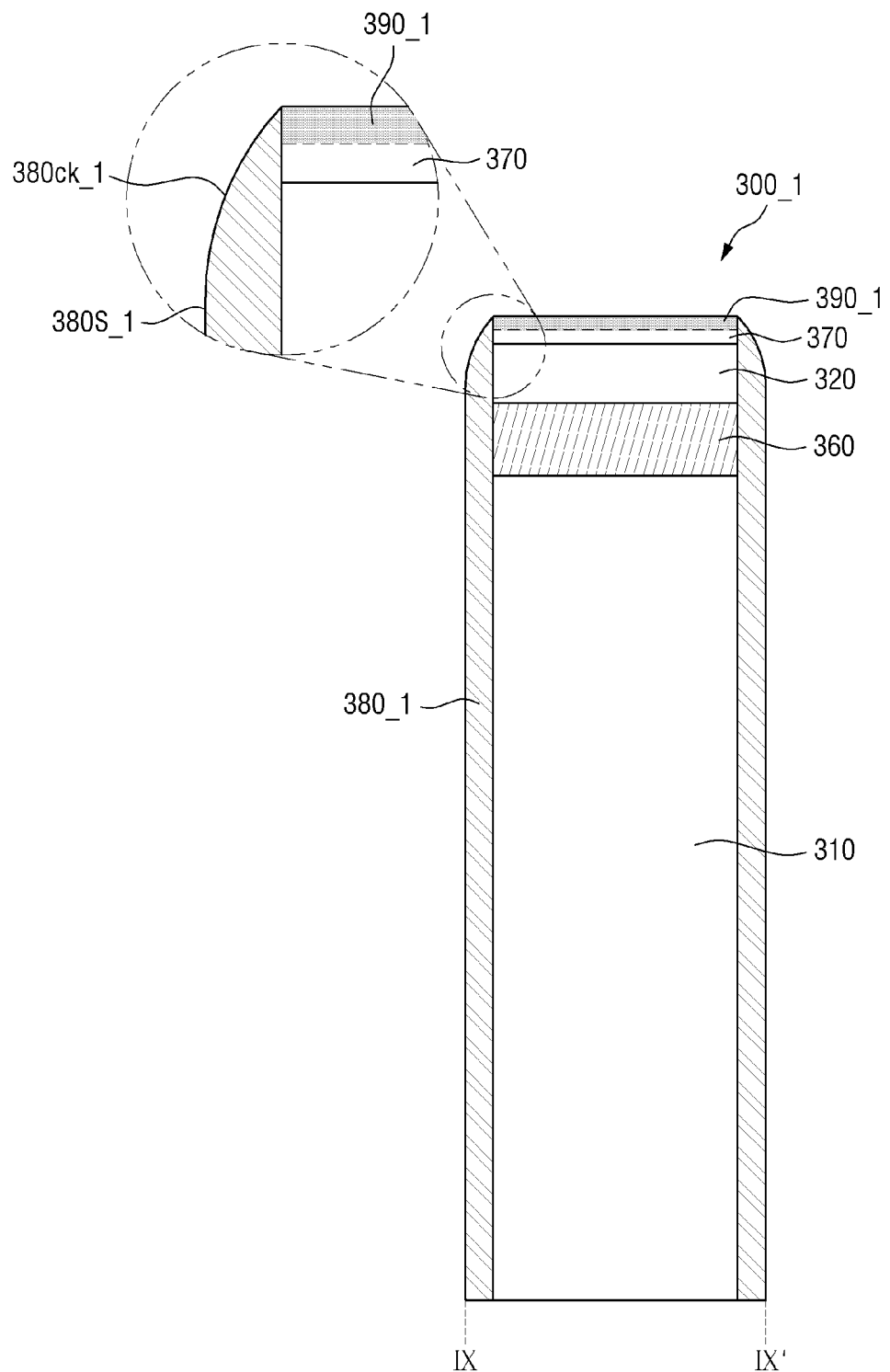
FIG. 19 is a schematic cross-sectional view of a light emitting element according to another embodiment.

FIG. 19 is a schematic cross-sectional view of a light emitting element according to another embodiment.

Referring to FIG. 19, in a light emitting element 300_1 according to an embodiment, an end surface of an insulating film 380_1 may have a partially curved shape. The light emitting element 300_1 of FIG. 19 is different from the light emitting element 300 of FIG. 6 in that the end surface of the insulating film 380_1 has a curved shape. Layouts and structures of the electrode layer 370, the first semiconductor layer 310, and the active layer 360 other than the insulating film 380_1 are the same as those of FIG. 6. Therefore, hereinafter, repetitive descriptions thereof will be omitted and differences from those described above will be mainly described.

According to an embodiment, the insulating film 380_1 may include a first surface 380S_1, which is a portion extending in a direction and surrounding the electrode layer 370 in an outer surface thereof, and a second surface 380ck_1, which is a surface connected (or extended) to the first surface 380S_1 and contacts the electrode layer 370. The second surface 380ck_1 may have a partially curved shape. In the insulating film 380_1, a thickness of a first portion surrounding a side surface of the active layer 360 may be greater than a thickness of a second portion surrounding a side surface of the electrode layer 370 or the doped layer 390_1.

An upper surface of the electrode layer 370 or the doped layer 390_1 is a surface exposed by partially removing the insulation coating 3800 in processes of manufacturing the light emitting element 300_1. The insulating film 380_1 may include the first surface 380S_1 extending in a direction to form an outer surface of the light emitting element 300_1. An outer surface of the first surface 380S_1 may be curved or flat depending on a shape of the light emitting element 300_1, but may be flat in a cross-sectional view as illustrated in FIG. 19. A side surface of the insulation coating 3800 may be partially etched in a process of performing etching to expose the upper surface of the doped layer 390_1 among the processes of manufacturing the light emitting element 300. The light emitting element 300 formed by such processes may include the second surface 380ck_1 that is etched and partially curved. A process of removing the insulation coating 3800 may be performed by a method of etching the insulation coating 3800 in a direction perpendicular to the lower substrate 1000. Accordingly, the insulating film 380_1 of the light emitting element 300 may be formed in a state in which at least one end surface thereof is partially removed by a process of partially removing the insulation coating 3800. However, the disclosure is not limited thereto.

Figure 20:
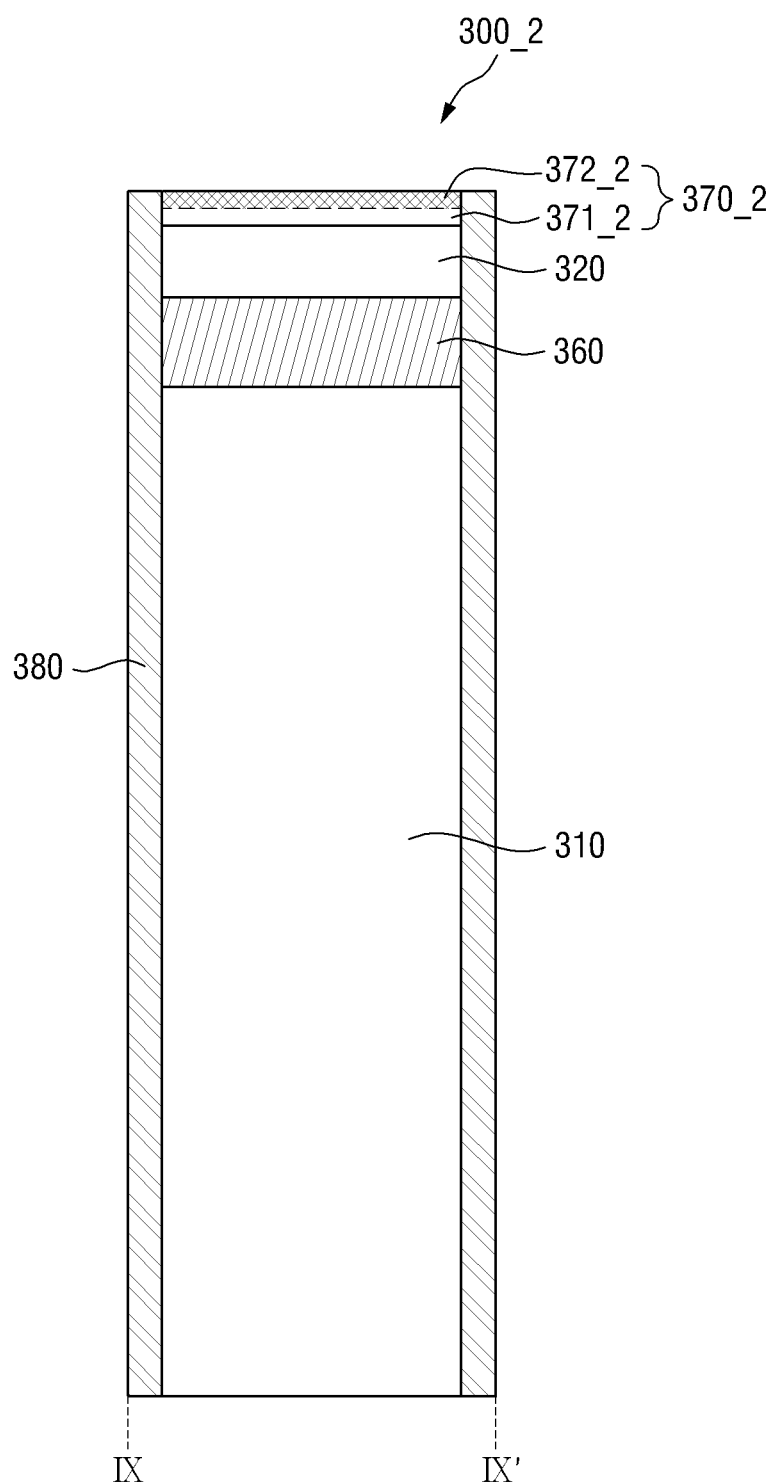
FIG. 20 is a schematic cross-sectional view of a light emitting element according to still another embodiment.

FIG. 20 is a schematic cross-sectional view of a light emitting element according to still another embodiment.

Referring to FIG. 20, in a light emitting element 300_2 according to an embodiment, an electrode layer 370_2 may include layers, which may have different composition ratios, respectively. The electrode layer 370_2 of FIG. 20 may include a first layer 371_2 and a second layer 372_2, and the second layer 372_2 may have a higher concentration of polarity than the first layer 371_2. For example, the second layer 3722 may function as the doped layer 390 of the light emitting element 300.

A process of forming the electrode material layer 3700 among the processes of manufacturing the light emitting element 300 may be performed by a general sputtering method or atomic layer deposition method. As illustrated in FIG. 12, in case that the electrode material layer 3700 is formed as a layer and formed by a process, materials forming the electrode material layer 3700 may be distributed within a layer at a relatively uniform concentration. Thereafter, the doped region 3900 may be formed by a process of irradiating the electrode material layer 3700 with a laser.

On the other hand, in case that the electrode layer 370_2 includes layers 371_2 and 3722 as in the light emitting element 300_2 of FIG. 20, the electrode material layer 3700 may be formed by performing different processes to have layers. The layers of the electrode material layer 3700 may have different composition ratios, and a difference in concentration between ions or electric charges may occur between the layers. In the finally manufactured light emitting element 300_2, the electrode layer 3702 may include the second layer 372_2 having a higher concentration of ions than the first layer 371_2. The light emitting element 300_2 of FIG. 20 may include the second layer 372_2 functioning as the doped layer 390 by adjusting a composition ratio according to a position of the electrode layer 3702 even though it does not include a separate doped layer 390.

Figure 21:
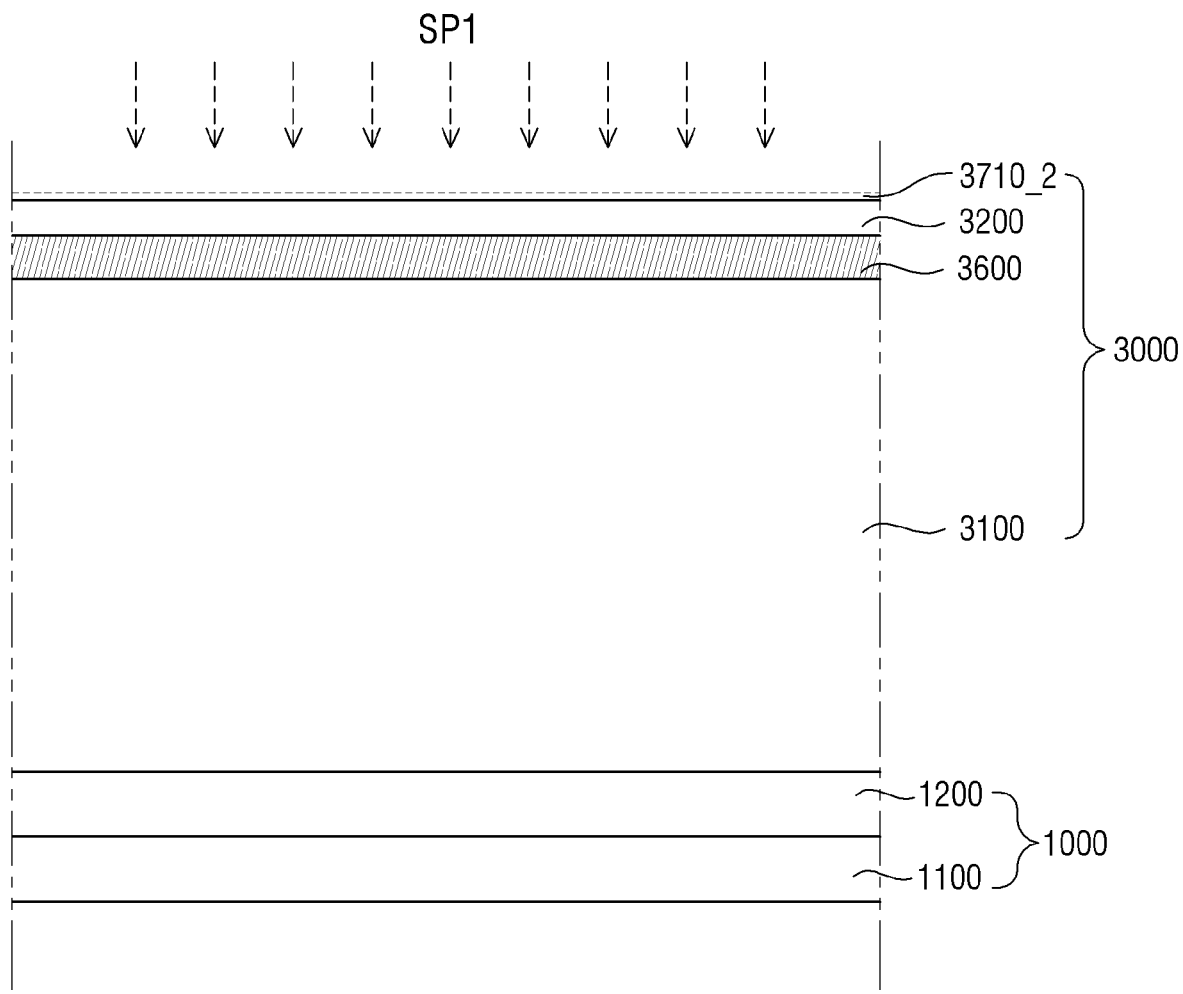
FIGS. 21 and 22 are schematic cross-sectional views illustrating some of processes of manufacturing the light emitting element of FIG. 20.
Figure 22:
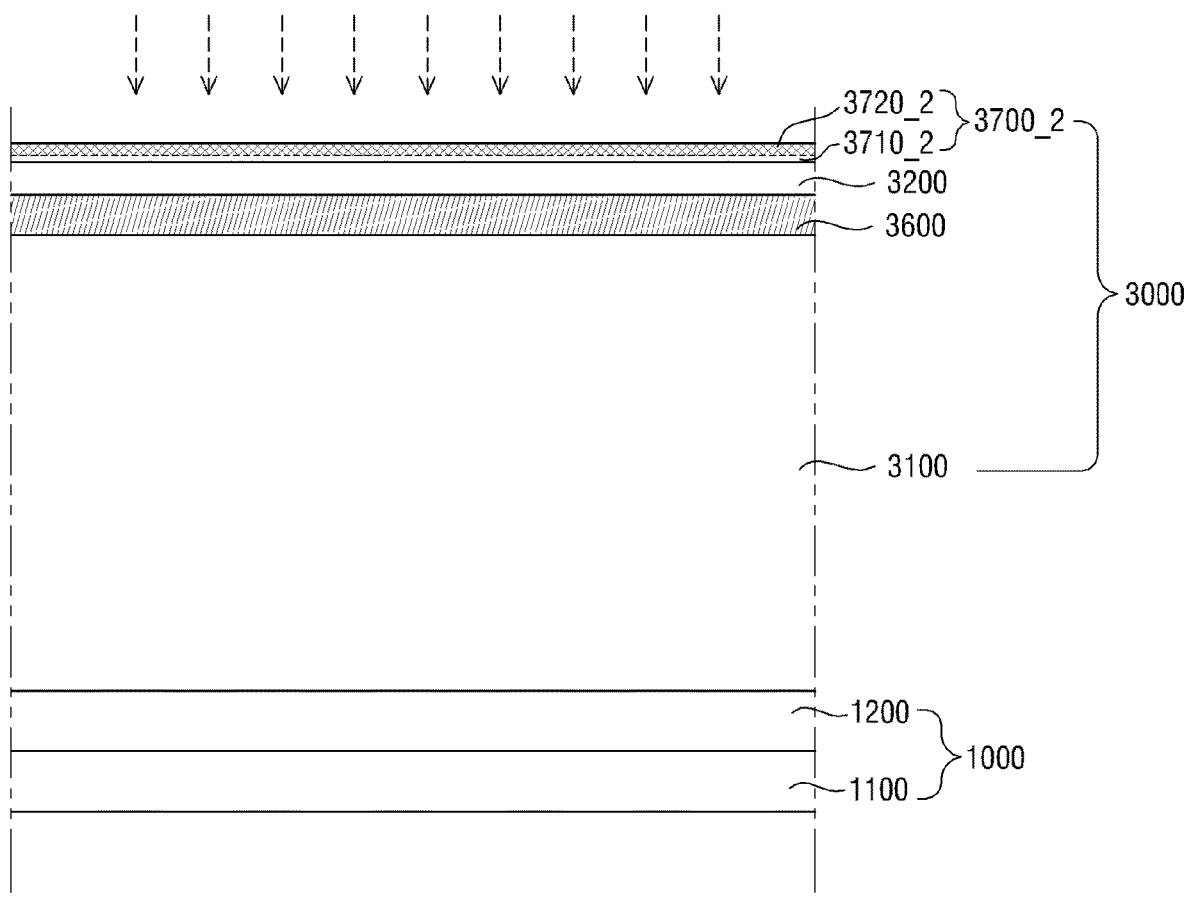

FIGS. 21 and 22 are schematic cross-sectional views illustrating some of processes of manufacturing the light emitting element of FIG. 20.

Referring to FIGS. 21 and 22, a process of forming an electrode material layer 3700_2 may include a first deposition process SP1 of forming a first layer 3710_2 and a second deposition process SP2 of forming a second layer 3720_2. A concentration of ions having any polarity may be lower in the first layer 3710_2 formed by the first deposition process SP1 than in the second layer 3720_2 formed by the second deposition process SP2. In some embodiments, in case that the electrode layer 370_2 includes indium-tin oxide (ITO), a region in which a concentration of ions is partially high may be formed by adjusting contents of indium (In) and tin (Sn). According to an embodiment, contents of indium (In) in the first layer 371_2 and the second layer 372_2 of the electrode layer 3702 may be different from each other, and a content of indium (In) in the second layer 372_2 may be higher than that of indium (In) in the first layer 371_2. The second layer 3722 may include a higher content of indium (In) than the first layer 371_2 to partially have ions or electric charges, and function as the doped layer 390 of the light emitting element 300_2. A concentration of indium precursors may be higher in the second deposition process SP2 of forming the second layer 3720_2 than in the first deposition process SP1 of forming the first layer 3710_2, among the processes of manufacturing the light emitting element 300_2. Therefore, the electrode material layer 3700_2 may include the second layer 3720_2 in which a concentration of ions or electric charges is partially high, and the finally manufactured light emitting element 300_2 may include the second layer 372_2 functioning as the doped layer 390.

Similar to the light emitting element 300_2 of FIG. 20, the light emitting element 300 may further include another layer functioning as the doped layer 390.

Figure 23:
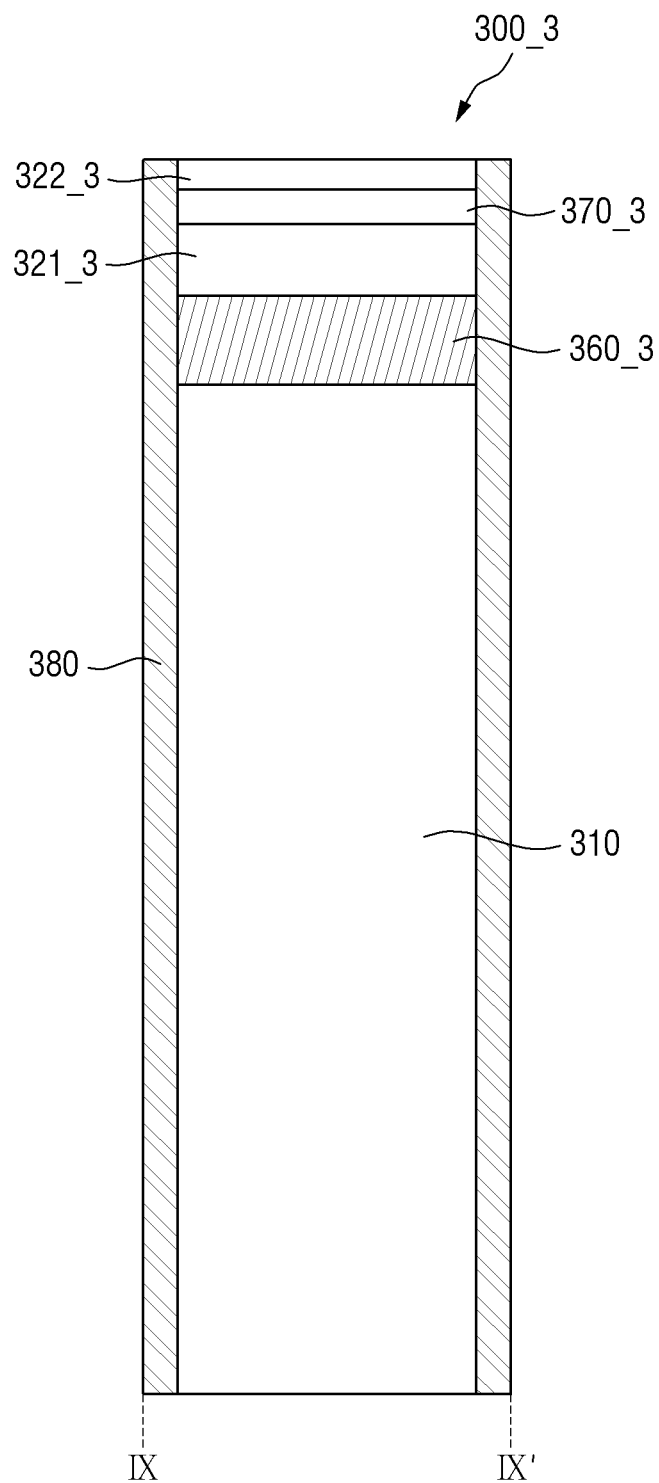
FIG. 23 is a schematic cross-sectional view of a light emitting element according to still another embodiment.
Figure 24:
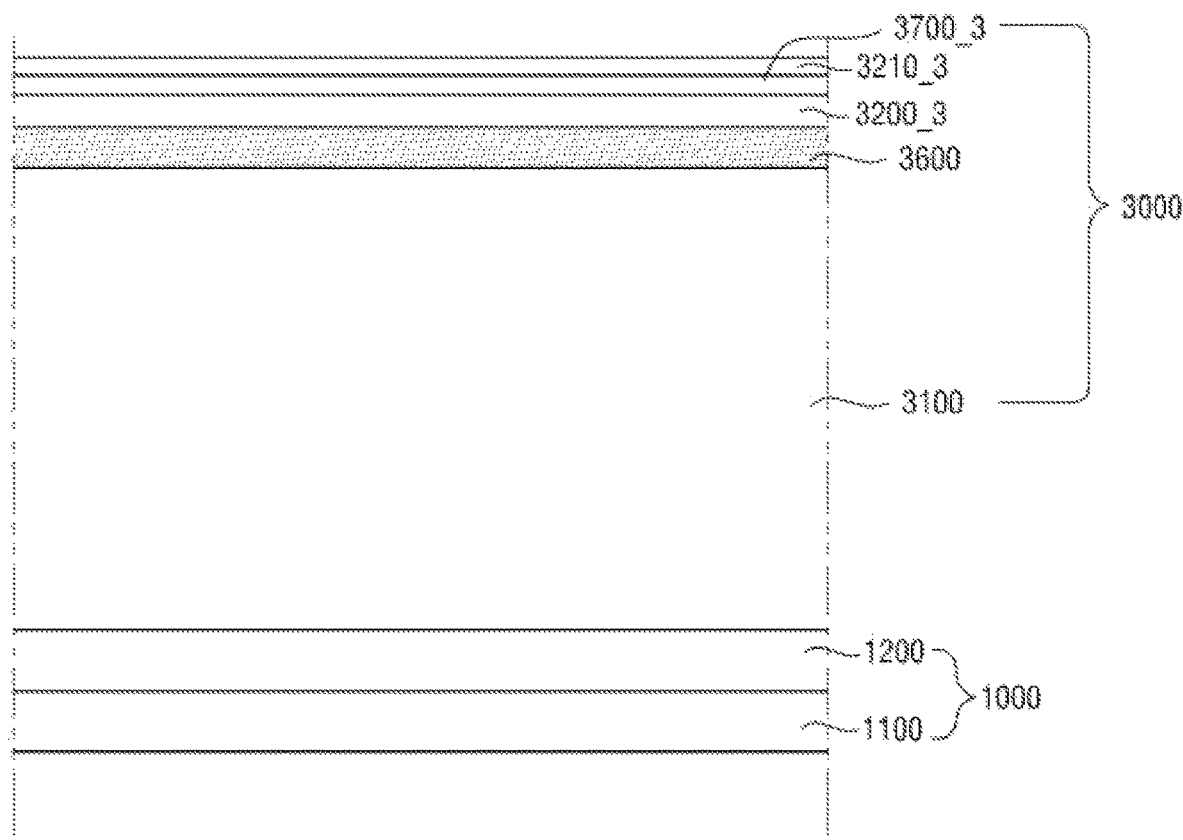
FIG. 24 is a schematic cross-sectional view illustrating some of processes of manufacturing the light emitting element of FIG. 23.

FIG. 23 is a schematic cross-sectional view of a light emitting element according to still another embodiment. FIG. 24 is a schematic cross-sectional view illustrating some of processes of manufacturing the light emitting element of FIG. 23.

Referring to FIGS. 23 and 24, a light emitting element 300_3 according to an embodiment may further include a sub-semiconductor layer 321_3, for example, a p-type semiconductor, disposed on an electrode layer 370_3 and having a second polarity. The light emitting element 300_3 may further include the sub-semiconductor layer 321_3 disposed on the electrode layer 370_3, in addition to a second semiconductor layer 320_3 disposed between the electrode layer 370_3 and an active layer 360_3. As described above, the doped layer 390 may be formed on the first surface or the second surface of the active layer 360, and may have the first polarity or the second polarity according to a position thereof. In case that the doped layer 390 is formed on a side of the active layer 360 on which the second semiconductor layer 320 is disposed, the doped layer 390 and the second semiconductor layer 320 may include same ions having the second polarity. Likewise, the light emitting element 300_3 may further include the sub-semiconductor layer 321_3 disposed on the electrode layer 370_3 and having the second polarity. The sub-semiconductor layer 321_3 and the second semiconductor layer 320_3 may include substantially a same material. The light emitting element 300_3 further includes the sub-semiconductor layer 321_3 having the second polarity with respect to the active layer 360, such that a dipole moment may increase.

As illustrated in FIG. 24, a sub-semiconductor layer 3210_3 may be formed without performing a process of irradiating the semiconductor structure 3000 with a laser. The semiconductor structure 3000 may further include an electrode material layer 3700_3. The sub-semiconductor layer 3210_3 and a second semiconductor 3200_3 may include a same material. A description therefor is the same as that described above, and a detailed description will thus be omitted.

The doped layer 390 of the light emitting element 300 may not be disposed on the upper surface of the electrode layer 370. The doped layer 390 may also be disposed on a lower surface of the electrode layer 370 or be disposed on other semiconductor layers, for example, the first semiconductor layer 310 and the second semiconductor layer 320.

FIGS. 25 to 28 are schematic cross-sectional views of light emitting elements according to still other embodiments.

Light emitting elements according to embodiments of FIGS. 25 to 28 are different from the light emitting element 300 of FIG. 7 in a position of the doped layer 390. The position of the doped layer 390 formed with respect to the active layer 360 may be variously modified, and the doped layer 390 may include ions having different polarities depending on the position thereof. Hereinafter, repetitive descriptions thereof will be omitted, and differences from those described above will be described.

Figure 25:
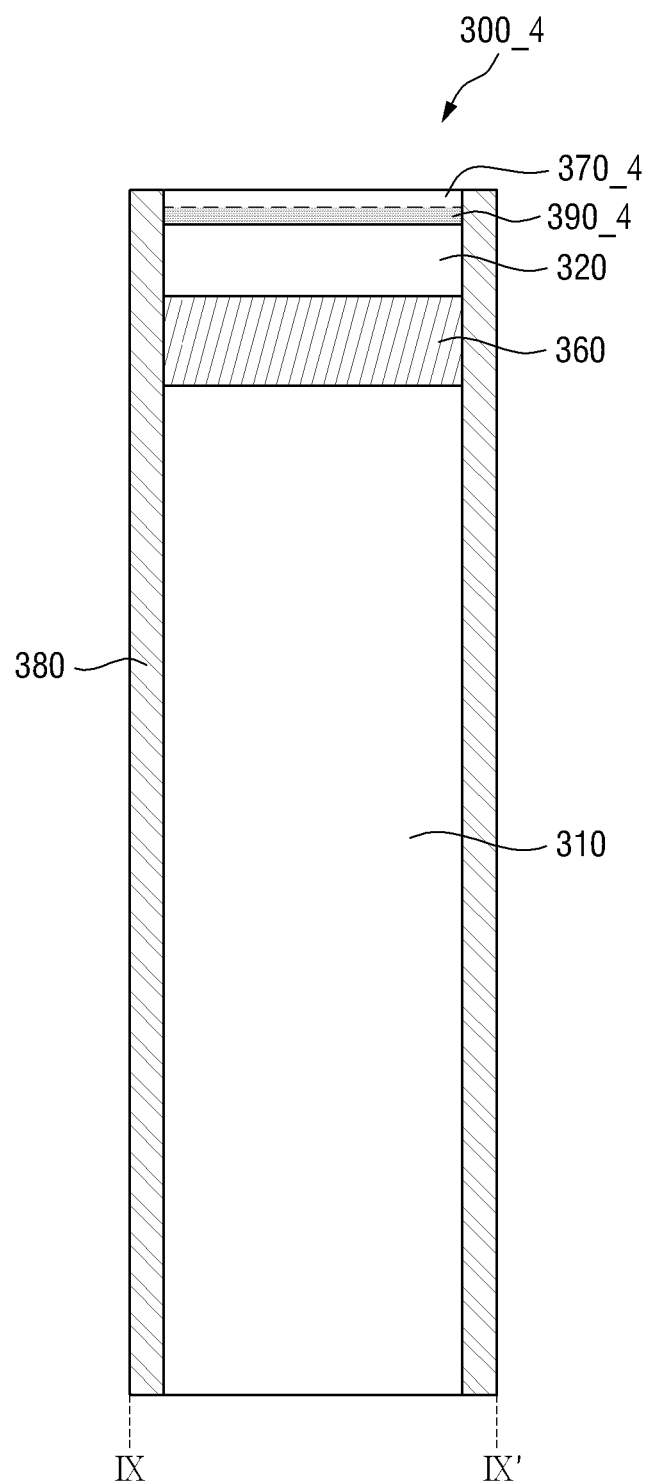
FIGS. 25 to 28 are schematic cross-sectional views of light emitting elements according to still other embodiments.

First, referring to FIG. 25, in a light emitting element 300_4 according to an embodiment, a doped layer 390_4 may be formed on a lower surface of an electrode layer 370_4 or between the electrode layer 370_4 and the second semiconductor layer 320. For example, the doped layer 390_4 may be formed on an upper surface of the second semiconductor layer 320. In case that the electrode material layer 3700 is formed after the doped region 3900 is formed in a process of forming the electrode material layer 3700 among processes of manufacturing the light emitting element 300_4, the doped layer 390_4 of the light emitting element 300_4 may be formed under the electrode layer 370_4. The light emitting element 300_4 of FIG. 25 is different from the light emitting element 300 of FIG. 7 in a position of the doped layer 390_4.

Figure 26:
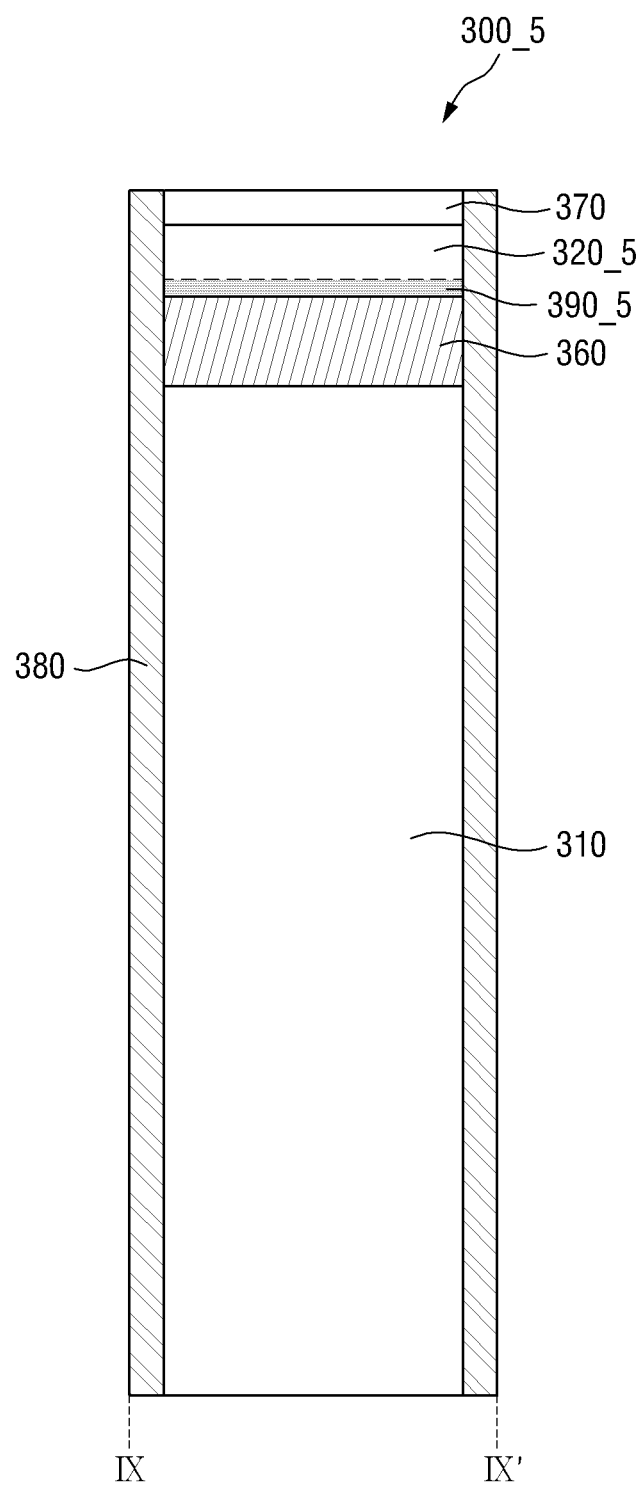

Referring to FIG. 26, in a light emitting element 300_5 according to an embodiment, a doped layer 390_5 may be disposed on a second semiconductor layer 320_5. Accordingly, in the light emitting element 300_5, the doped layer 390_5 may directly contact the second surface of the active layer 360 facing the second semiconductor layer 320_5. FIG. 26 illustrates that the doped layer 390_5 is disposed on a lower surface of the second semiconductor layer 320_5 or between the second semiconductor layer 320_5 and the active layer 360. However, the disclosure is not limited thereto, and the doped layer 390_5 according to the embodiment may also be disposed on an upper surface of the second semiconductor layer 320_5 or between the second semiconductor layer 320_5 and the electrode layer 370.

Figure 27:
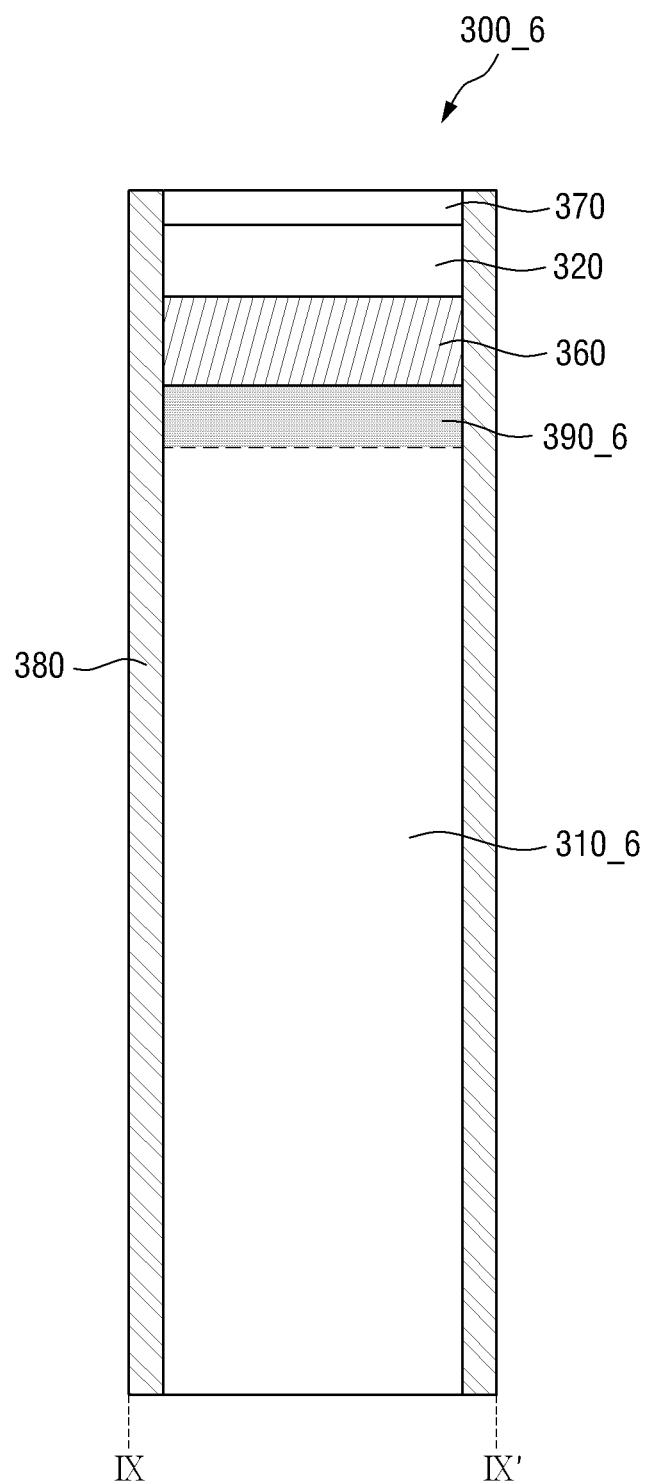

Referring to FIG. 27, in a light emitting element 300_6 according to an embodiment, a doped layer 390_6 may be disposed on a first semiconductor layer 310_6. Accordingly, in the light emitting element 300_6, the doped layer 3906 may directly contact the first surface of the active layer 360 facing the first semiconductor layer 310_6. FIG. 27 illustrates that the doped layer 390_6 is disposed on an upper surface of the first semiconductor layer 310_6 or between the first semiconductor layer 310_6 and the active layer 360. However, the disclosure is not limited thereto. The doped layer 390_6 formed on the first semiconductor layer 310_6 and the first semiconductor layer 310_6 may include substantially a same material and may include same ions having the first polarity.

Figure 28:
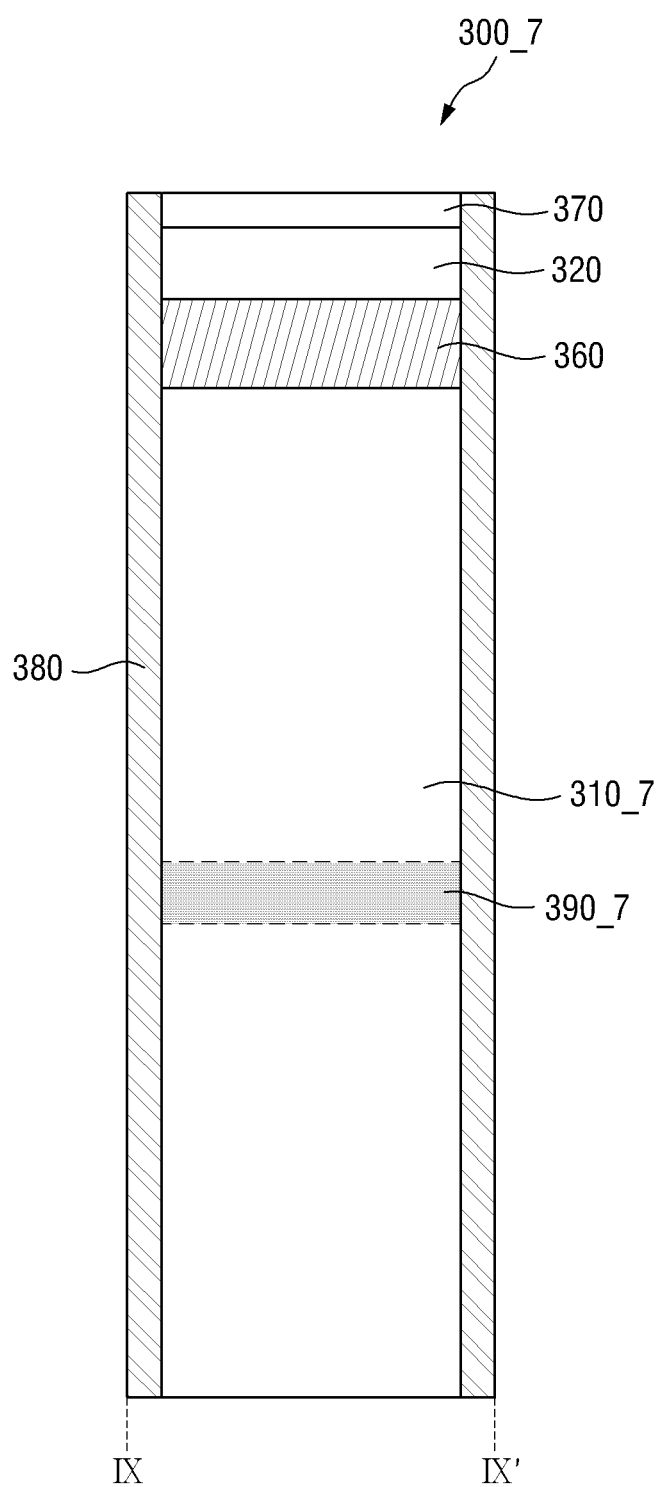

Referring to FIG. 28, in a light emitting element 300_7 according to an embodiment, a doped layer 390_7 may be disposed to be spaced apart from the first surface of the active layer 360 contacting a first semiconductor layer 310_7. For example, the doped layer 390_7 may be disposed at an intermediate position of the first semiconductor layer 310_7.

The light emitting elements 300 of FIGS. 25 to 28 are the same as the light emitting elements 300 of FIG. 7 except for the position of the doped layer 390. In the light emitting elements 300 of FIGS. 25 to 28, a process of forming the doped layer 390 is not performed as a process of irradiating the semiconductor structure with the laser as illustrated in FIG. 13, and may also be performed by adjusting concentrations of materials deposited in processes of forming the respective semiconductor layers as illustrated in FIGS. 21 and 22. A description thereof is the same as that described above, and repetitive descriptions thereof will thus be omitted.

A structure of the light emitting element 300 is not limited to that illustrated in FIG. 6, and may be other structures.

Figure 29:
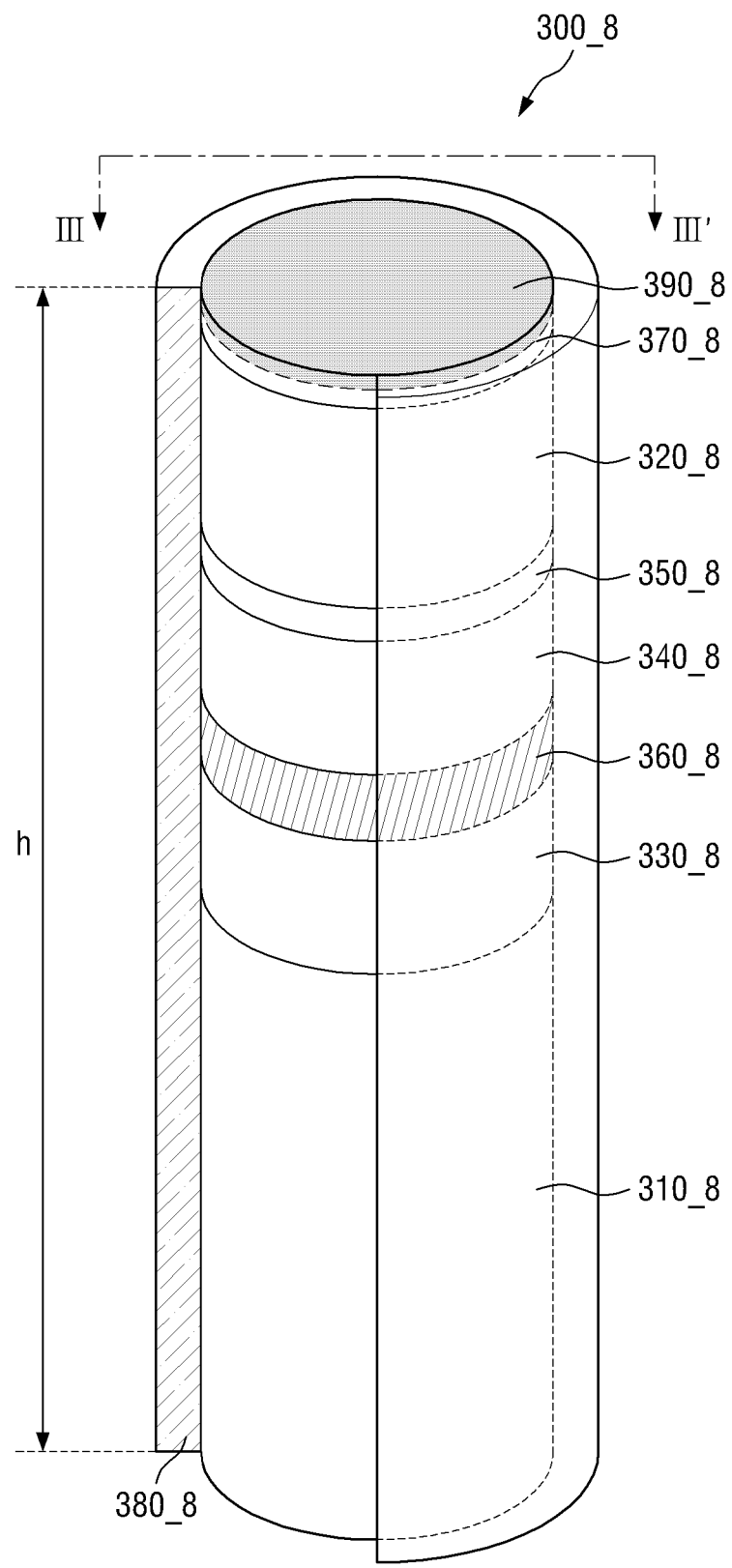
FIG. 29 is a schematic perspective view of a light emitting element according to still another embodiment.
Figure 30:
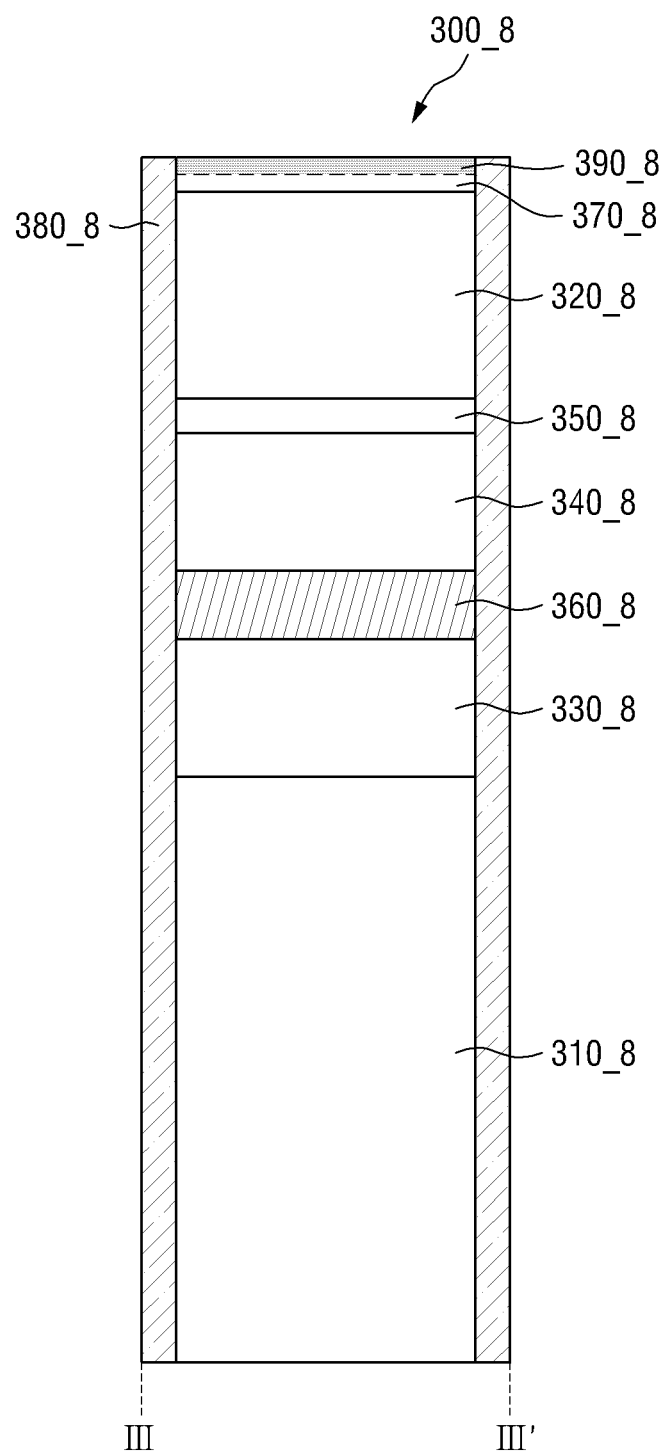
FIG. 30 is a schematic cross-sectional view taken along line III-III' of FIG. 29.

FIG. 29 is a schematic perspective view of a light emitting element according to still another embodiment. FIG. 30 is a schematic cross-sectional view taken along line III-III' of FIG. 29.

Referring to FIGS. 29 and 30, a light emitting element 300_8 according to an embodiment may include a third semiconductor layer 330_8 disposed between a first semiconductor layer 310_8 and an active layer 360_8, and a fourth semiconductor layer 340_8 and a fifth semiconductor layer 350_8 disposed between the active layer 360_8 and a second semiconductor layer 320_8. The light emitting element 300_8 of FIGS. 29 and 30 is different from the light emitting element 300 according to an embodiment of FIG. 6 in that semiconductor layers 330_8, 340_8, and 350_8 are further disposed and the active layer 360_8 contains other elements. A description of an electrode layer 370_8, an insulating film 380_8, and a doped layer 390_8 are substantially the same as that of FIG. 6. Hereinafter, repetitive descriptions thereof will be omitted, and differences from those described above will be described.

As described above, in the light emitting element 300 of FIG. 6, the active layer 360 may include nitrogen (N) to emit the blue or green light. On the other hand, in the light emitting element 300_8 of FIGS. 29 and 30, the active layer 360_8 and other semiconductor layers may be semiconductors including at least phosphorus (P). For example, the light emitting element 300_8 according to an embodiment may emit red light having a central wavelength band in a range of about 620 nm to about 750 nm. However, it should be understood that the central wavelength band of the red light is not limited to the above-described range and includes all wavelength ranges that may be recognized as red in the technical field.

The first semiconductor layer 310_8 may be an n-type semiconductor layer, and in case that the light emitting element 300_8 emits red light, the first semiconductor layer 310_8 may include a semiconductor material having a chemical formula of $In_xAl_yGa_{1-x-y}P$ ($0 \le x \le 1$, $0 \le y \le 1$, and $0 \le x+y \le 1$). For example, the first semiconductor layer 310_8 may be made of one or more of InAlGaP, GaP, AlGaP, InGaP, AlP, and InP doped with an n-type dopant. The first semiconductor layer 310_8 may be doped with an n-type dopant, which may be Si, Ge, Sn, or the like, as an example. In an embodiment, the first semiconductor layer 310_8 may be made of n-AlGaInP doped with n-type Si. A length of the first semiconductor layer 3108 may be in a range of about 1.5 μm to about 5 μm, but is not limited thereto.

The second semiconductor layer 320_8 may be a p-type semiconductor layer, and in case that the light emitting element 300_8 emits the red light, the second semiconductor layer 3208 may include a semiconductor material having a chemical formula of $In_xAl_yGa_{1-x-y}P$ ($0 \le x \le 1$, $0 \le y \le 1$, and $0 \le x+y \le 1$). For example, the second semiconductor layer 320_8 may be made of one or more of InAlGaP, GaP, AlGaNP, InGaP, AlP, and InP doped with a p-type dopant. The second semiconductor layer 320_8 may be doped with a p-type dopant, which may be Mg, Zn, Ca, Se, Ba, or the like, as an example. In an embodiment, the second semiconductor layer 320_8 may be made of p-GaP doped with a p-type dopant such as Mg. A length of the second semiconductor layer 320_8 may be in a range of about 0.08 μm to about 0.25 μm, but is not limited thereto.

The active layer 360_8 may be disposed between the first semiconductor layer 310_8 and the second semiconductor layer 320_8. Similar to the active layer 360 of FIG. 6, the active layer 360_8 of FIGS. 29 and 30 may include a material having a single or multiple quantum well structure to emit light of a specific wavelength band. As an example, in case that the active layer 360_8 emits light of a red wavelength band, the active layer 360_8 may include a material such as AlGaP or AlInGaP. In case that the active layer 360_8 has the multiple quantum well structure, for example, a structure in which quantum layers and well layers are alternately stacked, the quantum layers may include a material such as AlGaP or AlInGaP, and the well layers may include a material such as GaP or AlInP. In an embodiment, the active layer 360_8 may include AlGaInP as a material of the quantum layers and AlInP as a material of the well layers to emit red light having a central wavelength band of about 620 nm to about 750 nm.

The light emitting element 300_8 of FIGS. 29 and 30 may include clad layers disposed adjacent to the active layer 360_8. As illustrated in FIGS. 29 and 30, the third semiconductor layer 330_8 and the fourth semiconductor layer 340_8 disposed between the first semiconductor layer 310_8 and the second semiconductor layer 320_8 below and above the active layer 360_8, may be the clad layers.

The third semiconductor layer 330_8 may be disposed between the first semiconductor layer 310_8 and the active layer 360_8. Similar to the first semiconductor layer 310_8, the third semiconductor layer 330_8 may be an n-type semiconductor and may include a semiconductor material having a chemical formula of $In_xAl_yGa_{1-x-y}P$ ($0 \le x \le 1$, $0 \le y \le 1$, and $0 \le x+y \le 1$) as an example. In an embodiment, the first semiconductor layer 310_8 may be made of n-AlGaInP, and the third semiconductor layer 330_8 may be made of n-AlInP. However, the disclosure is not limited thereto.

The fourth semiconductor layer 340_8 may be disposed between the active layer 360_8 and the second semiconductor layer 320_8. Similar to the second semiconductor layer 320_8, the fourth semiconductor layer 340_8 may be an n-type semiconductor and may include a semiconductor material having a chemical formula of $In_xAl_yGa_{1-x-y}P$ ($0 \le x \le 2$, $0 \le y \le 1$, and $0 \le x+y \le 1$) as an example. In an embodiment, the second semiconductor layer 320_8 may be made of p-GaP, and the fourth semiconductor layer 340_8 may be made of p-AlInP.

The fifth semiconductor layer 350_8 may be disposed between the fourth semiconductor layer 340_8 and the second semiconductor layer 320_8. Similar to the second semiconductor layer 320_8 and the fourth semiconductor layer 340_8, the fifth semiconductor layer 350_8 may be a semiconductor doped with a p-type dopant. In some embodiments, the fifth semiconductor layer 350_8 may serve to reduce a difference in lattice constant between the fourth semiconductor layer 340_8 and the second semiconductor layer 320_8. For example, the fifth semiconductor layer 350_8 may be a tensile strain barrier reducing (TSBR) layer. As an example, the fifth semiconductor layer 350_8 may include p-GaInP, p-AlInP, p-AlGaInP, or the like, but the disclosure is not limited thereto.

FIGS. 29 and 30 illustrate that the doped layer 390_8 is formed on an upper surface of the electrode layer 370_8, but the disclosure is not limited thereto. In the light emitting element 300_8 of FIG. 29 emitting the red light, the doped layer 390_8 may be formed on semiconductor layers other than the upper surface of the electrode layer 370_8 as described above with reference to FIGS. 25 to 28. A description thereof is substantially the same as that described above, and will thus be omitted.

In some embodiments, the electrode stem parts 210S and 220S extending in the first direction DR1 may be omitted from the first electrode 210 and the second electrode 220.

Figure 31:
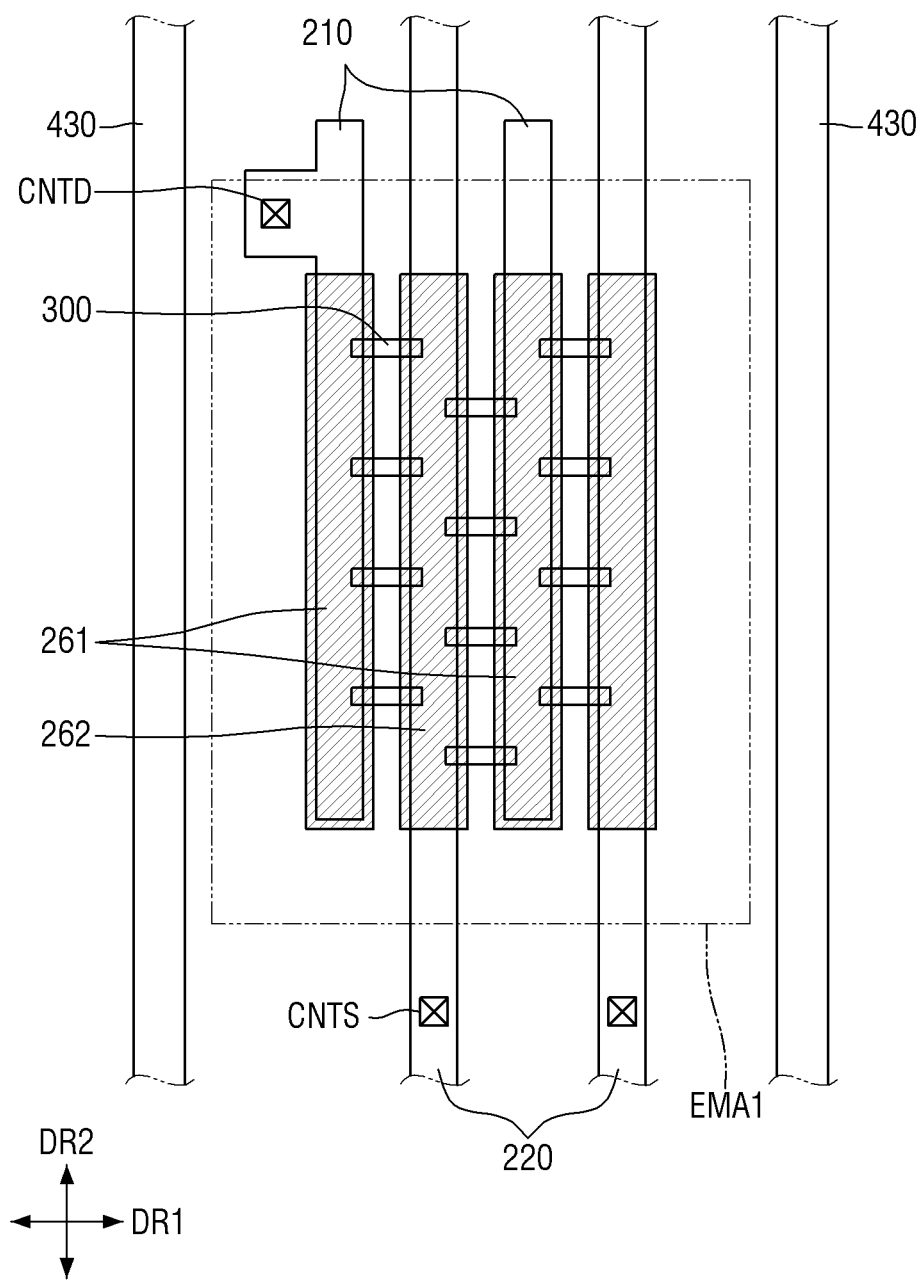
FIG. 31 is a schematic plan view illustrating one sub-pixel of a display device according to another embodiment.

FIG. 31 is a schematic plan view illustrating a sub-pixel of a display device according to another embodiment.

Referring to FIG. 31, in a display device 10_4, the first electrode 210 and the second electrode 220 may be disposed to extend in a direction, for example, in the second direction DR2. The electrode stem parts 210S and 220S extending in the first direction DR1 may be omitted from the first electrode 210 and the second electrode 220. The display device 10_4 of FIG. 31 is different from the display device 10_4 of FIG. 3 in that the electrode stem parts 210S and 220S are omitted and the display device 10_4 further includes a second electrode 220. Hereinafter, repetitive descriptions thereof will be omitted, and differences from those described above will be described.

As illustrated in FIG. 31, first electrodes 210 and second electrodes 220 may extend in the second direction DR2 within each sub-pixel PXn. The external banks 430 may also extend in the second direction DR2. For example, the second electrodes 220 and the external banks 430 may also extend to other sub-pixels PXn neighboring each other in the second direction DR2. Accordingly, each of the sub-pixels PXn neighboring each other in the second direction DR2 may receive a same electrical signal from the second electrodes 220.

Unlike the display device 10 of FIG. 3, in the display device 10_4 of FIG. 31, the second electrode contact hole CNTS may be disposed for each second electrode 220. The second electrode 220 may be electrically connected to the power electrode 162 of the circuit element layer PAL through the second electrode contact hole CNTS positioned for each sub-pixel PXn. FIG. 31 illustrates that the second electrode contact hole CNTS is formed in each of two second electrodes 220, but the disclosure is not limited thereto.

On the other hand, the first electrodes 210 may extend in the second direction DR2, but may be terminated at boundaries between the respective sub-pixels PXn. The respective sub-pixels PXn neighboring each other in the second direction DR2 may include, respectively, the first electrodes 210 spaced apart from each other, and may receive different electrical signals through the first electrode contact holes CNTD. The first electrodes 210 may be formed by being disposed to extend in the second direction DR2 and disconnected at boundaries between the neighboring sub-pixels PXn during processes of manufacturing the display device 10_4. In an embodiment of FIG. 31, light emitting elements 300 between a first electrode 210 and a second electrode 220 and light emitting elements 300 between another first electrode 210 and another second electrode 220 may form parallel connections.

In the display device 10_4 of FIG. 31, some of the electrodes 210 and 220 are not electrically connected to the circuit element layer PAL through the first and second electrode contact holes CNTD and CNTS, and may also be disposed as floating electrodes. For example, only electrodes positioned at an outer portion among the electrodes 210 and 220 may receive electrical signals through the first and second electrode contact holes CNTD and CNTS, and the electrodes 210 and 220 disposed between the electrodes positioned at the outer portion may not directly receive electrical signals. In this case, some of the second electrodes 220, for example, second electrodes 220 disposed between different first electrodes 210 may extend in the second direction DR2. However, similar to the first electrodes 210, some of the second electrodes 220 may be terminated at boundaries between the respective sub-pixels PXn, so as not to be disposed in other sub-pixels PXn. In case that some of the electrodes 210 and 220 are the floating electrodes, the light emitting elements 300 disposed between the floating electrodes may partially form serial connections, in addition to parallel connections. The external banks 430 may be disposed at boundaries between sub-pixels PXn neighboring each other in the first direction DR1 and extend in the second direction DR2. Although not illustrated in FIG. 31, the external banks 430 may also be disposed at the boundaries between the sub-pixels PXn neighboring each other in the second direction DR2 and extend in the first direction DR1. A description of the external bank 430 is the same as that described above with reference to FIG. 3. A first contact electrode 261_4 and a second contact electrode 262_4 included in the display device 10_4 of FIG. 31 are substantially the same as those of the display device 10 of FIG. 3.

FIG. 31 illustrates that two first electrodes 210_4 and two second electrodes 220_4 are disposed and are alternately spaced apart from each other. However, the disclosure is not limited thereto, and some electrodes may be omitted or a larger number of electrodes may be disposed in the display device 10_4.

In the display device 10_4, the first electrode 210_4 and the second electrode 220_4 may not necessarily have a shape in which they extend in a direction. The shapes of the first electrode 210_4 and the second electrode 220_4 of the display device 10_4 are not particularly limited as long as they are disposed to be spaced apart from each other so as to provide a space in which the light emitting elements 300 are disposed.

Figure 32:
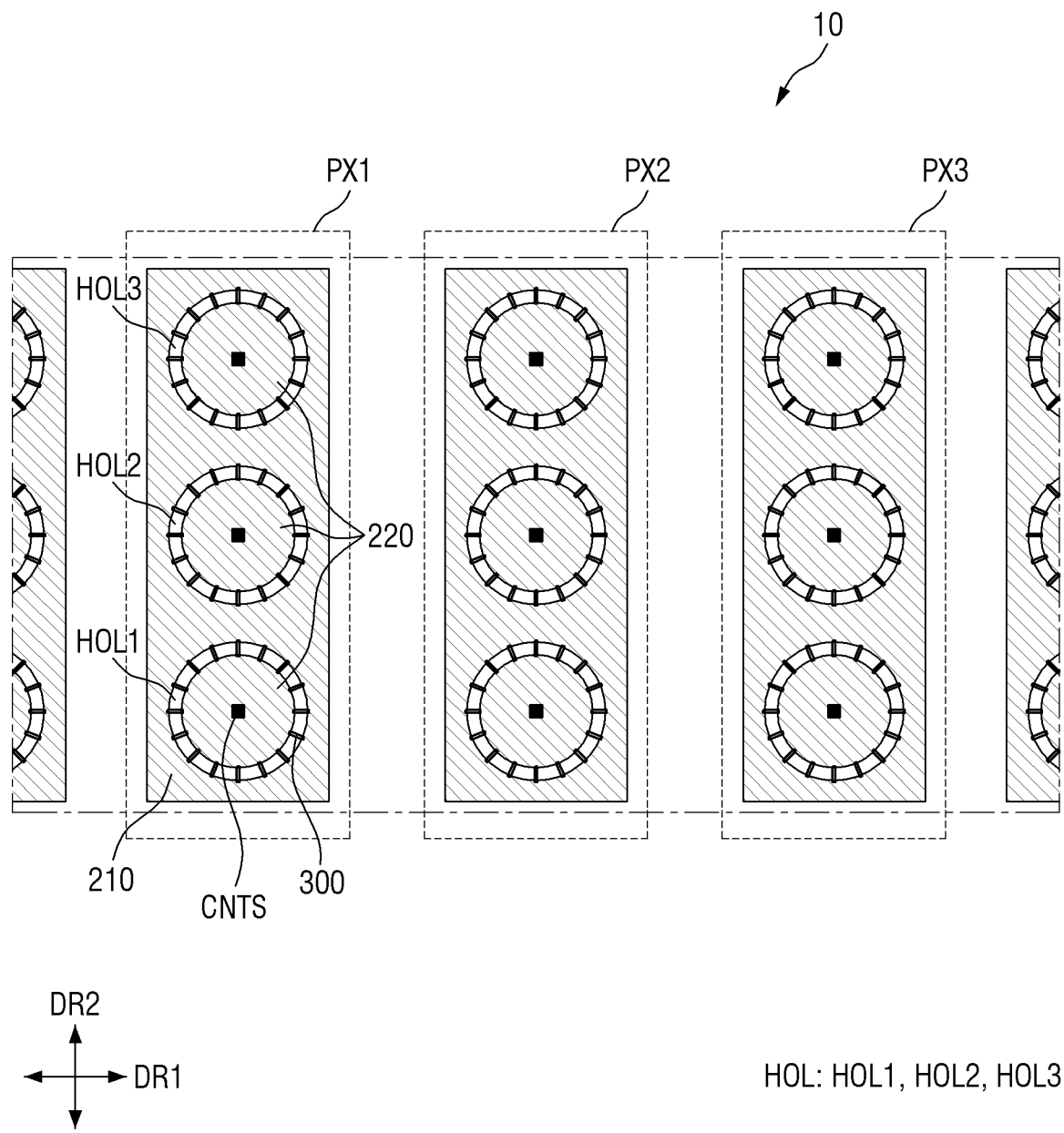
FIG. 32 is a schematic plan view illustrating one pixel of a display device according to still another embodiment.

FIG. 32 is a schematic plan view illustrating a pixel of a display device according to still another embodiment.

Referring to FIG. 32, first electrodes 210 and second electrodes 220 of a display device 10_5 according to an embodiment may have at least curved portions, and the curved portions of the first electrodes 210 may be spaced apart from and face the curved portions of the second electrodes 220. The display device 10_5 of FIG. 32 is different from the display device 10 of FIG. 2 in that the first electrode 210 and the second electrode 220 have different shapes. Hereinafter, repetitive descriptions thereof will be omitted, and differences from those described above will be described.

The first electrode 210 of the display device 10_5 may include holes HOL. For example, as illustrated in FIG. 32, the first electrode 210 may include a first hole HOL1, a second hole HOL2, and a third hole HOL3 arranged in the second direction DR2. However, the disclosure is not limited thereto, and the first electrode 210 may include a larger number of holes HOL, include a smaller number of holes HOL, or include only a hole HOL. Hereinafter, the first electrode 210 is illustrated as including a first hole HOL1, a second hole HOL2, and a third hole HOL3 by way of example.

In an embodiment, each of the first hole HOL1, the second hole HOL2, and the third hole HOL3 may have a circular shape in a plan view. Accordingly, the first electrode 210 may include a curved portion formed by each of the holes HOL, and may face the second electrode 220 in the curved portion. However, this is merely an example, and the disclosure is not limited thereto. A shape of each of the first hole HOL1, the second hole HOL2, and the third hole HOL3 is not limited as long as it may provide a space in which the second electrode 220 is disposed as will be described below, and each of the first hole HOL1, the second hole HOL2, and the third hole HOL3 may also have a shape such as an elliptical shape or a polygonal shape of a quadrangle or more in a plan view.

Second electrodes 220 may be disposed in each sub-pixel PXn. For example, three second electrodes 220 may be disposed in each sub-pixel PXn so as to correspond to the first to third holes HOL1, HOL2, and HOL3 of the first electrode 210. The second electrode 220 may be positioned in each of the first to third holes HOL1, HOL2, and HOL3, and may be surrounded by the first electrode 210.

In an embodiment, the holes HOL of the first electrode 210 may have curved outer surfaces thereof, and the second electrodes 220 disposed in the holes HOL of the first electrode 210 so as to correspond to the holes HOL may have curved outer surfaces thereof and may be spaced from and face the first electrode 210. As illustrated in FIG. 32, the first electrode 210 may include the holes HOL having a circular shape in a plan view, and the second electrode 220 may have a circular shape in a plan view. Curved surfaces of portions of the first electrode 210 in which the holes HOL are formed may be spaced apart from and face the curved outer surfaces of the second electrodes 220. As an example, the first electrode 210 may be disposed to surround the outer surfaces of the second electrodes 220.

As described above, the light emitting elements 300 may be disposed between the first electrode 210 and the second electrodes 220. The display device 10_5 according to the embodiment may include the second electrodes 220 having the circular shape and the first electrode 210 disposed to surround the second electrodes 220, and the light emitting elements 300 may be arranged along the curved outer surfaces of the second electrodes 220. As described above, the light emitting elements 300 have a shape in which they extend in a direction, and thus, the light emitting elements 300 arranged along the curved outer surfaces of the second electrodes 220 in each sub-pixel PXn may be disposed so that the directions in which they extend are different. The respective sub-pixels PXn may have various emission directions according to the directions in which the light emitting elements 300 extend. In the display device 10_5 according to the embodiment, the first electrode 210 and the second electrodes 220 are disposed to have the curved shape, such that the light emitting elements 300 disposed between the first electrode 210 and the second electrodes 220 may be disposed to be directed toward different directions, and side surface visibility of the display device 10_5 may be improved.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
a substrate;
a first electrode and a second electrode disposed on and above a top surface of the substrate, the second electrode being spaced apart from the first electrode; and
at least one light emitting element disposed between the first electrode and the second electrode and electrically connected to the first electrode and the second electrode, wherein
the light emitting element includes:
a first semiconductor layer doped with a first dopant having a first polarity;
a second semiconductor layer doped with a second dopant having a second polarity different from the first polarity;
an active layer disposed between the first semiconductor layer and the second semiconductor layer;
a doped layer disposed on a first surface or a second surface of the active layer and having a third dopant having the first polarity or the second polarity; and
an insulating film surrounding the first semiconductor layer, the second semiconductor layer, the active layer, and the doped layer,
a concentration of the third dopant in the doped layer is greater than a concentration of the third dopant in a layer on which the doped layer is directly disposed,
material composition of the layer and the doped layer are equivalent except for a difference in concentration of the third dopant, and
the insulating film directly contacts the doped layer.

2. The display device of claim 1, wherein
the light emitting element further includes an electrode layer disposed on the second semiconductor layer, and
the light emitting element includes a first light emitting element in which the doped layer is disposed on the electrode layer.

3. The display device of claim 2, wherein in the first light emitting element, the doped layer is disposed on an upper surface of the electrode layer.

4. The display device of claim 3, further comprising:
a first contact electrode contacting an end of the light emitting element and the first electrode; and
a second contact electrode contacting another end of the light emitting element and the second electrode,
wherein in the first light emitting element, the doped layer contacts the first contact electrode.

5. The display device of claim 1, wherein
the light emitting element further includes a second light emitting element, and
a thickness of at least part of the insulating film is different from that of other part of the insulating film.

6. The display device of claim 5, wherein a first diameter of a first end portion of the second light emitting element and a second diameter of a second end portion of the second light emitting element are smaller than a third diameter of a portion of the second light emitting element between the first end portion and the second end portion.

7. The display device of claim 5, further comprising:
a first insulating layer disposed under the light emitting element between the first electrode and the second electrode; and a second insulating layer disposed on the light emitting element and exposing a first end portion and a second end portion of the light emitting element.

8. The display device of claim 1, wherein the light emitting element further includes a third light emitting element in which the doped layer is removed.

* * * * *